United States Patent
Imaki et al.

(10) Patent No.: US 7,301,974 B2
(45) Date of Patent: Nov. 27, 2007

(54) WAVELENGTH MONITORING APPARATUS

(75) Inventors: Masao Imaki, Tokyo (JP); Yoshihito Hirano, Tokyo (JP); Makoto Satou, Tokyo (JP); Kenji Masuda, Tokyo (JP); Akihiro Adachi, Tokyo (JP); Shinichi Takagi, Tokyo (JP); Yasunori Nishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 251 days.

(21) Appl. No.: 10/477,018

(22) PCT Filed: May 8, 2001

(86) PCT No.: PCT/JP01/03853

§ 371 (c)(1),
(2), (4) Date: Nov. 7, 2003

(87) PCT Pub. No.: WO02/091534

PCT Pub. Date: Nov. 14, 2002

(65) Prior Publication Data

US 2004/0165623 A1    Aug. 26, 2004

(51) Int. Cl.
*H01S 3/13*    (2006.01)
(52) U.S. Cl. .................. 372/32; 372/105; 356/365
(58) Field of Classification Search ................ 356/365; 372/32, 105
See application file for complete search history.

(56) References Cited

U.S. PATENT DOCUMENTS

| | | | |
|---|---|---|---|
| 3,719,414 A * | 3/1973 | Wentz .................. 359/247 |
| 4,998,256 A | 3/1991 | Ohshima et al. | |
| 5,107,512 A * | 4/1992 | Shibutani .................. 372/32 |
| 5,841,536 A * | 11/1998 | Dimmick .................. 356/491 |
| 5,930,038 A * | 7/1999 | Swan .................. 359/484 |
| 6,137,619 A * | 10/2000 | Chen et al. .................. 359/251 |

(Continued)

FOREIGN PATENT DOCUMENTS

EP    0 415 407 A2    8/1990

(Continued)

OTHER PUBLICATIONS

Juergen Mentel, et al.: Applied Optics, (Aug. 20, 1992), vol. 31, No. 24, pp. 5022-5029.

*Primary Examiner*—Minsun Oh Harvey
*Assistant Examiner*—Tod T. Van Roy
(74) *Attorney, Agent, or Firm*—Birch, Stewart, Kolasch & Birch, LLP

(57) ABSTRACT

An optical signal emitted from a semiconductor laser is converged by a lens and then received by a single uniaxial birefringent crystal having a C axis that is inclined at an angle other than 90 degrees against a laser optical axis to output an optical signal having a polarized wave component of constant intensity corresponding to the wavelength of the optical signal regardless of temperature changes. The optical signal has an ordinary ray vibrating in a direction perpendicular to a plane including both the C axis and the laser optical axis, and an extraordinary ray vibrating in a direction perpendicular to both the ordinary ray and the laser optical axis. A first main photo detector detects the intensity of a p-polarized component of the optical signal that has passed through a polarizer and a second photo detector directly receives the optical signal converged by the lens.

12 Claims, 20 Drawing Sheets

U.S. PATENT DOCUMENTS 6,486,999 B1   11/2002   Ackerman et al.
6,567,437 B1 *  5/2003   Imaki et al. .................. 372/32

FOREIGN PATENT DOCUMENTS

| EP | 0 875 743 A1 | 11/1998 |
|---|---|---|
| JP | 4-94230 A | 3/1992 |
| JP | 8-160324 A | 6/1996 |
| JP | 9-218432 A | 8/1997 |
| JP | 9-257567 A | 10/1997 |

* cited by examiner

TeO2 DATA

| ne | no | Δn | dno/dT [×10⁻⁶/K] | dne/dT [×10⁻⁶/K] | αc [×10⁻⁶/K] | αa [×10⁻⁶/K] |
|---|---|---|---|---|---|---|
| 2.1898 | 2.3308 | 0.141 | 9.0 | 8.0 | 4.9 | 15.0 |

C AXIS

C AXIS

C AXIS

C AXIS

C AXIS

C AXIS

C AXIS

C AXIS

C AXIS

WAVELENGTH MONITORING APPARATUS

This application is the national phase under 35 U.S.C. § 371 of PCT International Application No. PCT/JP01/003853 which has an International filing date of May 8, 2001, which designated the United States of America.

FIELD OF THE INVENTION

The present invention relates to a wavelength monitoring device that is used for optical fiber communications and that discriminates and monitors the wavelength of an optical signal emitted from a semiconductor laser by using a uniaxial birefringent crystal.

BACKGROUND OF THE INVENTION

Dense wavelength division multiplexing (DWDM) optical communications have been used for optical communication systems using optical fibers. In DWDM optical communications, in order to multiplex light rays emitted from various semiconductor lasers it is necessary to stabilize the wavelengths of those light rays with a high degree of accuracy. Therefore, a wavelength monitoring device that discriminates and monitors the wavelength of a light ray emitted from each semiconductor laser is used. A prior art wavelength monitoring device utilizes the dependence of the intensities of polarized components (an ordinary ray and an extraordinary ray) of light passing through a uniaxial birefringent crystal upon the wavelength of the light. Two uniaxial birefringent crystals that exhibit opposite temperature characteristics against temperature changes are arranged in series in order to provide a temperature compensation function for the wavelength monitoring device.

A brief explanation will be made as to a uniaxial birefringent crystal that is used as a wavelength discriminating filter in the prior art wavelength monitoring device.

A birefringent crystal has optical anisotropy. Particularly, in the case of a uniaxial birefringent crystal, light passing through this crystal is separated into a polarized component (i.e., an ordinary ray) that vibrates in a direction of $n_o$ perpendicular to a plane that consists of an optical axis of the crystal (referred to as C axis from here on) and a laser optical axis of an incident optical signal that is the direction in which the optical signal is traveling and that is determined dependently upon an optical system, and a polarized component (i.e., an extraordinary ray) that vibrates in a direction of $n_e$ perpendicular to both the direction of $n_o$ and the laser optical axis. The uniaxial birefringent crystal has different refractive indices for the ordinary ray and the extraordinary ray.

In the prior art wavelength monitoring device, two uniaxial birefringent crystals having opposite temperature characteristics are arranged in series along the direction of the optical axis of incident light so that their crystal cut-out surfaces are perpendicular to the optical axis of the incident light. Each of the two uniaxial birefringent crystals has a C axis that is parallel to the crystal cut-out surface thereof and is inclined at 45 degrees against a y axis, which is a vertical direction, and toward an x axis, which is a horizontal axis, in an xy plane perpendicular to the optical axis of the incident light. The optical signal emitted from the semiconductor laser has a polarized component that vibrates in the direction of the x axis, and passes through the two uniaxial birefringent crystals. In this case, an extraordinary ray vibrates in the direction of the C axis. Because each of the two uniaxial birefringent crystals has different refractive indices for an ordinary ray and an extraordinary ray, a phase difference occurs between the ordinary ray and the extraordinary ray and the intensities of the ordinary ray and the extraordinary ray are determined according to this phase difference. The intensity of a predetermined polarized wave, which is detected by a photodiode of the wavelength monitoring device and is included in the optical signal that originates from the ordinary ray and the extraordinary ray, changes dependently upon the wavelength of the optical signal because the phase difference changes dependently upon the wavelength of the optical signal. Therefore, the prior art wavelength monitoring device in which two uniaxial birefringent crystals having opposite temperature characteristics are arranged in series can monitor the wavelength of an optical signal emitted from the semiconductor laser without being affected by temperature changes of the two uniaxial birefringent crystals.

However, a problem with the prior art wavelength monitoring device constructed as mentioned above is that the two uniaxial birefringent crystals have to be accurately positioned with respect to each other and the optical axis of the incident optical signal, and it is therefore difficult to assemble the prior art wavelength monitoring device.

In the prior art wavelength monitoring device, though the adjustment of the length of each uniaxial birefringent crystal in the direction of the optical axis of the incident optical signal can implement temperature compensation, the temperature compensation cannot be carried out in a wide temperature range. Therefore, another problem is that the prior art wavelength monitoring device cannot carry out temperature compensation in a range of operating temperatures of the semiconductor laser.

A further problem is that when a wavelength range of the optical signal emitted from the semiconductor laser, the center of the wavelength range being a reference wavelength, shifts due to a change in the ambient temperature, for example, the wavelength discriminating characteristic of the wavelength monitoring device degrades and the wavelength monitoring device cannot accurately monitor the wavelength of the optical signal.

The present invention is proposed to solve the above-mentioned problems, and it is therefore an object of the present invention to provide a wavelength monitoring device that can accurately monitor the wavelength of light without being affected by temperature changes and that can be easily assembled.

It is another object of the present invention to provide a wavelength monitoring device that can accurately monitor the wavelength of light in a wide temperature range and without being affected by temperature changes.

It is a further object of the present invention to provide a wavelength monitoring device that can always monitor the wavelength of light with an excellent wavelength discrimination characteristic even if a wavelength range of an optical signal emitted from a semiconductor laser shifts.

DISCLOSURE OF THE INVENTION

In accordance with an aspect of the present invention, a wavelength monitoring device includes a semiconductor laser for emitting an optical signal that travels along a laser optical axis, a single birefringent crystal having a crystal optical axis inclined against a plane perpendicular to the laser optical axis and toward the laser optical axis, for receiving the optical signal emitted from the semiconductor laser and for outputting an optical signal having a polarized wave component of intensity corresponding to a wavelength of the received optical signal, and a detecting means for detecting and monitoring the intensity of the polarized wave component of the optical signal output from the birefringent crystal.

As a result, the wavelength discriminating filter that consists of the single birefringent crystal can have a temperature compensation function and monitor the wavelength of the optical signal.

In the wavelength monitoring device in accordance with another aspect of the present invention, the detecting means includes a polarizer for receiving the optical signal output from the birefringent crystal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and for allowing the polarized wave component having the intensity corresponding to the wavelength of the optical signal to pass therethrough, and a main photo detector for detecting the intensity of the polarized wave component that has passed through the polarizer.

As a result, the wavelength monitoring device can monitor the wavelength of the optical signal with reliability.

In the wavelength monitoring device in accordance with a further aspect of the present invention, a temperature compensating condition on which the birefringent crystal outputs the ordinary ray and the extraordinary ray which have a phase difference corresponding to the wavelength of the optical signal regardless of temperature changes of the birefringence crystal is determined by a difference between a refractive index of the birefringence crystal for the extraordinary ray and a refractive index of the birefringence crystal for the ordinary ray, a change in the refractive index difference that occurs with a temperature change of the birefringent crystal, and a linear thermal expansion coefficient of the birefringent crystal in a direction of the laser optical axis for the optical signal, and the refractive index difference, the change in the refractive index difference, and the linear thermal expansion coefficient change dependently upon an angle between the crystal optical axis and the laser optical axis.

As a result, the wavelength monitoring device can surely have a temperature compensation function by using the wavelength discriminating filter that consists of the single birefringent crystal.

In the wavelength monitoring device in accordance with another aspect of the present invention, the temperature compensating condition of the birefringence crystal shows that a product of the refractive index difference and the linear thermal expansion coefficient is equal to the change in the refractive index difference with sign reversed.

As a result, the wavelength monitoring device can surely have a temperature compensation function by using the single birefringent crystal.

In the wavelength monitoring device in accordance with a further aspect of the present invention, the birefringence crystal is formed of tellurium dioxide, and an angle between the crystal optical axis and the laser optical axis is 21.1 degrees.

As a result, the wavelength monitoring device can surely have a wavelength discriminating filter function by using the single birefringent crystal.

In the wavelength monitoring device in accordance with another aspect of the present invention, the birefringence crystal has a length measured in a direction of the laser optical axis that changes along a specific direction in a plane, and the length of the birefringence crystal for the optical signal is adjusted by placing the birefringence crystal at a specific position along the specific direction so that the intensity of the optical signal detected by the detecting means changes with change in the wavelength of the optical signal.

As a result, a wavelength discriminating characteristic for the optical signal emitted from the semiconductor laser can be adjusted most optimally.

In the wavelength monitoring device in accordance with a further aspect of the present invention, the device further includes a lens for converging the optical signal emitted from the semiconductor laser to the birefringence crystal, and the detecting means includes a polarizer for allowing the polarized wave component having the intensity corresponding to the wavelength of the optical signal output from the birefringence crystal to pass therethrough, a main photo detector for detecting the intensity of the polarized wave component that has passed through the polarizer, and a secondary photo detector for directly receiving the optical signal converged by the lens and detecting an intensity of the optical signal.

As a result, the wavelength monitoring device can control the wavelength of the optical signal to a desired one at all times.

In the wavelength monitoring device in accordance with another aspect of the present invention, the detecting means includes a Brewster plate for receiving the optical signal output from the birefringent crystal at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and a main photo detector for detecting and monitoring an intensity of the p-polarized component of the optical signal that has passed through the Brewster plate.

As a result, the wavelength monitoring device can decrease in cost.

In the wavelength monitoring device in accordance with a further aspect of the present invention, the detecting means includes a main photo detector for receiving the optical signal output from the birefringent crystal at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis.

As a result, the wavelength monitoring device can decrease in size and cost.

In the wavelength monitoring device in accordance with another aspect of the present invention, the polarizer is integral with the birefringence crystal.

As a result, the mechanical strengths of the birefringent crystal and the polarizer can be improved. Furthermore, the arrangement of the birefringent crystal and the polarizer is facilitated, and the assembly of the wavelength monitoring device is therefore facilitated.

In the wavelength monitoring device in accordance with a further aspect of the present invention, the polarizer and the birefringence crystal are arranged so that they show an inverted letter V.

As a result, the occurrence of return light to the semiconductor laser can be prevented.

In the wavelength monitoring device in accordance with another aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, and a secondary photo detector for directly receiving the optical signal output from the semiconductor laser and for detecting an intensity of the optical signal.

As a result, deterioration of the light emission characteristic of the semiconductor laser can be prevented.

In the wavelength monitoring device in accordance with a further aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, a glass plate for allowing the optical signal output from the birefringence crystal to pass therethrough to provide a phase shift identical to that provided to the optical signal by the polarizer to the optical signal, and a secondary photo detector for receiving the optical signal that has passed through the glass plate and for detecting an intensity of the optical signal.

A phase shift due to an occurrence of resonance can be prevented.

In the wavelength monitoring device in accordance with another aspect of the present invention, the detecting means includes a main photo detector for detecting and monitoring the intensity of the polarized light component of the optical signal output from the birefringence crystal, a secondary photo detector arranged above the main photo detector, for directly receiving the optical signal emitted from the semiconductor laser and for detecting an intensity of the optical signal, a base carrier on which the birefringence crystal, the main photo detector and the secondary photo detector are arranged, and a polarizer placed on the base carrier, for allowing the polarized light component of the optical signal output from the birefringence crystal to pass therethrough so that the main photo detector detects the intensity of the polarized light component of the optical signal output from the birefringence crystal, the polarizer having a height that is adjusted so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with a further aspect of the present invention, the detecting means includes a main photo detector for detecting and monitoring the intensity of the polarized light component of the optical signal output from the birefringence crystal, a secondary photo detector arranged above the main photo detector, for directly receiving the optical signal emitted from the semiconductor laser and for detecting an intensity of the optical signal, a base carrier on which the birefringence crystal, the main photo detector and the secondary photo detector are arranged, and a polarizer placed on the base carrier, for allowing the polarized light component of the optical signal output from the birefringence crystal to pass therethrough so that the main photo detector detects the intensity of the polarized light component of the optical signal output from the birefringence crystal, the polarizer being arranged adjacent to the main photo detector so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with another aspect of the present invention, the detecting means includes a polarizer for allowing the polarized wave component of the optical signal output from the birefringence crystal to pass therethrough, a main photo detector for detecting the intensity of the polarized wave component of the optical signal that has passed through the polarizer, a base carrier on which the polarizer and the main photo detector are arranged, and a secondary photo detector for directly receiving the optical signal emitted from the semiconductor laser and for detecting an intensity of the optical signal, the secondary photo detector being arranged above the polarizer so as not to receive a component of the optical signal emitted from the semiconductor laser, which is reflected from the base carrier after passing through the polarizer.

As a result, the wavelength monitoring device can monitor the intensity of the optical signal with precision.

In accordance with another aspect of the present invention, a wavelength monitoring device includes a semiconductor laser for emitting an optical signal that travels along a laser optical axis, a birefringence crystalline unit provided with a first birefringence crystal having an optical axis inclined against a plane perpendicular to the laser optical axis and toward the laser optical axis, and a second birefringence crystal arranged in series with the first birefringence crystal with respect to the laser optical axis, the second birefringence crystal having an optical axis inclined against a plane perpendicular to the laser optical axis and toward the laser optical axis, the birefringence crystalline unit receiving the optical signal emitted from the semiconductor laser, the second birefringence crystal providing a phase shift due to a temperature change thereof to the optical signal passing therethrough so that a phase shift provided to the optical signal passing through the first birefringence crystal due to a temperature change of the first birefringence crystal can be cancelled, and the birefringence crystalline unit then outputting an optical signal having a polarized wave component of intensity corresponding to a wavelength of the received optical signal, and a detecting means for detecting and monitoring an intensity of the optical signal output from the birefringent crystalline unit.

As a result, the wavelength monitoring device can monitor the wavelength of the optical signal in a wide temperature range and with a high degree of reliability.

In the wavelength monitoring device in accordance with another aspect of the present invention, the detecting means includes a polarizer for receiving the optical signal output from the birefringent crystalline unit, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and for allowing the polarized wave component having the intensity corresponding to the wavelength of the optical signal to pass therethrough, and a main photo detector for detecting the intensity of the polarized wave component that has passed through the polarizer.

As a result, the wavelength monitoring device can surely monitor the wavelength of the optical signal.

In the wavelength monitoring device in accordance with a further aspect of the present invention, the optical signal output from the birefringent crystalline unit has both an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and characterized in that a temperature compensating condition on which the birefringent crystalline unit outputs the ordinary ray and the extraordinary ray which have a phase difference corresponding to the wavelength of the optical signal output thereby regardless of temperature changes of the first and second birefringence crystals is determined by a refractive index difference between a refractive index of the first birefringence crystal for the extraordinary ray and a refractive index of the first birefringence crystal for the ordinary ray, a change in the refractive index difference of the first birefringence crystal due to a temperature change of the first birefringence crystal, a linear thermal expansion coefficient of the first birefringence crystal in a direction of the laser optical axis, a quadratic differential value of the change in the refractive index difference of the first birefringence crystal with respect to temperature, a length of the first birefringence crystal with respect to the laser optical axis, a refractive index difference between a refractive index of the second birefringence crystal for the extraordinary ray and a refractive index of the second birefringence crystal for the ordinary ray, a change in the refractive index difference of the second birefringence crystal due to a temperature change of the second birefringence crystal, a linear thermal expansion coefficient of the second birefringence crystal with respect to the laser optical axis, a quadratic differential value of the change in the refractive index difference of the second birefringence crystal with respect to temperature, and a length of the second birefringence crystal with respect to the laser optical axis, and characterized in that the refractive index difference of the first birefringence crystal, the change in the refractive index difference of the first birefringence crystal and the quadratic differential value of the refractive index difference of the first birefringence crystal with respect to temperature change dependently upon an angle between the optical axis of the first uniaxial birefringence crystal and the laser optical axis, and the refractive index difference of the second uniaxial birefringence crystal, the change in the refractive index difference of the second uniaxial birefringence crystal and the quadratic differential value of the refractive index difference of the second uniaxial birefringence crystal with respect to temperature change dependently upon an angle between the principal axis of the second uniaxial birefringence crystal and the laser optical axis.

As a result, the wavelength monitoring device can monitor the wavelength of the optical signal in a wide temperature range and with a high degree of reliability.

In the wavelength monitoring device in accordance with another aspect of the present invention, the temperature compensating condition of the birefringence crystalline unit shows that a value obtained by multiplying a sum of a product of the refractive index difference of the first uniaxial birefringence crystal and the linear thermal expansion coefficient of the first uniaxial birefringence crystal and the change in the refractive index difference of the first uniaxial birefringence crystal by the length of the first uniaxial birefringence crystal is equal to a value obtained by multiplying a sum of a product of the refractive index difference of the second uniaxial birefringence crystal and the linear thermal expansion coefficient of the second uniaxial birefringence crystal and the change in the refractive index difference of the second uniaxial birefringence crystal by the length of the second uniaxial birefringence crystal, with sign reversed, and that a first value obtained by multiplying a sum of a product of the refractive index difference of the first uniaxial birefringence crystal, the linear thermal expansion coefficient of the first uniaxial birefringence crystal and the change in the refractive index difference of the first uniaxial birefringence crystal and the quadratic differential value of the refractive index difference of the first uniaxial birefringence crystal with respect to temperature by the length of the first uniaxial birefringence crystal is equal to a second value obtained by multiplying a sum of a product of the refractive index difference of the second uniaxial birefringence crystal, the linear thermal expansion coefficient of the second uniaxial birefringence crystal and the change in the refractive index difference of the second uniaxial birefringence crystal and the quadratic differential value of the refractive index difference of the second uniaxial birefringence crystal with respect to temperature by the length of the second uniaxial birefringence crystal, with sign reversed.

As a result, the wavelength monitoring device can monitor the wavelength of the optical signal in a wide temperature range and with a high degree of reliability.

In the wavelength monitoring device in accordance with another aspect of the present invention, the device further includes a lens for converging the optical signal emitted from the semiconductor laser to the birefringence crystalline unit, and the detecting means includes a polarizer for allowing the polarized wave component having the intensity corresponding to the wavelength of the optical signal output from the birefringence crystalline unit to pass therethrough, a main photo detector for detecting the intensity of the polarized wave component that has passed through the polarizer, and a secondary photo detector for directly receiving the optical signal converged by the lens and detecting an intensity of the optical signal.

As a result, the wavelength monitoring device can control the wavelength of the optical signal to a desired one at all times.

In the wavelength monitoring device in accordance with a further aspect of the present invention, the detecting means includes a Brewster plate for receiving the optical signal output from the birefringence crystalline unit at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and a main photo detector for detecting and monitoring the intensity of the p-polarized component of the optical signal that has passed through the Brewster plate.

As a result, the wavelength monitoring device can decrease in cost.

In the wavelength monitoring device in accordance with another aspect of the present invention, the detecting means includes a main photo detector for receiving the optical signal output from the birefringence crystalline unit at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis.

As a result, the wavelength monitoring device can decrease in size and cost.

In the wavelength monitoring device in accordance with a further aspect of the present invention, the polarizer is integral with the birefringence crystalline unit.

As a result, the mechanical strengths of the birefringent crystalline unit and the polarizer can be improved. Furthermore, the arrangement of the birefringent crystalline unit and the polarizer is facilitated, and the assembly of the wavelength monitoring device is therefore facilitated.

In the wavelength monitoring device in accordance with another aspect of the present invention, the first and second birefringence crystals of the birefringence crystalline unit are arranged so that they show an inverted letter V.

As a result, the occurrence of return light to the semiconductor laser can be prevented.

In the wavelength monitoring device in accordance with a further aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, and a secondary photo detector for directly receiving the optical signal output from the semiconductor laser and for detecting an intensity of the optical signal.

As a result, deterioration of the light emission characteristic of the semiconductor laser can be prevented.

In the wavelength monitoring device in accordance with another aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, a glass plate for allowing the optical signal output from the birefringence crystalline unit to provide a phase shift identical to that provided to the optical signal by the polarizer, and a secondary photo detector for receiving the optical signal passing through the glass plate and for detecting an intensity of the optical signal.

A phase shift due to an occurrence of resonance can be prevented.

In the wavelength monitoring device in accordance with a further aspect of the present invention, the detecting means includes a main photo detector for detecting and monitoring the intensity of the polarized light component of the optical signal output from the birefringence crystalline unit, a secondary photo detector arranged above the main photo detector, for directly receiving the optical signal emitted from the semiconductor laser and for detecting an intensity of the optical signal, a base carrier on which the birefringence crystalline unit, the main photo detector and the secondary photo detector are arranged, and a polarizer placed on the base carrier, for allowing the polarized light component of the optical signal output from the birefringence crystalline unit to pass therethrough so that the main photo detector detects the intensity of the polarized light component of the optical signal output from the birefringence crystalline unit, the polarizer having a height that is adjusted so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with another aspect of the present invention, the detecting means includes a main photo detector for detecting and monitoring the intensity of the polarized light component of the optical signal output from the birefringence crystalline unit, a secondary photo detector arranged above the main photo detector, for directly receiving the optical signal emitted from the semiconductor laser and for detecting an intensity of the optical signal, a base carrier on which the birefringence crystalline unit, the main photo detector and the secondary photo detector are arranged, and a polarizer placed on the base carrier, for allowing the polarized light component of the optical signal output from the birefringence crystalline to pass therethrough so that the main photo detector detects the intensity of the polarized light component of the optical signal output from the birefringence crystalline unit, the polarizer being arranged adjacent to the main photo detector so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with a further aspect of the present invention, the detecting means includes a polarizer for allowing the polarized wave component of the optical signal output from the birefringence crystalline unit to pass therethrough, a main photo detector for detecting the intensity of the polarized wave component of the optical signal that has passed through the polarizer, a base carrier on which the polarizer and the main photo detector are arranged, and a secondary photo detector for directly receiving the optical signal emitted from the semiconductor laser and for detecting an intensity of the optical signal, the secondary photo detector being arranged above the polarizer so as not to receive a component of the optical signal emitted from the semiconductor laser, which is reflected from the base carrier after passing through the polarizer.

As a result, the wavelength monitoring device can monitor the intensity of the optical signal with precision.

In accordance with another aspect of the present invention, a wavelength monitoring device includes a semiconductor laser for emitting an optical signal that travels along a laser optical axis, a birefringence crystal having a cut-out surface parallel to a plane perpendicular to the laser optical axis, and an optical axis oriented in a direction determined by inclining a directional vector inclined against a first axis in the plane toward a direction of the laser optical axis by a crystal cut-out angle, the birefringence crystal being rotated about the first axis by only a certain adjustment angle so that a normal to the crystal cut-out surface is inclined against the direction of the laser optical axis and toward a direction of a second axis perpendicular to both the first axis and the laser optical axis by only the certain adjustment angle, and the birefringence crystal receiving the optical signal emitted from the semiconductor laser and outputting an optical signal having a polarized wave component of intensity corresponding to a wavelength of the received optical signal, and a detecting means for detecting and monitoring an intensity of the optical signal output from the birefringent crystal.

As a result, a wavelength discriminating characteristic for the optical signal emitted from the semiconductor laser can be adjusted.

In the wavelength monitoring device in accordance with a further aspect of the present invention, the detecting means includes a polarizer for receiving the optical signal output from the birefringent crystal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and for allowing the polarized wave component having the intensity corresponding to the wavelength of the optical signal to pass therethrough, and a main photo detector for detecting the intensity of the polarized wave component that has passed through the polarizer.

As a result, the wavelength monitoring device can surely monitor the wavelength of the optical signal.

In the wavelength monitoring device in accordance with another aspect of the present invention, the crystal cut-out angle of the birefringence crystal and an adjustment angle range in which the certain adjustment angle can be set for arrangement of the birefringence crystal are determined so that an order indicating a number of vibrations of an electric field of the optical signal in the birefringence crystal is made to change by one.

As a result, a wavelength discriminating characteristic for the optical signal emitted from the semiconductor laser can be surely adjusted.

In the wavelength monitoring device in accordance with a further aspect of the present invention, the birefringence crystal is formed of YVO4, LiNbO$_3$, CaCO$_3$, TiO$_2$ or SiO$_2$, the crystal cut-out angle is set to a value ranging from 3 to 4 degrees, and an adjustment angle range in which the certain adjustment angle can be set for arrangement of the birefringence crystal is set to a range of 10 degrees.

As a result, a wavelength discriminating characteristic for the optical signal emitted from the semiconductor laser can be adjusted most optimally.

In the wavelength monitoring device in accordance with another aspect of the present invention, the birefringence crystal has a length measured in a direction of the laser optical axis that changes along a specific direction in the plane, and the length of the birefringence crystal is adjusted by placing the birefringence crystal at a specific position along the specific direction so that the intensity of the optical signal detected by the detecting means changes with change in the wavelength of the optical signal.

As a result, a wavelength discriminating characteristic for the optical signal emitted from the semiconductor laser can be adjusted most optimally.

In the wavelength monitoring device in accordance with a further aspect of the present invention, the device further includes a lens for converging the optical signal emitted from the semiconductor laser to the birefringence crystal, and the detecting means includes a polarizer for allowing the polarized wave component having the intensity corresponding to the wavelength of the optical signal output from the birefringence crystal to pass therethrough, a main photo detector for detecting the intensity of the polarized wave component that has passed through the polarizer, and a secondary photo detector for directly receiving the optical signal converged by the lens and detecting an intensity of the optical signal.

As a result, the wavelength monitoring device can control the wavelength of the optical signal to a desired one at all times.

In the wavelength monitoring device in accordance with another aspect of the present invention, the detecting means includes a Brewster plate for receiving the optical signal output from the birefringence crystal at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and a main photo detector for detecting and monitoring an intensity of the p-polarized component of the optical signal that has passed through the Brewster plate.

As a result, the wavelength monitoring device can decrease in cost.

In the wavelength monitoring device in accordance with a further aspect of the present invention, the detecting means includes a main photo detector for receiving the optical signal output from the birefringence crystal at an incident angle equal to a Brewster's angle, and for allowing a p-polarized component of the optical signal pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis.

As a result, the wavelength monitoring device can decrease in size and cost.

In the wavelength monitoring device in accordance with another aspect of the present invention, the polarizer is integral with the birefringence crystal.

As a result, the mechanical strengths of the birefringent crystal and the polarizer can be improved. Furthermore, the arrangement of the birefringent crystal and the polarizer is facilitated, and the assembly of the wavelength monitoring device is therefore facilitated.

In the wavelength monitoring device in accordance with a further aspect of the present invention, the polarizer and the birefringence crystal are arranged so that they show an inverted letter V.

As a result, the occurrence of return light to the semiconductor laser can be prevented.

In the wavelength monitoring device in accordance with another aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, and a secondary photo detector for directly receiving the optical signal output from the semiconductor laser and for detecting an intensity of the optical signal.

As a result, deterioration of the light emission characteristic of the semiconductor laser can be prevented.

In the wavelength monitoring device in accordance with another aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, a glass plate for allowing the optical signal output from the birefringence crystal to pass therethrough to provide a phase shift identical to that provided to the optical signal by the polarizer to the optical signal, and a secondary photo detector for receiving the optical signal that has passed through the glass plate and for detecting an intensity of the optical signal.

A phase shift due to an occurrence of resonance can be prevented.

In the wavelength monitoring device in accordance with a further aspect of the present invention, the detecting means includes a main photo detector for detecting and monitoring the intensity of the polarized light component of the optical signal output from the birefringence crystal, a secondary photo detector arranged above the main photo detector, for directly receiving the optical signal emitted from the semiconductor laser and for detecting an intensity of the optical signal, a base carrier on which the birefringence crystal, the main photo detector and the secondary photo detector are arranged, and a polarizer for allowing the polarized light component of the optical signal output from the birefringence crystal to pass therethrough so that the main photo detector detects the intensity of the polarized light component of the optical signal output from the birefringence crystal, the polarizer having a height that is adjusted so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with another aspect of the present invention, the detecting means includes a main photo detector for detecting and monitoring the intensity of the polarized light component of the optical signal output from the birefringence crystal, a secondary photo detector arranged above the main photo detector, for directly receiving the optical signal emitted from the semiconductor laser and for detecting an intensity of the optical signal, a base carrier on which the birefringence crystal, the main photo detector and the secondary photo detector are arranged, and a polarizer placed on the base carrier, for allowing the polarized light component of the optical signal output from the birefringence crystal to pass therethrough so that the main photo detector detects the intensity of the polarized light component of the optical signal output from the birefringence crystal, the polarizer being arranged adjacent to the main photo detector so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with a further aspect of the present invention, the detecting means includes a polarizer for allowing the polarized wave component of the optical signal output from the birefringence crystal to pass therethrough, a main photo detector for detecting the intensity of the polarized wave component of the optical signal that has passed through the polarizer, a base carrier on which the polarizer and the main photo detector are arranged, and a secondary photo detector for directly receiving the optical signal emitted from the semiconductor laser and for detecting an intensity of the optical signal, the second photo detector being arranged above the polarizer so as not to receive a component of the optical signal emitted from the semiconductor laser, which is reflected from the base carrier after passing through the polarizer.

As a result, the wavelength monitoring device can monitor the intensity of the optical signal with precision.

In accordance with another aspect of the present invention, a wavelength monitoring device includes a semiconductor laser for emitting an optical signal that travels along a laser optical axis thereof, a birefringence crystalline unit provided with a first birefringence crystal and a second birefringence crystal arranged in series with the first birefringence crystal with respect to the laser optical axis, the first birefringence crystal having a cut-out surface parallel to a plane perpendicular to the laser optical axis, and an optical axis oriented in a direction determined by inclining a directional vector inclined against a first axis in the plane toward a direction of the laser optical axis by a first crystal cut-out angle, the first birefringence crystal being rotated about the first axis by only a first adjustment angle so that a normal to the crystal cut-out surface is inclined against the direction of the laser optical axis and toward a direction of a second axis perpendicular to both the first axis and the laser optical axis by only the first adjustment angle, the second birefringence crystal having a cut-out surface parallel to a plane perpendicular to the laser optical axis, and an optical axis oriented in a direction determined by inclining a directional vector inclined against the first axis in the plane toward a direction of the laser optical axis by a second crystal cut-out angle, the second birefringence crystal being rotated about the first axis by only a second adjustment angle so that a normal to the crystal cut-out surface is inclined against the direction of the laser optical axis and toward the direction of the second axis by only the second adjustment angle, the birefringence crystalline unit receiving the optical signal emitted from the semiconductor laser, the second birefringence crystal providing a phase shift due to a temperature change thereof to the optical signal passing therethrough so that a phase shift provided to the optical signal passing through the first birefringence crystal due to a temperature change of the first birefringence crystal can be cancelled, and the birefringence crystalline unit then outputting an optical signal having a polarized wave component of intensity corresponding to a wavelength of the received optical signal, and a detecting means for detecting and monitoring an intensity of the optical signal output from the birefringent crystalline unit.

As a result, the wavelength monitoring device can monitor the wavelength of the optical signal in a wide temperature range and with a high degree of reliability.

In the wavelength monitoring device in accordance with a further aspect of the present invention, the detecting means includes a polarizer for receiving the optical signal output from the birefringent crystalline unit, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and for allowing the polarized wave component having the intensity corresponding to the wavelength of the optical signal to pass therethrough, and a main photo detector for detecting the intensity of the polarized wave component that has passed through the polarizer.

As a result, the wavelength monitoring device can surely monitor the wavelength of the optical signal.

In the wavelength monitoring device in accordance with another aspect of the present invention, the first crystal cut-out angle of the first birefringence crystal of the birefringence crystalline unit and an adjustment angle range in which the first adjustment angle can be set for arrangement of the first birefringence crystal, and the second crystal cut-out angle of the second birefringence crystal of the birefringence crystalline unit and an adjustment angle range in which the second adjustment angle can be set for arrangement of the second birefringence crystal are determined so that an order indicating a number of vibrations of an electric field of the optical signal propagating in the first and second birefringence crystals is made to change by one.

As a result, a wavelength discriminating characteristic for the optical signal emitted from the semiconductor laser can be adjusted most optimally.

In the wavelength monitoring device in accordance with a further aspect of the present invention, the optical signal output from the birefringent crystalline unit has both an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and a temperature compensating condition on which the birefringent crystalline unit outputs the ordinary ray and the extraordinary ray which have a phase difference corresponding to the wavelength of the optical signal output thereby regardless of temperature changes of the first and second birefringence crystals is determined by a refractive index difference between a refractive index of the first birefringence crystal for the extraordinary ray and a refractive index of the first birefringence crystal for the ordinary ray, a change in the refractive index difference of the first birefringence crystal due to a temperature change of the first birefringence crystal, a linear thermal expansion coefficient of the first birefringence crystal in a direction of the laser optical axis, a quadratic differential value of the change in the refractive index difference of the first birefringence crystal with respect to temperature, a length of the first birefringence crystal with respect to the laser optical axis, a refractive index difference between a refractive index of the second birefringence crystal for the extraordinary ray and a refractive index of the second birefringence crystal for the ordinary ray, a change in the refractive index difference of the second birefringence crystal due to a temperature change of the second birefringence crystal, a linear thermal expansion coefficient of the second birefringence crystal with respect to the direction of the laser optical axis, a quadratic differential value of the change in the refractive index difference of the second birefringence crystal with respect to temperature, a length of the second birefringence crystal with respect to the laser optical axis, and characterized in that the refractive index difference of the first birefringence crystal, the change in the refractive index difference of the first birefringence crystal and the quadratic differential value of the refractive index difference of the first birefringence crystal change dependently upon an angle between the optical axis of the first uniaxial birefringence crystal and the laser optical axis, and the refractive index difference of the second uniaxial birefringence crystal, the change in the refractive index difference of the second uniaxial birefringence crystal and the quadratic differential value of the refractive index difference of the second uniaxial birefringence crystal change dependently upon an angle between the optical axis of the second uniaxial birefringence crystal and the laser optical axis.

As a result, the wavelength monitoring device can monitor the wavelength of the optical signal in a wide temperature range and with a high degree of reliability.

In the wavelength monitoring device in accordance with another aspect of the present invention, the temperature compensating condition of the birefringence crystalline unit shows that a value obtained by multiplying a sum of a product of the refractive index difference of the first uniaxial birefringence crystal and the linear thermal expansion coefficient of the first uniaxial birefringence crystal and the change in the refractive index difference of the first uniaxial birefringence crystal by the length of the first uniaxial birefringence crystal of the birefringence crystalline unit is equal to a value obtained by multiplying a sum of a product of the refractive index difference of the second uniaxial birefringence crystal and the linear thermal expansion coefficient of the second uniaxial birefringence crystal and the change in the refractive index difference of the second uniaxial birefringence crystal by the length of the second uniaxial birefringence crystal of the birefringence crystalline unit, with sign reversed.

As a result, the wavelength monitoring device can monitor the wavelength of the optical signal in a wide temperature range and with a high degree of reliability.

In the wavelength monitoring device in accordance with a further aspect of the present invention, the device further includes a lens for converging the optical signal emitted from the semiconductor laser to the birefringence crystalline unit, the detecting means includes a polarizer for allowing the polarized wave component having the intensity corresponding to the wavelength of the optical signal output from the birefringence crystalline unit to pass therethrough, a main photo detector for detecting the intensity of the polarized wave component that has passed through the polarizer, and a secondary photo detector for directly receiving the optical signal converged by the lens and detecting an intensity of the optical signal.

As a result, the wavelength monitoring device can control the wavelength of the optical signal to a desired one at all times.

In the wavelength monitoring device in accordance with another aspect of the present invention, the detecting means includes a Brewster plate for receiving the optical signal output from the birefringence crystalline unit at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and a main photo detector for detecting and monitoring the intensity of the p-polarized component of the optical signal that has passed through the Brewster plate.

As a result, the wavelength monitoring device can decrease in cost.

In the wavelength monitoring device in accordance with a further aspect of the present invention, the detecting means includes a main photo detector for receiving the optical signal output from the birefringence crystalline unit at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis.

As a result, the wavelength monitoring device can decrease in size and cost.

In the wavelength monitoring device in accordance with another aspect of the present invention, the polarizer is integral with the birefringence crystalline unit.

As a result, the mechanical strengths of the birefringent crystalline unit and the polarizer can be improved. Furthermore, the arrangement of the birefringent crystalline unit and the polarizer is facilitated, and the assembly of the wavelength monitoring device is therefore facilitated.

In the wavelength monitoring device in accordance with a further aspect of the present invention, the polarizer and the birefringence crystalline unit are arranged so that they show an inverted letter V.

As a result, the occurrence of return light to the semiconductor laser can be prevented.

In the wavelength monitoring device in accordance with another aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, and a secondary photo detector for directly receiving the optical signal output from the semiconductor laser and for detecting an intensity of the optical signal.

As a result, deterioration of the light emission characteristic of the semiconductor laser can be prevented.

In the wavelength monitoring device in accordance with a further aspect of the present invention, the detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through the polarizer, a glass plate for allowing the optical signal output from the birefringence crystalline unit to pass therethrough to provide a phase shift identical to that provided to the optical signal by the polarizer to the optical signal, and a secondary photo detector for receiving the optical signal that has passed through the glass plate and for detecting an intensity of the optical signal.

A phase shift due to an occurrence of resonance can be prevented.

In the wavelength monitoring device in accordance with another aspect of the present invention, the detecting means includes a main photo detector for detecting and monitoring the intensity of the polarized light component of the optical signal output from the birefringence crystalline unit, a secondary photo detector arranged above the main photo detector, for directly receiving the optical signal emitted from the semiconductor laser and for detecting an intensity of the optical signal, abase carrier on which the birefringence crystalline unit, the main photo detector and the secondary photo detector are arranged, and a polarizer placed on the base carrier, for allowing the polarized light component of the optical signal output from the birefringence crystalline unit to pass therethrough so that the main photo detector detects the intensity of the polarized light component of the optical signal output from the birefringence crystalline unit, the polarizer having a height that is adjusted so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with a further aspect of the present invention, the detecting means includes a main photo detector for detecting and monitoring the intensity of the polarized light component of the optical signal output from the birefringence crystalline unit, a secondary photo detector arranged above the main photo detector, for directly receiving the optical signal emitted from the semiconductor laser and for detecting an intensity of the optical signal, abase carrier on which the birefringence crystalline unit, the main photo detector and the secondary photo detector are arranged, and a polarizer placed on the base carrier, for allowing the polarized light component of the optical signal output from the birefringence crystalline unit to pass therethrough so that the main photo detector detects the intensity of the polarized light component of the optical signal output from the birefringence crystalline unit, the polarizer being arranged adjacent to the main photo detector so that the secondary photo detector does not receive a component of the optical signal, which is reflected from the base carrier after passing through the polarizer.

As a result, the wavelength monitoring device can monitor the intensity of the optical signal with precision.

In the wavelength monitoring device in accordance with another aspect of the present invention, the detecting means includes a polarizer for allowing the polarized wave component of the optical signal output from the birefringence crystalline unit to pass therethrough, a main photo detector for detecting the intensity of the polarized wave component of the optical signal that has passed through the polarizer, a base carrier on which the polarizer and the main photo detector are arranged, and a secondary photo detector for directly receiving the optical signal emitted from the semiconductor laser and for detecting an intensity of the optical signal, the secondary photo detector being arranged above the polarizer so as not to receive a component of the optical signal emitted from the semiconductor laser, which is reflected from the base carrier after passing through the polarizer.

As a result, the wavelength monitoring device can monitor the intensity of the optical signal with precision.

In accordance with a further aspect of the present invention, a wavelength monitoring device includes a semiconductor laser for emitting an optical signal that travels along a laser optical axis thereof, a birefringent crystal unit having a length in a direction of the laser optical axis which changes along a specific direction that differs from the direction of the laser optical axis, the birefringent crystal unit receiving the optical signal emitted from the semiconductor laser and being arranged at a specific position in a specific direction so as to output an optical signal having a polarized wave component of intensity corresponding to a wavelength of the optical signal on a condition that the intensity of the polarized wave component changes dependently upon a change in the wavelength of the optical signal, and a detecting means for detecting and monitoring the intensity of the polarized wave component of the optical signal output from the birefringent crystal unit.

As a result, a wavelength discriminating characteristic for the optical signal emitted from the semiconductor laser can be adjusted.

In the wavelength monitoring device in accordance with another aspect of the present invention, the birefringent crystal unit is a single birefringent crystal.

As a result, the wavelength monitoring device whose wavelength discriminating characteristic for the optical signal emitted from the semiconductor laser is adjusted is easily provided.

In the wavelength monitoring device in accordance with a further aspect of the present invention, the birefringent crystal unit is a pair of birefringent crystals that exhibit opposite temperature characteristics, a ratio of lengths of the two uniaxial birefringent crystals being kept constant along a specific direction, and the two uniaxial birefringent crystals being shaped and arranged at specific positions on a condition that the ratio of the lengths of the two uniaxial birefringent crystals is determined so that a phase difference between an ordinary ray and an extraordinary ray of the optical signal output from the birefringent crystal unit is kept constant regardless of temperature changes of the pair of uniaxial birefringent crystals.

As a result, the wavelength monitoring device has an adjusted wavelength discriminating characteristic and a temperature compensation function.

PREFERRED EMBODIMENTS OF THE INVENTION

In order to explain the present invention in greater detail, the preferred embodiments will be described below with reference to the accompanying figures.

Embodiment 1

Figure 1:
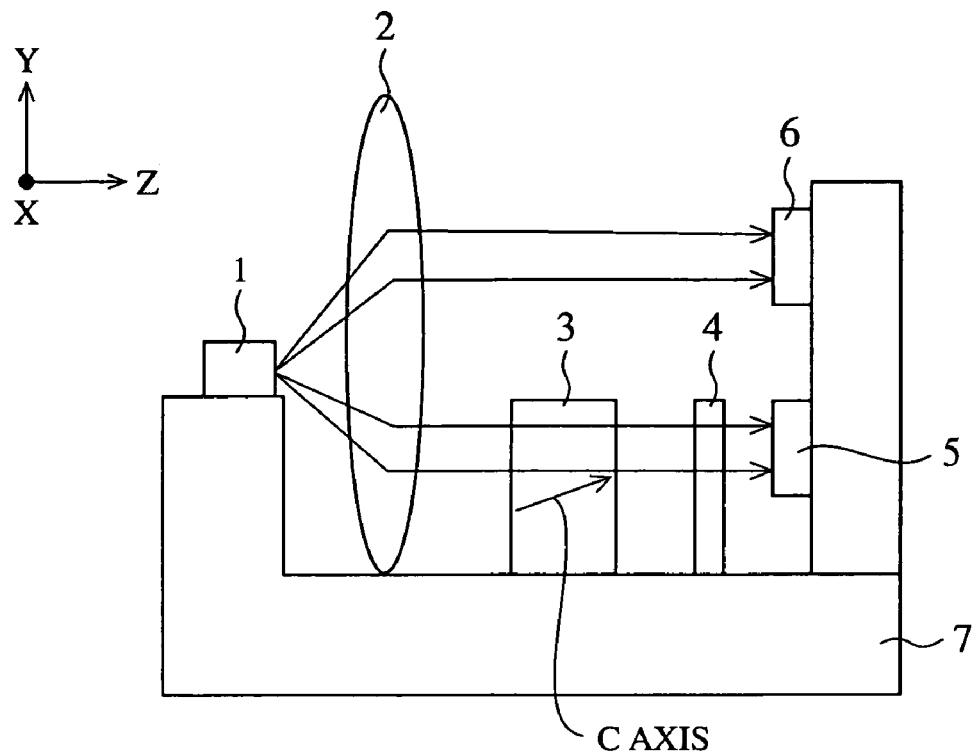
FIG. 1 is a block diagram showing a wavelength monitoring device according to embodiment 1 of the present invention.

FIG. 1 is a block diagram showing a wavelength monitoring device in accordance with embodiment 1 of the present invention.

In FIG. 1, reference numeral 1 denotes a semiconductor laser for emitting laser light (referred to as an optical signal from here on) that is polarized in a direction. For example, the semiconductor laser 1 can be a distributed feedback (DFB) laser having a grating in an active layer, a tunable laser diode that can change the wavelength of laser light emitted out thereof according to an electric current supplied thereto or temperature, or a composite-type laser (EA/LD) in which an electroabsorption element and a laser diode are disposed in series. Reference numeral 2 denotes a lens for converging and collimating the optical signal emitted from the semiconductor laser 1 so as to output the optical signal as parallel light. A line that connects the center of an emitting face of the semiconductor laser 1 and the center of the lens 2 is a laser optical axis. In this embodiment and embodiments described later, the direction (i.e., the direction of the laser optical axis) in which the optical signal is traveling on a horizontal plane is defined as the direction of a z axis in a spatial coordinate system, an upward direction in the space is defined as the direction of a y axis, and a direction perpendicular to the z axis and the y axis (a frontward direction in FIG. 1) is defined as an x axis. The optical signal emitted from the semiconductor laser 1 has a polarized component that vibrates in the direction of the x axis. Reference numeral 3 denotes a uniaxial birefringent crystal (which is formed of tellurium dioxide, for example). The uniaxial birefringent crystal 3 has a crystal cut-out surface that is parallel to the xy plane perpendicular to the laser optical axis. The uniaxial birefringent crystal 3 has a crystal optical axis (referred to as C axis from here on) that is oriented in a direction of a vector obtained by inclining a vector on the y axis toward the x axis in the xy plane by 45 degrees and further inclining the vector toward the z axis in a plane including both the vector and the z axis by a certain angle (for example, the C axis forms an angle $\phi c=21.1$ degrees with the laser optical axis). In other words, the C axis of the uniaxial birefringent crystal 3 is inclined at an angle other than 90 degrees against the laser optical axis that is the direction in which the optical signal is traveling. The uniaxial birefringent crystal 3 receives a part of the optical signal converged by the lens 2, and emits an optical signal that consists an ordinary ray and an extraordinary ray having different phases. Although the phase difference between the ordinary ray and the extraordinary ray of this optical signal changes dependently upon the wavelength of the incident light, it is kept constant regardless of temperature changes of the uniaxial birefringent crystal 3, as explained below in detail.

Reference numeral 4 denotes a polarizer that allows only a polarized component (i.e., a p-polarized component) that vibrates in the direction of the x axis, which is included in the ordinary ray and the extraordinary ray of the optical signal that has passed through the uniaxial birefringent crystal 3, to pass therethrough. This p-polarized component has an intensity that changes dependently upon the phase difference between the ordinary ray and the extraordinary ray. In other words, the intensity of the p-polarized component changes dependently on the wavelength of the incident light. As an alternative, the polarizer 4 can be the one that allows only a polarized component (i.e., an s-polarized component) that vibrates in the direction of the y axis, which is included in the ordinary ray and the extraordinary ray of the optical signal that has passed through the uniaxial birefringent crystal 3, to pass therethrough. In this case, the intensity of the s-polarized component changes dependently upon the wavelength of the incident light (i.e., the phase difference between the ordinary ray and the extraordinary ray).

Reference numeral 5 denotes a first photodiode (i.e., a main photo detector) for receiving the optical signal that has passed through the polarizer 4, and for detecting the intensity (e.g., a photo electric current value) of the optical signal and for monitoring it as an optical signal intensity S1, reference numeral 6 denotes a second photodiode (i.e., a secondary photo detector) placed above the first photodiode 5, for directly receiving the optical signal emitted from the semiconductor laser 1 that reaches the second photodiode without passing through the polarizer 4, and detecting the intensity (e.g., a photo electric current value) of the optical signal and for monitoring it as an optical signal intensity S2, and reference numeral 7 denotes a base carrier on which the semiconductor laser 1, the lens 2, the uniaxial birefringent crystal 3, the polarizer 4, the first photodiode 5, and the second photodiode 6 are arranged.

Because the phase difference between the ordinary ray and the extraordinary ray is kept constant regardless of temperature changes of the uniaxial birefringent crystal, the intensity of the p-polarized component (or the intensity of the s-polarized component) that has passed through the polarizer 4 is kept constant regardless of temperature changes of the uniaxial birefringent crystal. Therefore the optical signal intensity S1 detected by the first photodiode is kept constant regardless of temperature changes of the uniaxial birefringent crystal, and changes dependently upon the wavelength of the incident light. In other words, the uniaxial birefringent crystal 3 has a temperature compensation function.

Next, prior to an explanation of an operation of the wavelength monitoring device of embodiment 1, an explanation will be made to as to the reason why the uniaxial birefringent crystal 3 having a crystal cut-out surface parallel to the xy plane perpendicular to the laser optical axis and having a C axis that is inclined at a certain angle other than 90 degrees against the laser optical axis meets a temperature compensation condition, with reference to accompanying figures.

Figure 2:
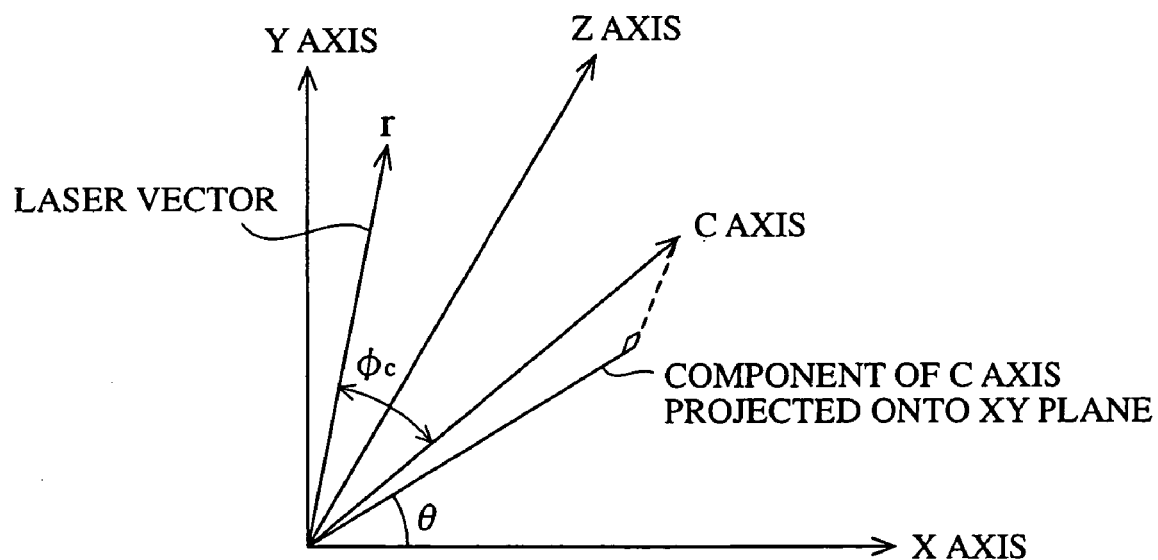
FIG. 2 is a diagram for explaining the direction of a C axis of a uniaxial birefringent crystal that is inclined at a certain angle other than 90 degrees against a laser optical axis and the laser optical axis in a spatial coordinate system.
Figures 3, 4:
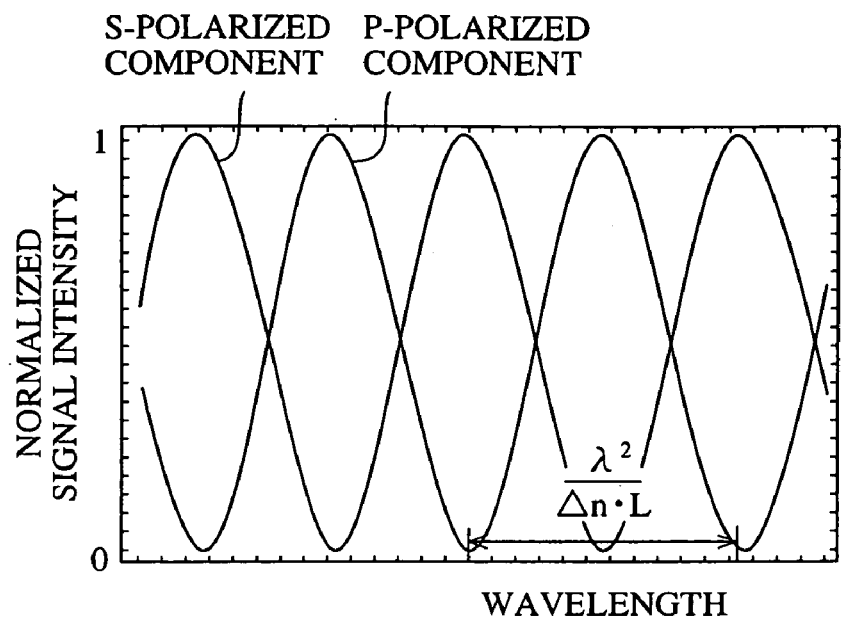
FIG. 3 is a diagram for explaining a wavelength characteristic of a normalized signal intensity.
FIG. 4 is a diagram for explaining various characteristics of a crystal formed of $TeO_2$.

FIG. 2 is a diagram for explaining the direction of the C axis of the uniaxial birefringent crystal that is inclined at a certain angle other than 90 degrees against the laser optical axis and the laser optical axis in the spatial coordinate system, FIG. 3 is a diagram for explaining a wavelength characteristic of a normalized signal intensity, and FIG. 4 is a diagram for explaining various characteristics of a tellurium dioxide (TeO$_2$) crystal. In FIG. 2, an angle between the laser light vector indicating the direction in which the laser light (i.e., the optical signal) is traveling and the C axis is defined as φc. When the laser light vector is shown by a character r in bold type, the vector indicating the C axis oriented in the direction of the positive y axis is shown by a character in bold type, the angle φc between the laser light vector and the C axis is given by equation (1). It should be noted that though the direction in which the laser light is traveling can be so defined as to differ from the direction of the z axis, as shown in FIG. 2, because of generalization, the direction in which the laser light is traveling can be so defined as to match the direction of the z axis, as explained in this embodiment.

$$\phi_c = \cos^{-1}\left(\frac{r \cdot c}{|r||c|}\right) \quad (1)$$

Because the refractive index $n_O$ for the ordinary ray is kept constant independently upon the direction of the laser light vector, and the refractive index for the extraordinary ray depends on the angle φc between the laser light vector and the C axis, the refractive index for the extraordinary ray can be shown by ne (φc). The refractive index ne (φc) is given by the following equation (2):

$$n_e(\phi_c) = n_e \cdot \sqrt{\frac{1+\tan^2\phi_c}{1+(n_o/n_e)^2\tan^2\phi_c}} \quad (2)$$

where ne=ne(90°) and is the refractive index of a polarized component that vibrates in a direction parallel to the C axis. The phase difference δ between the ordinary ray and the extraordinary ray that is caused based on the difference between the refractive index $n_O$ and the refractive index ne (φc) is given by the following equation (3), where the length (or the thickness) of the birefringent crystal in the laser light traveling direction is L, ne(φc)−n0=Δn, and the wavelength of the laser light is λ.

$$\delta = 2\pi \frac{L}{\lambda} \Delta n \quad (3)$$

When an angle between a straight line formed by the xy plane and a plane including both the C axis and the laser optical axis (i.e., a straight line that is included in the xy plane and is inclined at 45 degrees against the y axis and toward the x axis) and the polarization direction of the incident light (i.e., the direction of the x axis) is show by θ, the polarization of the laser light that has passed through the birefringent crystal is given by the following equation (4) with a Jones matrix:

$$J_5(\theta) = \begin{pmatrix} \cos\theta & -\sin\theta \\ \sin\theta & \cos\theta \end{pmatrix} \cdot \begin{pmatrix} \exp\left(-i\frac{\delta}{2}\right) & 0 \\ 0 & \exp\left(-i\frac{\delta}{2}\right) \end{pmatrix} \cdot \begin{pmatrix} \cos\theta & \sin\theta \\ -\sin\theta & \cos\theta \end{pmatrix} \quad (4)$$

The angle θ is 45 degrees in this embodiment. Assuming that the laser light that travels in the direction of the z axis and is incident upon the birefringent crystal is p-polarized light, the direction in which the laser light vibrates is the direction of the x axis. Therefore, a normalized electric field vector of the laser light incident upon the birefringent crystal is shown by {1,0}, and an electric field component Etx (i.e., an electric field of the p-polarized component) in the direction of the x axis of the laser light that has passed through the birefringent crystal and an electric field component Ety (i.e., an electric field of the s-polarized component) in the direction of the y axis (i.e., in the direction of ne) are given by the following equation (5) by using the equation (4):

$$\begin{pmatrix} E_{tx} \\ E_{ry} \end{pmatrix} = \begin{pmatrix} \cos\frac{\delta}{2} & -i\sin\frac{\delta}{2} \\ -i\sin\frac{\delta}{2} & \cos\frac{\delta}{2} \end{pmatrix} \cdot \begin{pmatrix} 1 \\ 0 \end{pmatrix} = \begin{pmatrix} \cos\frac{\delta}{2} \\ -i\sin\frac{\delta}{2} \end{pmatrix} \quad (5)$$

The laser light that has passed through the birefringent crystal is incident upon the polarizer 4. The p- or s-polarized component of the laser light incident upon the polarizer 4 passes through the polarizer 4, and is then incident upon the first photodiode 5.

When using the polarizer 4 that allows only the p-polarized component to pass therethrough, the normalized electric field vector of the p-polarized component received by the first photodiode 5 is {cos(δ/2),0}, and the intensity Sp of the p-polarized component is given by the following equation (6):

$$S_p = \cos^2(\delta/2) \quad (6)$$

In contrast, when using the polarizer 4 that allows only the s-polarized component to pass therethrough, the normalized electric field vector of the s-polarized component received by the first photodiode 5 is {0,−i sin(δ/2)}, and the intensity Ss of the s-polarized component is given by the following equation (7):

$$S_s = \sin^2(\delta/2) \quad (7)$$

This signal intensity varies according to a change in the phase difference δ between the ordinary ray and the extraordinary ray of the laser light that has passed through the birefringent crystal. Because the phase difference δ changes dependently upon the wavelength of the laser light, the normalized intensity of the received optical signal delivered from the first photodiode 5 depends on the wavelength of the optical signal and exhibits a wavelength characteristic as shown in FIG. 3. In FIG. 3, the signal intensity Ss of the passing-through s-polarized light component and the signal intensity Sp of the passing-through p-polarized light component are out of phase with each other. This wavelength characteristic has a certain periodicity, and the periodicity FSR is given by the following equation (8):

$$FSR = \frac{c_0}{\Delta n \cdot L} = \frac{\lambda^2}{\Delta n \cdot L} \quad (8)$$

where $c_0$ is the speed of light in a vacuum.

Next, a description will be made as to the temperature characteristic of the signal intensity. When the number of antinodes or nodes of the laser light that propagates in the birefringent crystal is m (m is a positive integer), the wavelength λ of the laser light is given by the following equation (9):

$$\lambda = \frac{\Delta n(\phi_c) \cdot L}{m} \quad (9)$$

By differentiating the equation (9) with respect to the temperature T of the crystal, equation (10) is obtained, where m obtained from the equation (9) is substituted into the equation (10). The equation (10) shows a change in a reference wavelength of the laser light when the temperature of the crystal changes $d\Delta n(\phi_c)/dT$ shows a change in the refractive index difference Δn of the birefringent crystal when the temperature of the crystal changes, and α(φc) is a linear expansion coefficient of the birefringent crystal.

$$\frac{\partial \lambda}{\partial T}(\phi_c) = \left(\frac{d\Delta n(\phi_c)}{dT} + \alpha(\phi_c) \cdot \Delta n(\phi_c)\right) \cdot \lambda / \Delta n(\phi_c) \quad (10)$$

$d\Delta n(\phi_c)/dT$ and α(φc) are given by equation (11) and equation (12), respectively. $\alpha_a$ shows a linear expansion coefficient of the birefringent crystal in a direction in a plane perpendicular to the C axis, and $\alpha_c$ shows a linear expansion coefficient of the birefringent crystal in a direction parallel to the C axis.

$$\frac{d\Delta n(\phi_c)}{dT} = \frac{d}{dT}\left(n_0 \sqrt{\frac{1+\tan^2\phi_c}{1+(n_0/n_e)^2\tan^2\phi_c}}\right) - \frac{dn_0}{dT} \quad (11)$$

$$\alpha = \alpha_a \cos^2\phi_c + \alpha_c \sin^2\phi_c \quad (12)$$

In order to prevent change in the wavelength of the laser light due to temperature changes, the first term $d\Delta n(\phi_c)/dT$ and the second term $\alpha\Delta n(\phi_c)$ in the right parentheses of the equation (10) are determined so that they have an identical absolute value with the sign reversed. Therefore, the temperature compensation condition of the birefringent crystal is given by the following equation (13):

$$\frac{d\Delta n(\phi_c)}{dT} = -\alpha(\phi_c) \cdot \Delta n(\phi_c) \quad (13)$$

Therefore, the temperature compensation condition of the uniaxial birefringent crystal 3 is satisfied when the angle φc between the laser light vector and the C axis is so determined as to meet the equation (13). Furthermore, because the refractive index difference Δn(φc) is obtained from the angle φc, the length L of the birefringent crystal is obtained by using the equation (8) when a desired periodicity FSR is specified.

The inventors of this application searched for a material of the uniaxial birefringent crystal that meets the equation (13) on condition that the material can achieve a downsizing of the wavelength monitoring device, and found that tellurium dioxide $TeO_2$ meets the equation (13). This crystal is widely used for acoustic optical switches and so on and has a reliability in the stability of its characteristics in an operating temperature range of −50° C. to 100° C. of the semiconductor laser. FIG. 4 shows various characteristics of the tellurium dioxide crystal.

Figure 5:
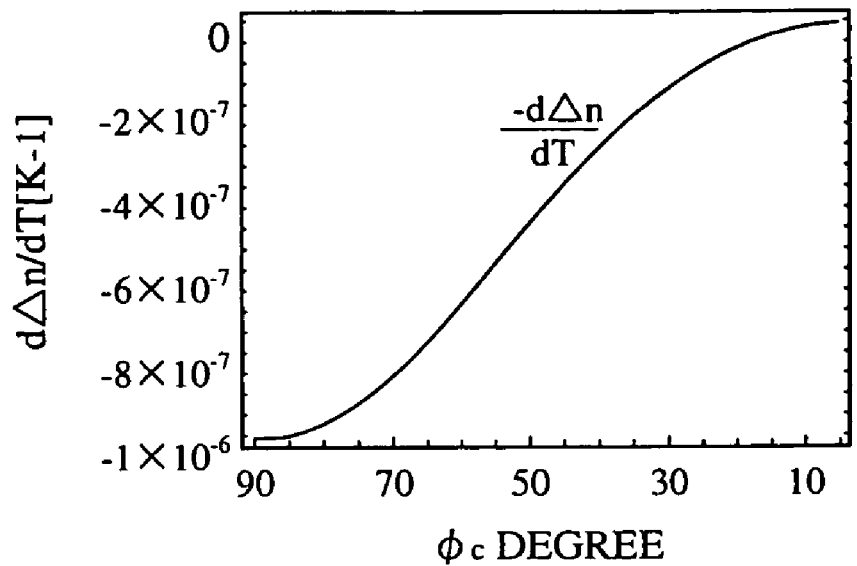
FIG. 5 is a graph diagram showing the dependence of $d\Delta n(\phi c)/dT$ upon an angle $\phi c$ in the crystal formed of tellurium dioxide.
Figure 6:
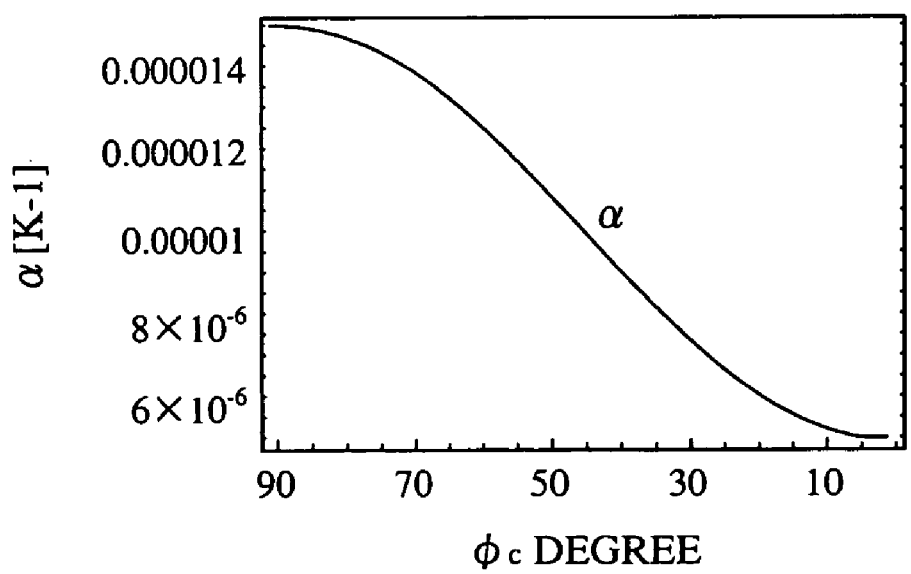
FIG. 6 is a graph diagram showing the dependence of a linear expansion coefficient $\alpha$ upon the angle $\phi c$ in the crystal formed of tellurium dioxide.
Figure 7:
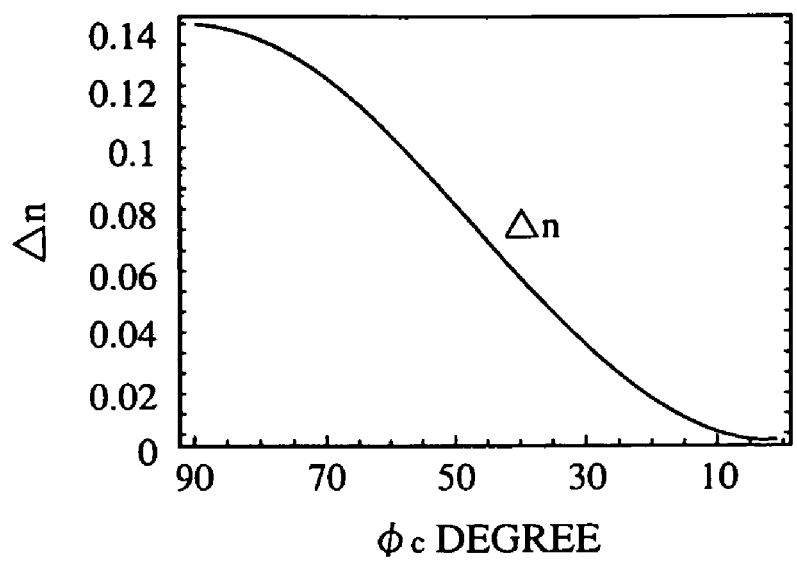
FIG. 7 is a graph diagram showing the dependence of the refractive index difference $\Delta n$ upon the angle $\phi c$ in the crystal formed of tellurium dioxide.
Figure 8:
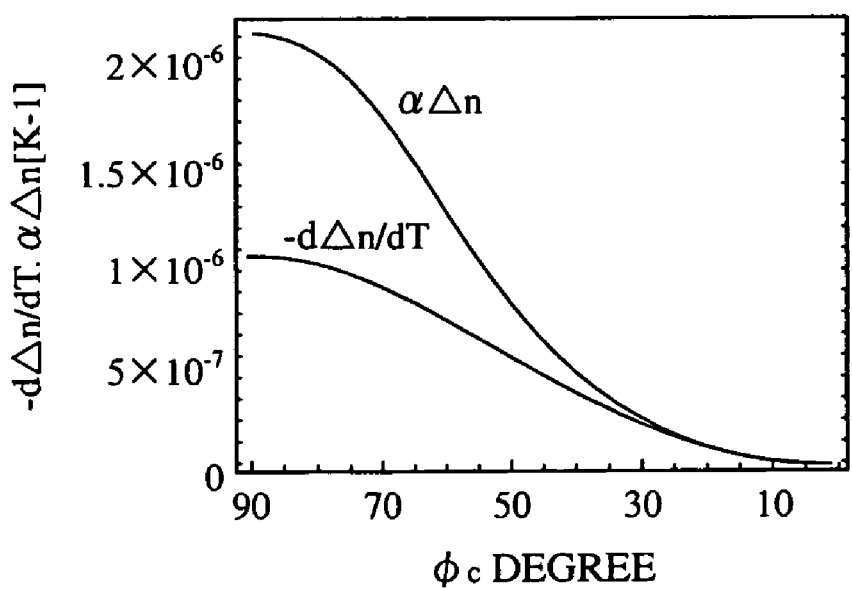
FIG. 8 is a graph diagram showing the dependence of $-d\Delta n(\phi c)/dT$ and $\alpha\Delta n$ upon the angle $\phi c$ in the crystal formed of tellurium dioxide.
Figure 9:
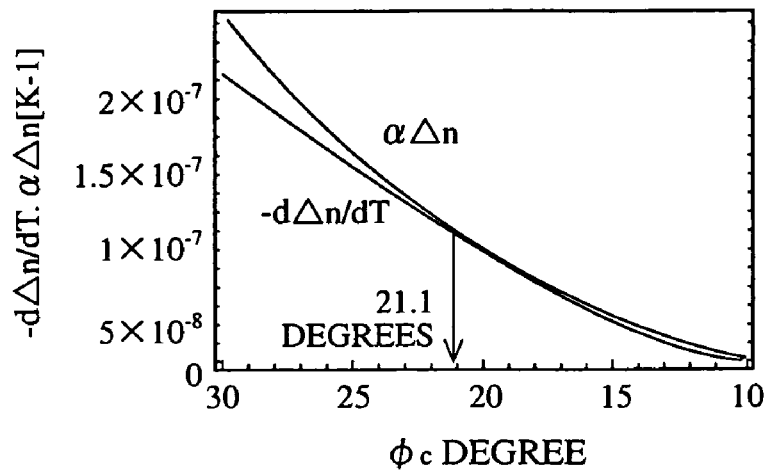
FIG. 9 is an enlarged graph of FIG. 8 in an angle $\phi c$ range of 60 degrees to 80 degrees.

FIGS. 5 to 9 show various physical properties that can change dependently upon the angle φc between the laser light vector and the C axis based on the various characteristics of the uniaxial birefringent crystal 3 as shown in FIG. 4 when the uniaxial birefringent crystal 3 is formed of tellurium dioxide $TeO_2$. FIG. 5 is a graph diagram showing the dependence of $d\Delta n(\phi c)/dT$ upon the angle φc in the crystal formed of tellurium dioxide $TeO_2$, FIG. 6 is a graph diagram showing the dependence of the linear expansion coefficient α upon the angle φc in the crystal formed of tellurium dioxide $TeO_2$, FIG. 7 is a graph diagram showing the dependence of the refractive index difference Δn upon the angle φc in the crystal formed of tellurium dioxide $TeO_2$, FIG. 8 is a graph diagram showing the dependence of $-d\Delta n(\phi c)/dT$ and $\alpha\Delta n$ upon the angle φc in the crystal formed of tellurium dioxide $TeO_2$, and FIG. 9 is an enlarged graph of FIG. 8 in an angle φc range of 60 degrees to 80 degrees.

As shown in FIG. 9, in the case where the uniaxial birefringent crystal is formed of $TeO_2$, the temperature compensation condition is satisfied when the angle φc between the laser light vector and the C axis is set to 21.1 degrees. In other words, when the laser light is made to be incident upon the uniaxial birefringent crystal formed of $TeO_2$ at the angle φc between the laser light vector and the C axis=21.1 degrees, the temperature compensation condition is satisfied. In this case, the refractive index difference Δn is 0.0167. In a generally-used wavelength monitoring device, because the periodicity FSR is 1.6 THz ($1.6 \cdot 10^{12}$ Hz) corresponding to a wavelength variation of 12.8 nm, the uniaxial birefringent crystal formed of $TeO_2$ only has to have a thickness L=11.2 mm. In a wide-band wavelength monitoring device that employs a tunable laser diode, the periodicity FSR must be 12.8 THz that is about eight times as high as the periodicity FSR of a generally-used wavelength monitoring device. In such a wide-band wavelength monitoring device, the uniaxial birefringent crystal formed of $TeO_2$ only has to have a thickness L=1.4 mm. It is sufficiently possible to implement a uniaxial birefringent crystal having a thickness L=1.4 mm.

Next, a description will be made as to an operation of the wavelength monitoring device of this embodiment 1 of the present invention.

An optical signal emitted from the semiconductor laser 1 is converged by the lens 2. An upper part of this converged optical signal is received directly by the second photodiode 6. The second photodiode 6 then detects and monitors the intensity S2 of the received part of the optical signal. An output control circuit (not shown in the figure) constantly controls the light output of the semiconductor laser 1 based on a difference between the optical signal intensity S2 and a predetermined reference optical signal intensity. Furthermore, a lower part of the optical signal converged by the lens 2 passes through the uniaxial birefringent crystal 3 formed of tellurium dioxide at the angle φc=21.1 degrees between the optical signal and the C axis. The optical signal that has passed through the uniaxial birefringent crystal 3 is separated into an ordinary ray and an extraordinary ray. At that time, though the phase difference between the ordinary ray and extraordinary ray of the optical signal changes dependently upon the wavelength of the optical signal, the phase difference is kept constant regardless of temperature changes of the uniaxial birefringent crystal. Furthermore, it can be assumed that the optical signal has a p-polarized component that corresponds to a component that vibrates in the direction of the x axis, which is included in the ordinary ray and extraordinary ray of the optical signal, and an s-polarized component that corresponds to a component that vibrates in the direction of the y axis. These p-polarized component and s-polarized component have intensities (give by the equations (6) and (7)) dependent upon the phase difference δ between the ordinary ray and extraordinary ray of the optical signal, and the phase difference δ depends on the wavelength of the optical signal. Therefore, the optical signal that has passed through the uniaxial birefringent crystal 3 has a p-polarized component and an s-polarized component having intensities that depend on the wavelength of the optical signal, and the uniaxial birefringent crystal exhibits a wavelength discriminating characteristic. Furthermore, because the uniaxial birefringent crystal 3 can keep the phase difference between the ordinary ray and extraordinary ray of the optical signal that has passed therethrough constant regardless of temperature changes thereof, the uniaxial birefringent crystal 3 has a temperature compensation function. The polarizer 4 receives the optical signal that has passed through the uniaxial birefringent crystal 3 and allows only the p-polarized component of the optical signal to pass therethrough. The passing-through optical signal that consists of only the p-polarized component is then accepted by the first photodiode 5. The first photodiode 5 detects and monitors the intensity S1 of the optical signal that consists of only the p-polarized component. The wavelength control circuit (not shown in the figure) then calculates a signal intensity ratio S1/S2 from this optical signal intensity S1 and the optical signal intensity S2 detected by the first photodiode 5, and determines whether the optical signal emitted from the semiconductor laser 1 has a shorter or longer wavelength as compared with a reference wavelength based on a predetermined reference signal intensity ratio. The wavelength control circuit then controls the semiconductor laser 1 so that the emitted optical signal has the desired reference wavelength.

As can be seen from the above description, in accordance with this embodiment 1, because the single uniaxial birefringent crystal 3 (formed of tellurium dioxide $TeO_2$, for example) is so arranged that the C axis of the crystal is inclined at an angle other than 90 degrees against the optical axis of an incident optical signal (the angle between the C axis and the optical axis is 21.1 degrees, for example), and the polarizer 4 is so constructed as to allow only the p-polarized component of the p- and s-polarized components of the optical signal that has passed through the uniaxial birefringent crystal 3 to pass therethrough, the single uniaxial birefringent crystal 3 can have a temperature compensation function (i.e., a function of keeping the phase difference between the ordinary ray and extraordinary ray of the optical signal to be constant regardless of temperature changes of the uniaxial birefringent crystal), and the wavelength monitoring device can detect and monitor the intensity S1 of the optical signal which is dependent upon only the wavelength of the optical signal. Furthermore, the wavelength monitoring device can control the wavelength of the optical signal emitted from the semiconductor laser 1 to a desired reference wavelength based on the detected optical signal intensity S1.

In addition, because the wavelength monitoring device uses only a single uniaxial birefringent crystal 3, the structure of the semiconductor laser device can be simplified. Furthermore, because the structure of the wavelength monitoring device can be simplified, the reliability of the wavelength monitoring device can be improved.

In this embodiment 1, the wavelength monitoring device uses tellurium dioxide as the uniaxial birefringent crystal, as previously mentioned. As an alternative, the uniaxial birefringent crystal can be formed of any material that meets the temperature compensation condition of the uniaxial birefringent crystal which is given by the equation (13).

Furthermore, in this embodiment 1, the wavelength monitoring device uses the polarizer 4 for allowing the p-polarized component to pass therethrough, as previously mentioned. The wavelength monitoring device can alternatively use a polarizer for allowing the s-polarized component to pass therethrough.

In addition, in this embodiment 1, the C axis of the single uniaxial birefringent crystal is oriented in a direction of a vector obtained by inclining a vector on the y axis toward the x axis in the xy plane by a first certain angle of 45 degrees and further inclining the vector toward the z axis in a plane including both the vector and the z axis by a second certain angle. The first certain angle is not limited to 45 degrees. In other words, the uniaxial birefringent crystal only has to have a C axis that is oriented in a direction of a vector obtained by inclining a vector in a direction different from the direction in which the laser light emitted from the semiconductor laser 1 vibrates toward the z axis in a plane including both the vector and the z axis by a certain angle.

Furthermore, in this embodiment 1, the wavelength monitoring device uses a uniaxial birefringent crystal, as previously mentioned. However, the birefringent crystal of this embodiment is not limited to a uniaxial one. For example, the birefringent crystal can be a biaxial one.

Figure 10:
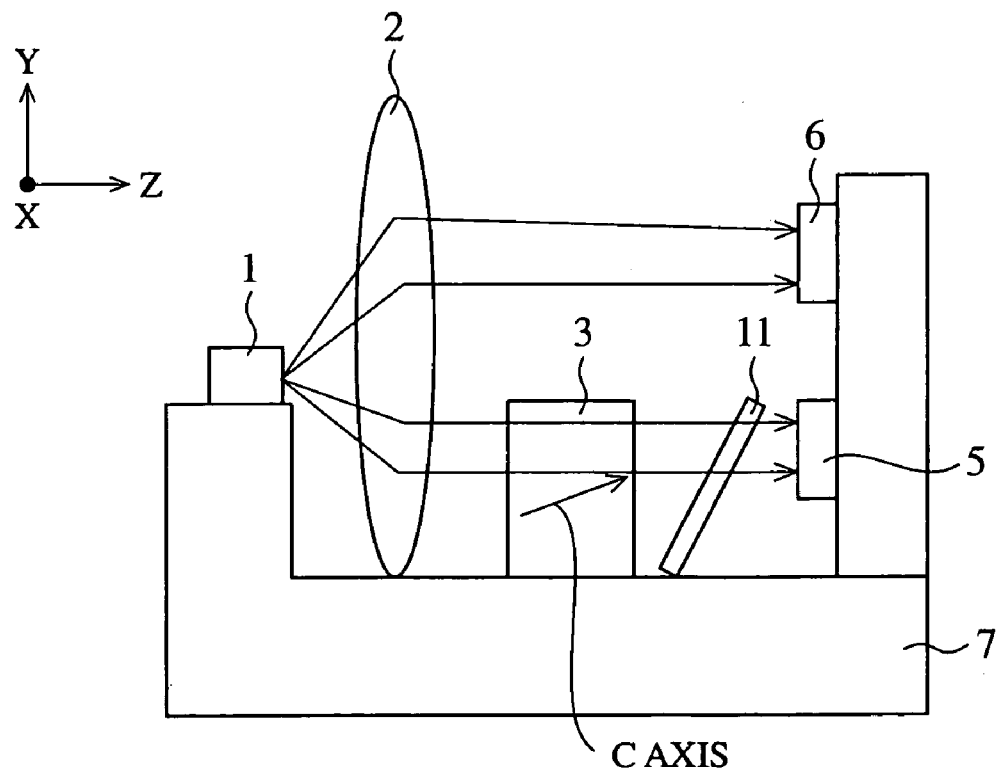
FIG. 10 is a block diagram showing a wavelength monitoring device according to a first variant of embodiment 1 of the present invention.

FIG. 10 is a block diagram showing a wavelength monitoring device in accordance with a first variant of embodiment 1 of the present invention.

In FIG. 10, instead of the polarizer 4, a Brewster plate 11 is provided and inclined at a certain angle against the optical axis of an incident optical signal so as to receive the incident optical signal at an incident angle equal to Brewster's angle in the yz plane. The Brewster plate 11 is formed of a generally-used glass plate on which coating layers are laminated. When an optical signal is incident upon the Brewster plate 11 at Brewster's angle, the Brewster plate 11 reflects only an s-polarized component of the optical signal with a constant reflectivity and makes all of a p-polarized component of the optical signal to pass therethrough (the reflectivity of the Brewster plate 11 for p-polarized components is 0). Therefore, the wavelength monitoring device can detect and monitor the intensity S1 of the optical signal that depends upon only the wavelength of the optical signal.

As can be seen from the above description, in accordance with the first variant of this embodiment 1, because the Brewster plate 11 is so arranged as to receive an incident optical signal at an incident angle equal to Brewster's angle, instead of the polarizer 4, the first variant provides an advantage of being able to reduce the cost of the wavelength monitoring device.

Furthermore, when a plurality of Brewster plates 11 are laminated, the ratio of the p-polarized component to the s-polarized component included in the optical signal passing through the plurality of Brewster plates 11 can be increased (i.e., an extinction ratio can be improved), and the optical signal intensity S2 that depends upon only the wavelength of the optical signal can be detected more accurately.

Figure 11:
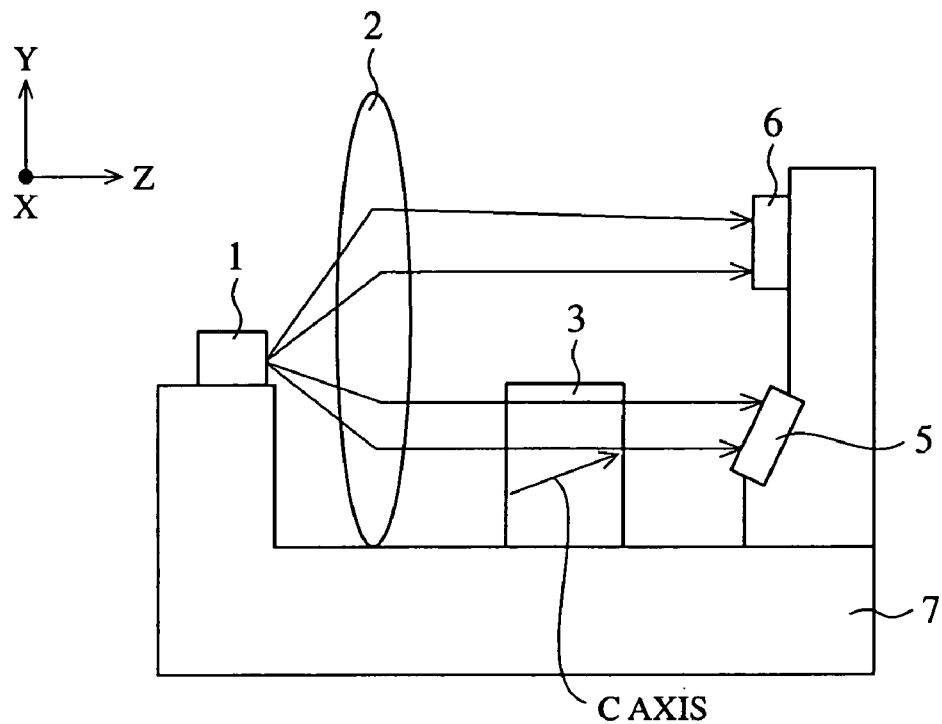
FIG. 11 is a block diagram showing a wavelength monitoring device according to a second variant of embodiment 1 of the present invention.

FIG. 11 is a block diagram showing a wavelength monitoring device according to a second variant of embodiment 1 of the present invention.

In the second variant of FIG. 11, the polarizer 4 is omitted, and the first photodiode 5 is inclined at a certain angle against the optical axis of an incident optical signal so as to receive the incident optical signal at an incident angle equal to Brewster's angle in the yz plane. The first photodiode 5 that receives an incident optical signal at an incident angle equal to Brewster's angle functions as a polarizer for the optical signal.

As can be seen from the above description, in accordance with the second variant of this embodiment 1, because the first photodiode 5 is inclined at a certain angle against the optical axis of an incident optical signal so as to receive the incident optical signal at an incident angle equal to Brewster's angle, the second variant provides an advantage of being able to reduce the cost of the wavelength monitoring device. Furthermore, because the wavelength monitoring device in accordance with the second variant of this embodiment 1 doesn't use the polarizer 4, the wavelength monitoring device can decrease in size.

Furthermore, in the second variant of this embodiment 1, the second photodiode 6 can be also inclined at a certain angle against the optical axis of an incident optical signal so as to receive the incident optical signal at an incident angle equal to Brewster's angle. In this case, the reflectivity of the second photodiode 6 for the incident optical signal emitted from the semiconductor laser 1 can be reduced.

In addition, in order to improve the polarization characteristic of the first photodiode 5, the receiving face of the first photodiode 5 can be coated.

Figure 12:
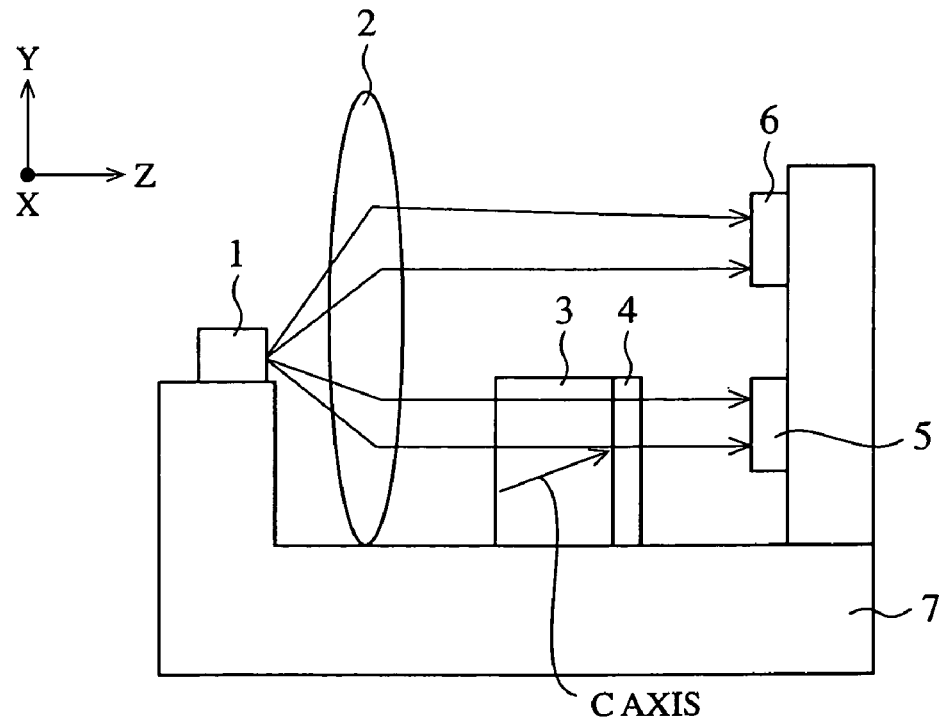
FIG. 12 is a block diagram showing a wavelength monitoring device according to a third variant of embodiment 1 of the present invention.

FIG. 12 is a block diagram showing a wavelength monitoring device in accordance with a third variant of embodiment 1 of the present invention. In FIG. 12, the uniaxial birefringent crystal 3 and the polarizer 4 are bonded to each other so that they are integral with each other. Therefore, the mechanical strengths of the uniaxial birefringent crystal 3 and the polarizer 4 can be improved. Furthermore, the arrangement of the uniaxial birefringent crystal 3 and the polarizer 4 is facilitated, and the assembly of the wavelength monitoring device is therefore facilitated.

In the third variant of this embodiment 1, the uniaxial birefringent crystal 3 and the polarizer 4 are bonded to each other with a bonding adhesive or the like. As an alternative, after contact surfaces of the uniaxial birefringent crystal 3 and the polarizer 4 are ground so that their irregularities are removed, the uniaxial birefringent crystal 3 and the polarizer 4 are secured to each other without using a bonding adhesive or the like.

Figure 13:
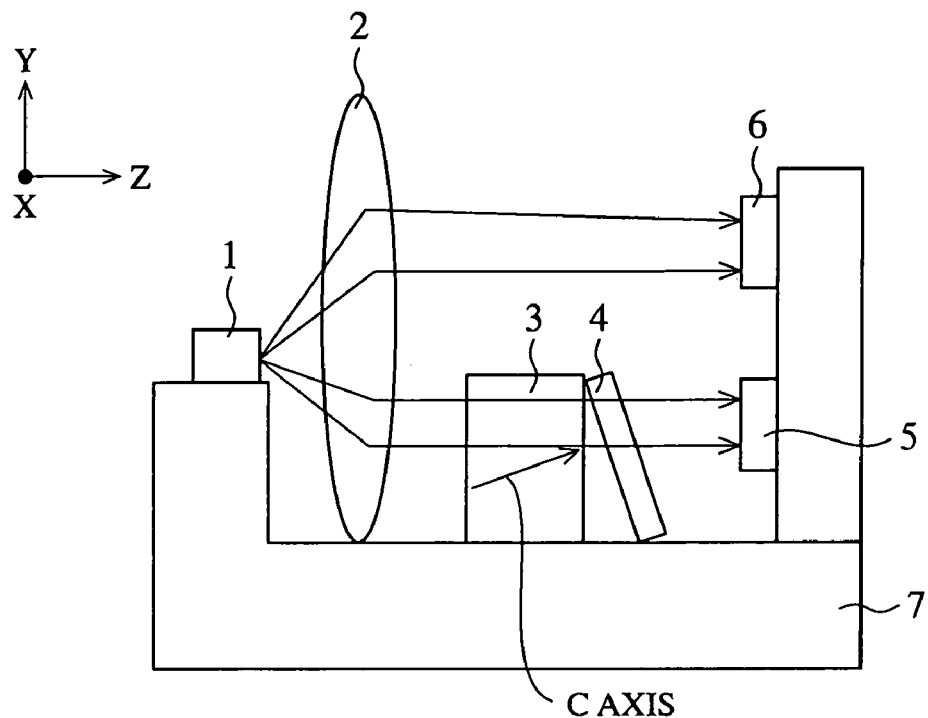
FIG. 13 is a block diagram showing a wavelength monitoring device according to a fourth variant of embodiment 1 of the present invention.

FIG. 13 is a block diagram showing a wavelength monitoring device in accordance with a fourth variant of embodiment 1 of the present invention. In FIG. 13, the uniaxial birefringent crystal 3 and the polarizer 4 are so arranged that their lateral surfaces show an inverted letter V. In this case, because the spacing between the uniaxial birefringent crystal 3 and the polarizer 4 in the direction of the y axis changes, the sympathetic vibration of the optical signal between the uniaxial birefringent crystal 3 and the polarizer 4 is reduced. Therefore, the fourth variant offers an advantage of being able to prevent light from returning to the semiconductor laser 1.

Figure 14:
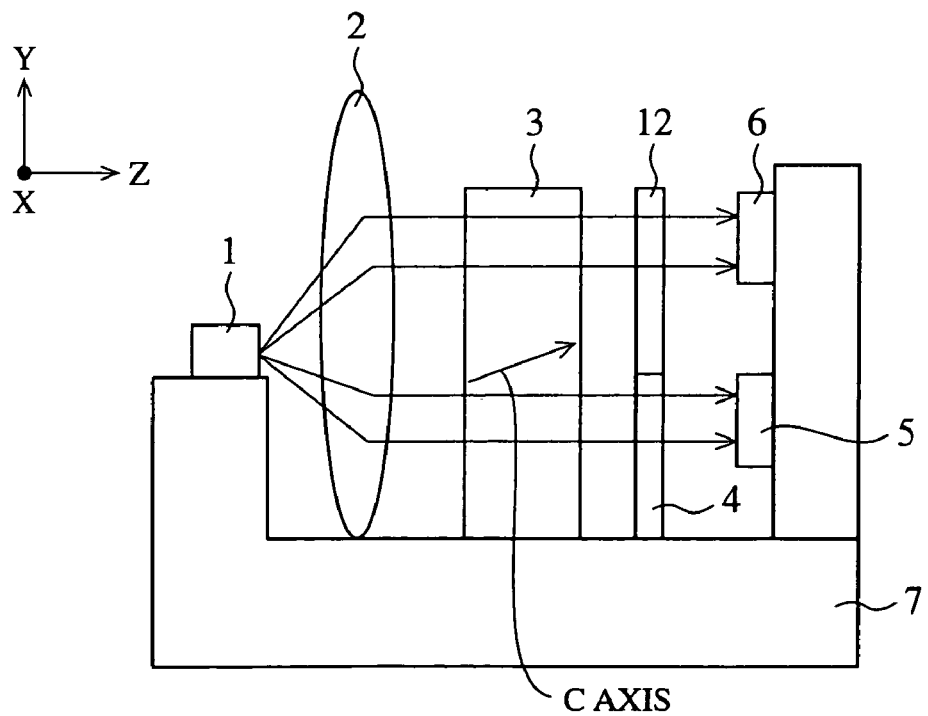
FIG. 14 is a block diagram showing a wavelength monitoring device according to a fifth variant of embodiment 1 of the present invention.

FIG. 14 is a block diagram showing a wavelength monitoring device in accordance with a fifth variant of embodiment 1 of the present invention. In FIG. 14, the uniaxial birefringent crystal 3 is so placed as to receive all of an optical signal converged by the lens 2. A part of an optical signal that has passed through the uniaxial birefringent crystal 3 passes through the polarizer 4, and is received by the first photodiode 5. Another part of the optical signal that has passed through the uniaxial birefringent crystal 3 is received by the second photodiode 6. Each of the first photodiode 5 and the second photodiode 6 reflects a part of the incident light, and the reflected light returns to the emitting face of the semiconductor laser 1, as return light, along the same optical path as the incident light. In this case, because the light emitted from the semiconductor laser 1 and the return light both pass through the uniaxial birefringent crystal 3, they have different phases. Thus the light emitted from the semiconductor laser 1 and the return light do not combine in the semiconductor laser 1, and therefore they do not resonate with each other.

As can be seen from the above description, in accordance with the fifth variant of this embodiment 1, because the uniaxial birefringent crystal 3 is so placed that an optical signal to be received by the second photodiode 6, as well as an optical signal to be received by the first photodiode 5, passes through the uniaxial birefringent crystal 3, light emitted from the semiconductor laser 1 and return light do not resonate with each other in the semiconductor laser 1 and therefore deterioration of the light emission characteristic of the semiconductor laser 1 can be prevented.

In the fifth variant of this embodiment 1, the optical signal that doesn't pass through the polarizer 4 is received by the second photodiode 6. As an alternative, a glass plate 12 can be placed above the polarizer 4, as shown in the figure, so that the optical signal that passes through the glass plate 12 and is received by the second photodiode 6 is in phase with the optical signal that is received by the first photodiode 5. This variant offers an advantage of being able to prevent a phase shift due to an occurrence of resonance.

Figure 15:
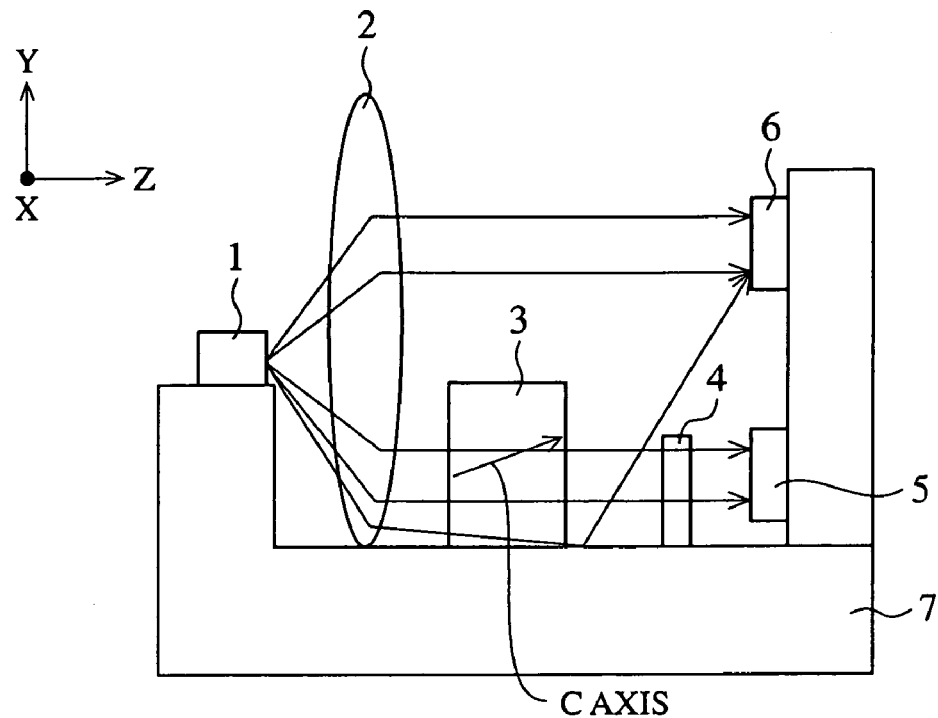
FIG. 15 is a block diagram showing a wavelength monitoring device according to a sixth variant of embodiment 1 of the present invention.

FIG. 15 is a block diagram showing a wavelength monitoring device in accordance with a sixth variant of embodiment 1 of the present invention. In FIG. 15, the polarizer 4 has a height lower than that of the uniaxial birefringent crystal 3. Therefore, even if the optical signal that has passed through the uniaxial birefringent crystal 3 is scattered from the base carrier 7, no scattered light passes through the polarizer 4 and then enters the second photodiode 6.

As can be seen from the above description, in accordance with the sixth variant of this embodiment 1, because the polarizer 4 has a height lower than that of the uniaxial birefringent crystal 3, the intensity of the optical signal received by the second photodiode 6 can be detected and monitored accurately.

In the sixth variant of this embodiment 1, the spacing between the uniaxial birefringent crystal 3 and the polarizer 4 can be expanded so that the polarizer 4 is brought closer to the first photodiode 5. In this case, the sixth variant offers an advantage of being able to further prevent a part of the optical signal that passes through the uniaxial birefringent crystal 3 and that is scattered from the base carrier 7 from passing through the polarizer 4 and then entering the second photodiode 6.

Figure 16:
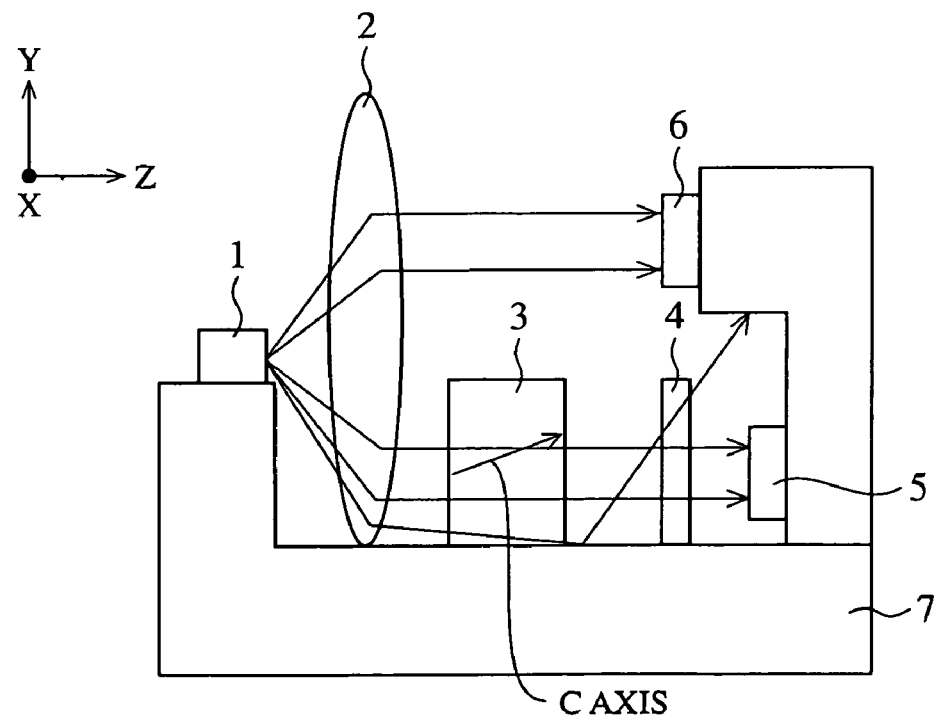
FIG. 16 is a block diagram showing a wavelength monitoring device according to a seventh variant of embodiment 1 of the present invention.

FIG. 16 is a block diagram showing a wavelength monitoring device in accordance with a seventh variant of embodiment 1 of the present invention. In FIG. 16, the second photodiode 6 is placed above polarizer 4 so that the spacing between the lens 2 and the second photodiode 6 is reduced. Therefore, even if the optical signal that has passed through the uniaxial birefringent crystal 3 is scattered from the base carrier 7, no scattered light passes through the polarizer 4 and then enters the second photodiode 6.

As can be seen from the above description, in accordance with the seventh variant of this embodiment 1, because the second photodiode 6 is placed above the polarizer 4, the intensity of the optical signal received by the second photodiode 6 can be detected and monitored accurately.

Embodiment 2

In embodiment 1, a uniaxial birefringent crystal is so determined and placed in the wavelength monitoring device as to meet the temperature compensation condition given by the equation (13). However, when the change $d\Delta n(\phi c)/dT$ in the refractive index difference with respect to the temperature of the uniaxial birefringent crystal and/or the linear expansion coefficient $\alpha$ in the equation (13) change dependently upon the temperature of the uniaxial birefringent crystal, there is a possibility that the temperature compensation condition is satisfied at a certain standard temperature, whereas the temperature compensation condition is not satisfied at other temperatures. To solve this problem, in accordance with this embodiment, a temperature compensation condition that temperature compensation is surely implemented for the uniaxial birefringent crystal in a wide temperature range in which a semiconductor laser 1 can operate is newly found, and the temperature compensation condition is applied to a wavelength monitoring device.

Figure 17:
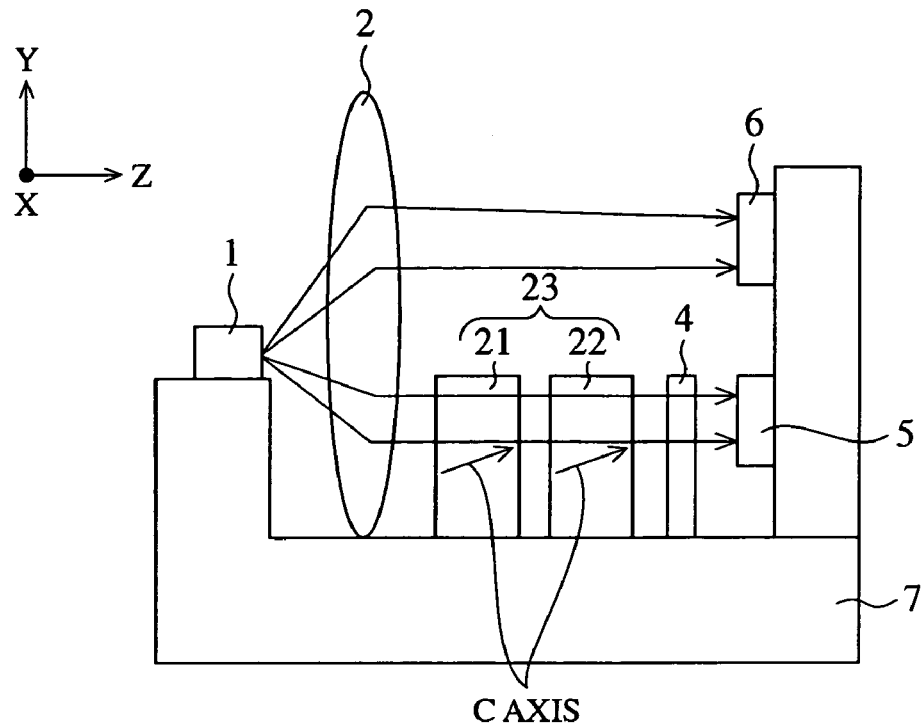
FIG. 17 is a block diagram showing a wavelength monitoring device according to embodiment 2 of the present invention.

FIG. 17 is a block diagram showing the wavelength monitoring device in accordance with embodiment 2 of the present invention. The wavelength monitoring device in accordance with embodiment 2 of the present invention has the same components as those of the wavelength monitoring device of embodiment 1 which are designated by the same reference numerals, and the explanation of those components will be omitted hereafter.

In FIG. 17, reference numeral 21 denotes a first uniaxial birefringent crystal. The first birefringence crystal has a cut-out surface parallel to an xy plane perpendicular to an optical axis of an incident optical signal, and has a C axis oriented in a direction determined by inclining a vector on a y axis in the xy plane toward a direction of an x axis by 45 degrees and further inclining the vector in a plane including both the vector and a z axis toward a direction of the z axis by a certain angle. In other words, the C axis of the first uniaxial birefringent crystal is inclined at an angle other than 90 degrees against the laser optical axis that is the direction in which the optical signal emitted from the semiconductor laser is traveling. Reference numeral 22 denotes a second uniaxial birefringent crystal arranged in series with the first uniaxial birefringent crystal 21 along the optical axis of the optical signal, and having a temperature characteristic opposite to that of the first uniaxial birefringent crystal. The second birefringence crystal has a cut-out surface parallel to the xy plane perpendicular to the optical axis of the incident optical signal, and has a C axis oriented in a direction determined by inclining a vector on the y axis in the xy plane toward the direction of the x axis by 45 degrees and further inclining the vector in a plane including both the vector and the z axis toward the direction of the z axis by a certain angle. In other words, the C axis of the second uniaxial birefringent crystal is inclined at an angle other than 90 degrees against the laser optical axis that is the direction in which the optical signal emitted from the semiconductor laser is traveling. The first uniaxial birefringent crystal 21 and the second uniaxial birefringent crystal 22 arranged in series form a uniaxial birefringent crystalline unit 23 having a temperature compensation function in a wide temperature range. The reason why the uniaxial birefringent crystalline unit 23 has a temperature compensation function in a wide temperature range is wide will be described later. The uniaxial birefringent crystalline unit 23 receives a part of the optical signal converged by the lens 2 and then emits an optical signal that consists of an ordinary ray and an extraordinary ray that have a phase difference dependent upon the wavelength of the incident light.

Next, the reason why the two uniaxial birefringent crystals in accordance with embodiment 2 are arranged in series will be mentioned. When the temperature compensation condition is satisfied at a standard temperature for the uniaxial birefringent crystalline unit 23 that consists of the first uniaxial birefringent crystal 21 and the second uniaxial birefringent crystal 22. At another temperature different from the standard temperature, $d\Delta n(\phi c)/dT$ and/or the linear expansion coefficient $\alpha$ of the first uniaxial birefringent crystal 21 change and the optical signal that passes through the first uniaxial birefringent crystal 21 has a phase different from that at the standard temperature. Similarly, at another temperature different from the standard temperature, $d\Delta n(\phi c)/dT$ and/or the linear expansion coefficient $\alpha$ of the second uniaxial birefringent crystal 22 change and the optical signal that passes through the second uniaxial birefringent crystal 22 has a phase different from that at the standard temperature. In accordance with this embodiment, the temperature compensation condition for the uniaxial birefringent crystalline unit 23 is determined, two types of uniaxial birefringent crystals that provide temperature-dependent changes of opposite sign for the phase of the optical signal passing through them, respectively, are used as the first and second uniaxial birefringent crystals, and the thickness of the first uniaxial birefringent crystal 21 and that of the second uniaxial birefringent crystal 22 are determined so that the change in the phase of the optical signal passing through the first uniaxial birefringent crystal 21 and the change in the phase of the optical signal passing through the second uniaxial birefringent crystal 22 cancel each other out.

Next, the temperature compensation condition on which the uniaxial birefringent crystalline unit 23 has a temperature compensation function in a wide temperature range will be described.

When the two uniaxial birefringent crystals are arranged in series, the following equation (14) corresponding to the equation (10) of embodiment 1 is acquired. In the equation (14), T is the temperature of the two uniaxial birefringent crystals 21 and 22, $\Delta n_A$ is the difference between the refractive index for the extraordinary ray and the refractive index for the ordinary ray in the first uniaxial birefringent crystal 21, $\Delta n_B$ is the difference between the refractive index for the extraordinary ray and the refractive index for the ordinary ray in the second uniaxial birefringent crystal 22, $L_A$ is the thickness of the first uniaxial birefringent crystal 21 in the direction of the optical axis of the incident optical signal, $L_B$ is the thickness of the second uniaxial birefringent crystal 22 in the direction of the optical axis of the incident optical signal, $\alpha_A$ is the linear expansion coefficient of the first uniaxial birefringent crystal 21, $\alpha_B$ is the linear expansion coefficient of the second uniaxial birefringent crystal 22, and $\lambda$ is the wavelength of the incident optical signal.

$$\frac{\partial \lambda}{\partial T}(L_A, L_B) = \tag{14}$$

$$\frac{\left\{\left(\frac{d\Delta n_A}{dT} + \alpha_A \cdot \Delta n_A\right) \cdot L_A + \left(\frac{d\Delta n_B}{dT} + \alpha_B \cdot \Delta n_B\right) \cdot L_B\right\} \cdot \lambda}{\Delta n_A \cdot L_A + \Delta n_B \cdot L_B}$$

Therefore, the following equation (15) indicating the temperature compensation condition and corresponding to the equation (13) of embodiment 1 is acquired:

$$\left(\frac{d\Delta n_A}{dT} + \alpha_A \cdot \Delta n_A\right) \cdot L_A + \left(\frac{d\Delta n_B}{dT} + \alpha_B \cdot \Delta n_B\right) \cdot L_B = 0 \tag{15}$$

Furthermore, by using the simultaneous equations (14) and (15), an inherent crystal thickness is obtained when a desired FSR corresponding to the equation (8) of embodiment 1 is specified as follows:

$$FSR = \frac{c_0}{(\Delta n_A \cdot L_A + \Delta n_B \cdot L_B)} \tag{16}$$

In order to provide a condition on which the equation (14) is established in a wide temperature range even when a temperature change occurs in the uniaxial birefringent crystals 21 and 22, by differentiating the left and right sides of the equation (14) with respect to the temperature T, the second derivative of the wavelength λ with respect to the temperature T is obtained as follows:

$$\frac{\partial^2 \lambda}{\partial T^2}(L_A, L_B) = \frac{1}{(\Delta n_A \cdot L_A + \Delta n_B \cdot L_B)^2} \tag{17}$$

$$\left[\begin{array}{l}\left\{\left(\frac{d^2 \Delta n_A}{dT^2} + \frac{d\Delta n_A}{dT} \cdot \alpha_A \cdot \Delta n_A\right) \cdot L_A + \right. \\ \cdot (\Delta n_A \cdot L_A + \Delta n_B \cdot L_B) - \\ \left\{\left(\frac{d\Delta n_A}{dT} + \alpha_A \cdot \Delta n_A\right) \cdot L_A + \left(\frac{d\Delta n_B}{dT} + \alpha_B \cdot \Delta n_B\right) \cdot L_B\right\}^2\end{array}\right]$$

It can be determined that the temperature compensation condition shown by the equation (15) is always satisfied independently upon the temperature when the second derivative of the wavelength λ with respect to the temperature T becomes zero. A condition on which the second derivative of the wavelength λ with respect to the temperature T becomes zero is given by the following equation (18):

$$\left\{\left(\frac{d^2 \Delta n_A}{dT^2} + \frac{d\Delta n_A}{dT} \cdot \alpha_A \cdot \Delta n_A\right) \cdot L_A + \right. \tag{18}$$

$$\left(\frac{d^2 \Delta n_B}{dT^2} + \frac{d\Delta n_B}{dT} \cdot \alpha_B \cdot \Delta n_B\right) \cdot L_B\right\}$$

$$\cdot (\Delta n_A \cdot L_A + \Delta n_B \cdot L_B) -$$

$$\left\{\left(\frac{d\Delta n_A}{dT} \cdot \alpha_A \cdot \Delta n_A\right) \cdot L_A + \left(\frac{d\Delta n_B}{dT} + \alpha_B \cdot \Delta n_B\right) \cdot L_B\right\}^2 = 0$$

In order to determine the two uniaxial birefringent crystals 21 and 22 on the condition that the equations (15), (16), and (18) are established at the same time, the angle $\phi c$ between the laser light vector and the C axis is taken into consideration, as in the case of embodiment 1. When the angle $\phi c$ between the laser light vector and the C axis is changed, $\Delta n$, $d\Delta n/dT$, and $d^2\Delta n/d^2T$ are changed, too. Therefore, $d^2\Delta n_A/d^2T + d\Delta n_A/dT \cdot \alpha_A^* \Delta n_A$ and $d^2\Delta n_B/d^2T + d\Delta n_B/dT \cdot \alpha_B^* \Delta n_B$ in the first term of the equation (18) can be adjusted. The equations (15), (16), and (18) can be transformed into the following equations (19), (20), and (21) by taking the angle $\phi_{cA}$ between the laser light vector and the C axis of the crystal 21, and the angle $\phi_{cB}$ between the laser light vector and the C axis of the crystal 2 into consideration:

$$\left(\frac{d\Delta n_A(\phi_{cA})}{dT} + \alpha_A \cdot \Delta n_A(\phi_{cA})\right) \cdot L_A + \tag{19}$$

$$\left(\frac{d\Delta n_B(\phi_{cB})}{dT} + \alpha_B \cdot \Delta n_B(\phi_{cB})\right) \cdot L_B = 0$$

$$\left\{\left(\frac{d^2 \Delta n_A(\phi_{cA})}{dT^2} + \frac{d\Delta n_A(\phi_{cA})}{dT} \cdot \alpha_A \cdot \Delta n_A(\phi_{cA})\right) \cdot L_A \right. \tag{20}$$

$$\left. + \left(\frac{d^2 \Delta n_B(\phi_{cB})}{dT^2} + \frac{d\Delta n_B(\phi_{cB})}{dT} \cdot \alpha_B \cdot \Delta n_B(\phi_{cB})\right) \cdot L_B\right\} \cdot$$

$$(\Delta n_A(\phi_{cA}) \cdot L_A + \Delta n_B(\phi_{cB}) \cdot L_B) -$$

$$\left\{\left(\frac{d\Delta n_A(\phi_{cA})}{dT} + \alpha_A \cdot \Delta n_A(\phi_{cA})\right) \cdot L_A + \left(\frac{d\Delta n_B(\phi_{cB})}{dT} + \alpha_B \cdot \Delta n_B(\phi_{cB})\right) \cdot L_B\right\}^2$$

$$= 0$$

$$FSR = \frac{c_0}{(\Delta n_A(\phi_{cA}) \cdot L_A + \Delta n_B(\phi_{cB}) \cdot L_B)} \tag{21}$$

Therefore, when the uniaxial birefringent crystals 21 and 22 are so constructed as to have various characteristics that satisfy the equations (19), (20), and (21), and the angle $\phi_{cA}$, the angle $\phi_{cB}$, the length $L_A$, and the length $L_B$ are so determined as to satisfy the equations (19), (20), and (21), the temperature compensation condition on which the uniaxial birefringent crystalline unit 23 that consists of the two uniaxial birefringent crystals 21 and 22 can implement temperature compensation over a wide temperature range is provided.

Next, a description will be made as to an operation of the wavelength monitoring device in accordance with embodiment 2 of the present invention.

A lower side half of an optical signal converged by the lens 2 passes through the first uniaxial birefringent crystal 21 and the second uniaxial birefringent crystal 22. In this case, even if a temperature change occurs in the first and second uniaxial birefringent crystals 21 and 22, a temperature-dependent change in the phase of the optical signal which is caused by the first uniaxial birefringent crystal 21 and a temperature-dependent change in the phase of the optical signal which is caused by the second uniaxial birefringent crystal 22 cancel each other out. Therefore, the optical signal that consists of a p-polarized component and an s-polarized component that have intensities that depends upon only the wavelength of the optical signal in a wide temperature range is sent from the uniaxial birefringent crystalline unit 23 to a polarizer 4, and only the p-polarized component of the optical signal is then passed through the polarizer 4 and the optical signal intensity S1 of the p-polarized component is detected and monitored by the first photodiode 5.

As can be seen from the above description, in accordance with this embodiment 2, the uniaxial birefringent crystalline unit 23 that consists of the two types of uniaxial birefringent crystals 21 and 22 that provide temperature-dependent changes of opposite sign for the phase of an optical signal passing through them, respectively, is arranged so that their C axes are inclined at an angle other than 90 degrees against the optical axis of the optical signal, and the polarizer 4 is so constructed as to allow only a p-polarized component of the optical signal that has passed through the uniaxial birefringent crystalline unit 23 to pass therethrough, the optical signal including the p-polarized component and an s-polarized component. The phase difference δ between the ordinary ray and extraordinary ray of the optical signal is kept constant in a wide temperature range regardless of temperature changes of the two uniaxial birefringent crystals 21 and 22. As a result, this embodiment 2 offers an advantage of being able to detect and monitor the optical signal intensity S1 that depends upon only the wavelength of the optical signal in a wide temperature range with a high degree of reliability. Furthermore, embodiment 2 provides another advantage of being able to control the wavelength of the optical signal emitted from the semiconductor laser to a desired reference wavelength based on the detected optical signal intensity S1.

In this embodiment 2, the C axis of each uniaxial birefringent crystal is oriented in a direction of a vector obtained by inclining a vector on the y axis toward the x axis in the xy plane by a first certain angle of 45 degrees and further inclining the vector toward the z axis in a plane including both the vector and the z axis by a second certain angle. The first certain angle is not limited to 45 degrees. In other words, each uniaxial birefringent crystal only has to have a C axis that is oriented in a direction of a vector obtained by inclining a vector oriented in a direction different from the direction in which the laser light emitted from the semiconductor laser 1 vibrates toward the z axis in a plane including both the vector and the z axis by a certain angle.

The pair of uniaxial birefringent crystals 21 and 22 is used in this embodiment 2. However, each birefringent crystal is not limited to a uniaxial one, and can be a biaxial birefringent crystal.

Figure 18:
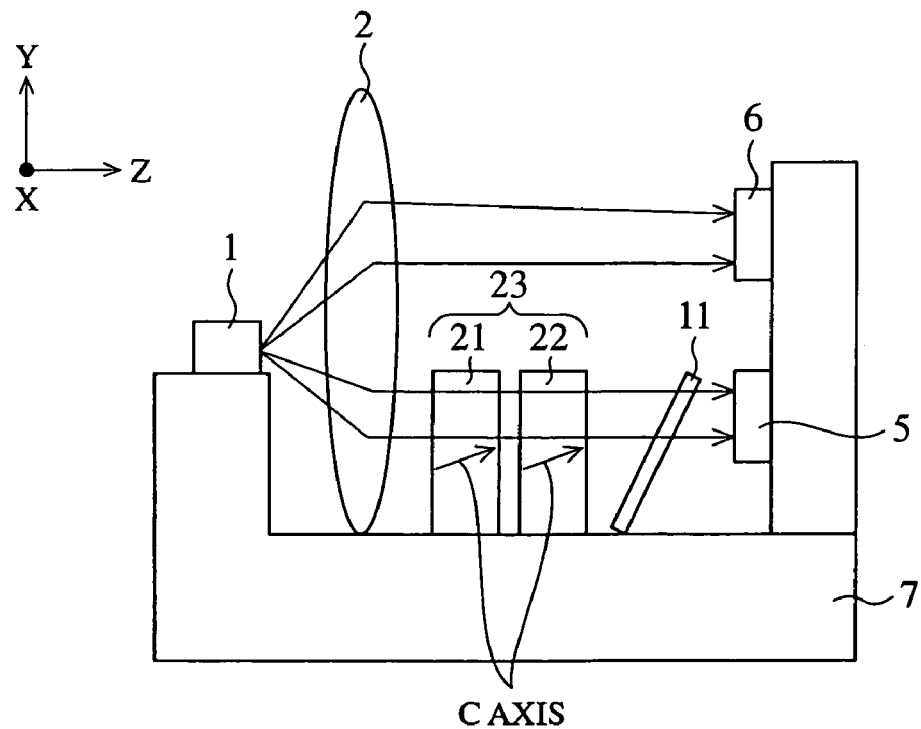
FIG. 18 is a block diagram showing a wavelength monitoring device according to a first variant of embodiment 2 of the present invention.
Figure 19:
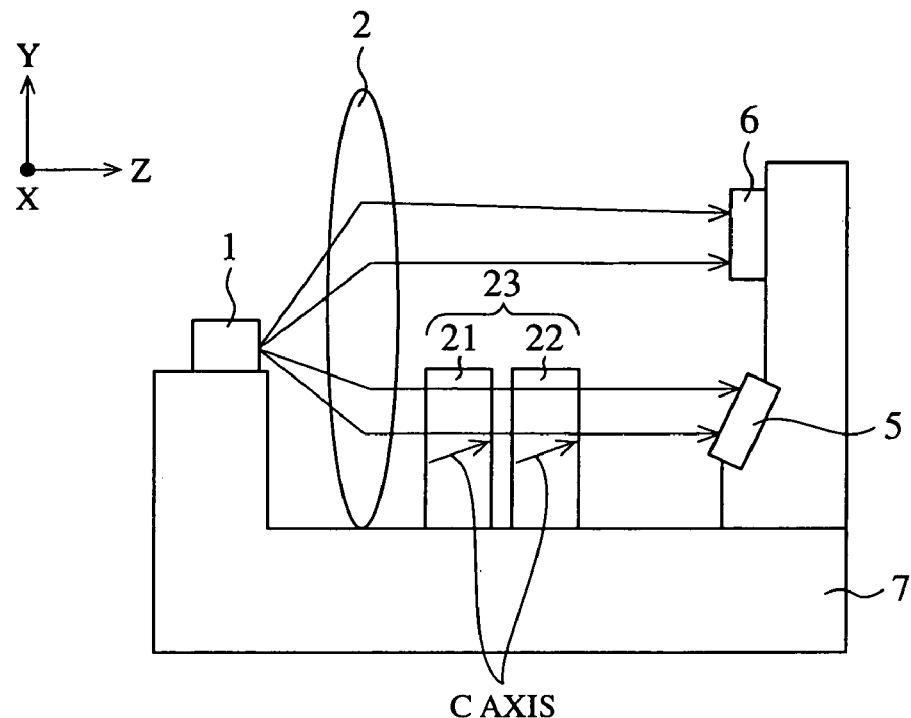
FIG. 19 is a block diagram showing a wavelength monitoring device according to a second variant of embodiment 2 of the present invention.

Next, wavelength monitoring devices according to variants of embodiment 2 will be explained. FIG. 18 is a block diagram showing a wavelength monitoring device in accordance with a first variant of embodiment 2 of the present invention, and FIG. 19 is a block diagram showing a wavelength monitoring device in accordance with a second variant of embodiment 2 of the present invention.

In the first variant as shown in FIG. 18, because the polarizer 4 and the first photodiode 5 are arranged in the same way that those of the first variant of embodiment 1 are arranged, the same advantage as offered by the first variant of embodiment 1 can be provided. Similarly, in the second variant as shown in FIG. 19, because the polarizer 4 and the first photodiode 5 are arranged in the same way that those of the second variant of embodiment 1 are arranged, the same advantage as offered by the second variant of embodiment 1 can be provided.

Figure 20:
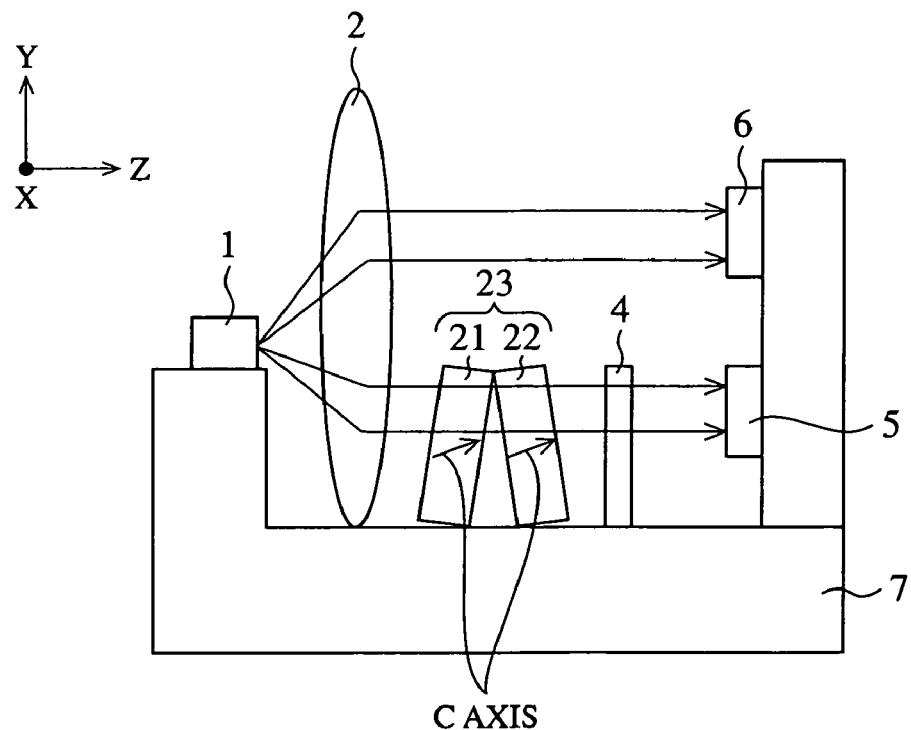
FIG. 20 is a block diagram showing a wavelength monitoring device according to a third variant of embodiment 2 of the present invention.

FIG. 20 is a block diagram showing a wavelength monitoring device in accordance with a third variant of embodiment 2 of the present invention. In the third variant as shown in FIG. 20, the two uniaxial birefringent crystals 21 and 22 and the polarizer 4 are bonded to one another so that they are integral with one another. Therefore, the mechanical strengths of the two uniaxial birefringent crystals 21 and 22 and the polarizer 4 can be improved. Furthermore, the arrangement of the two uniaxial birefringent crystals 21 and 22 and the polarizer 4 is facilitated, and the assembly of the wavelength monitoring device is therefore facilitated.

In the third variant of this embodiment 2, the two uniaxial birefringent crystals 21 and 22 and the polarizer 4 are bonded to one another with a bonding adhesive or the like. As an alternative, after contact surfaces of the two uniaxial birefringent crystals 21 and 22 and the polarizer 4 are ground so that their irregularities are removed, the two uniaxial birefringent crystals 21 and 22 and the polarizer 4 are secured to one another without using a bonding adhesive or the like.

Figure 21:
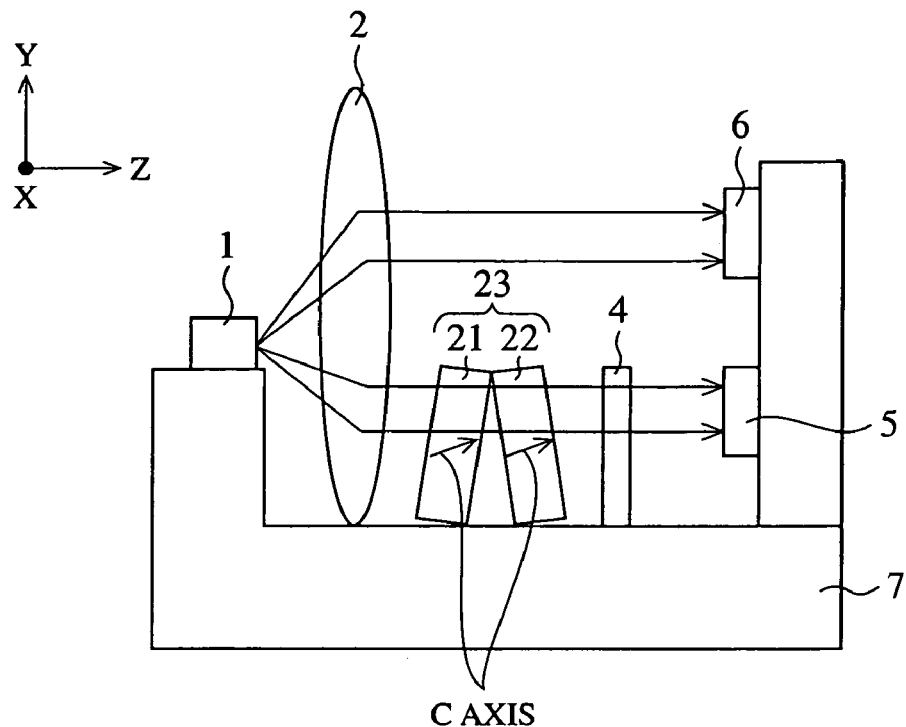
FIG. 21 is a block diagram showing a wavelength monitoring device according to a fourth variant of embodiment 2 of the present invention.

FIG. 21 is a block diagram showing a wavelength monitoring device in accordance with a fourth variant of embodiment 2 of the present invention. The two uniaxial birefringent crystals 21 and 22 are so arranged that their lateral surfaces show an inverted letter V. In this case, the sympathetic vibration of the optical signal between the two uniaxial birefringent crystals 21 and 22 is reduced. Therefore, the fourth variant offers an advantage of being able to prevent light from returning to the semiconductor laser 1.

Figure 22:
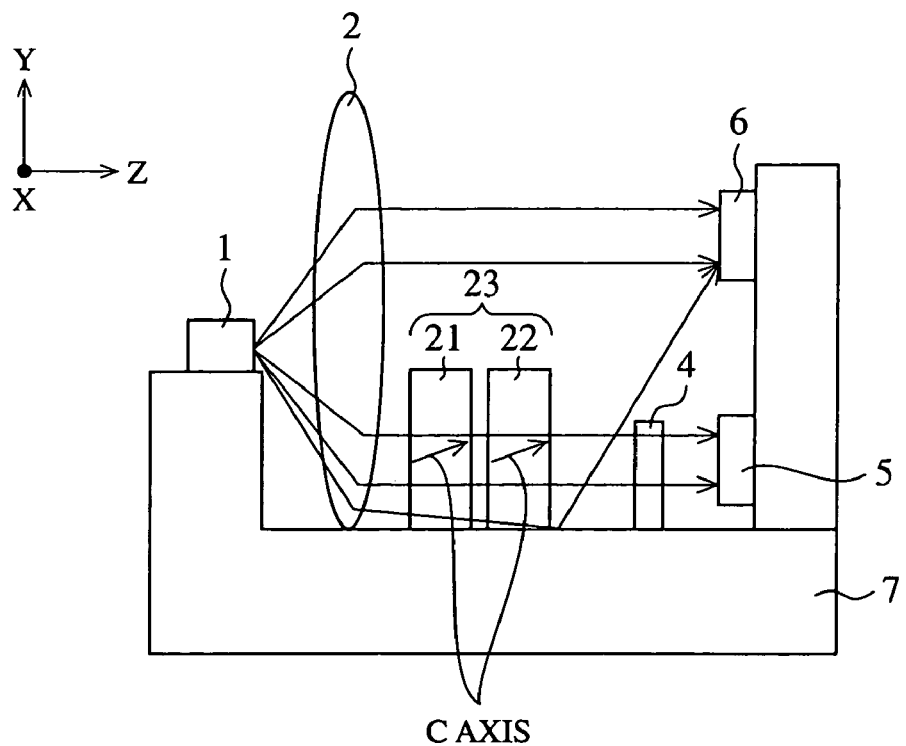
FIG. 22 is a block diagram showing a wavelength monitoring device according to a fifth variant of embodiment 2 of the present invention.
Figure 23:
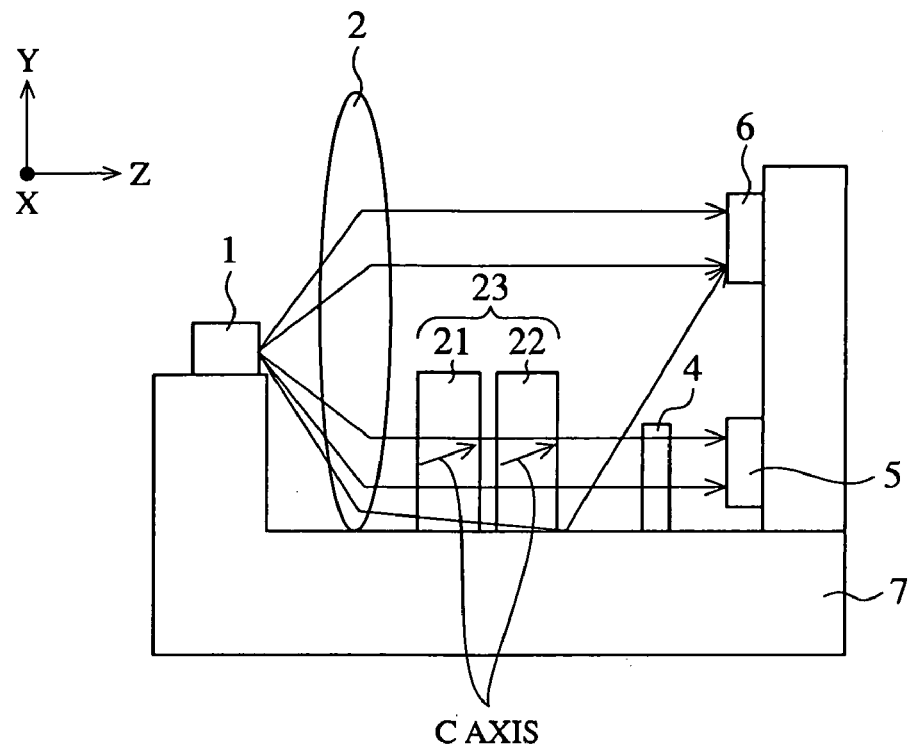
FIG. 23 is a block diagram showing a wavelength monitoring device according to a sixth variant of embodiment 2 of the present invention.
Figure 24:
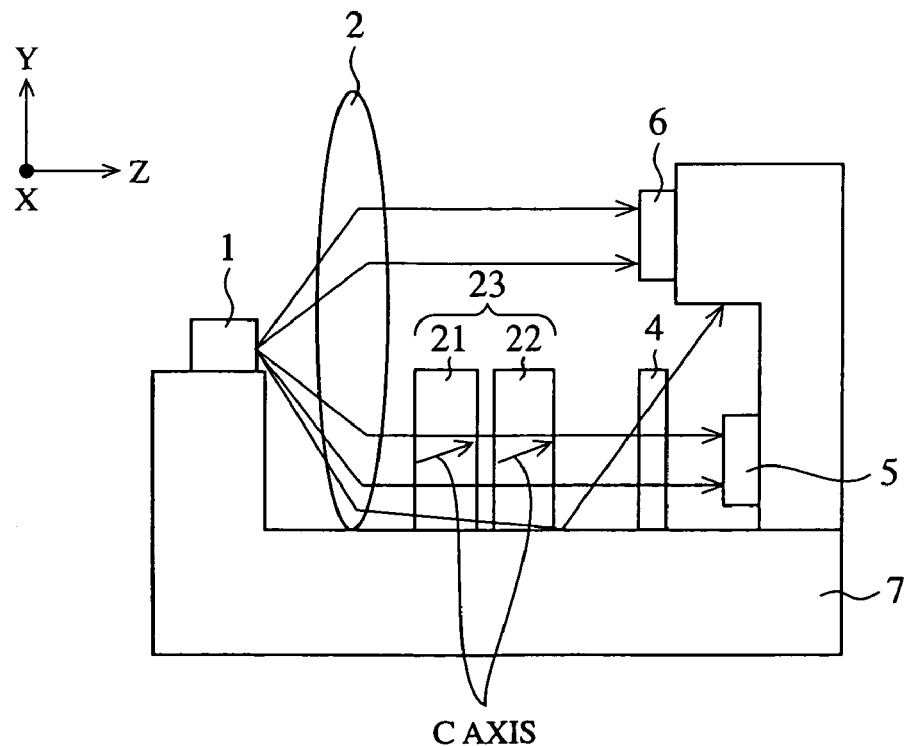
FIG. 24 is a block diagram showing a wavelength monitoring device according to a seventh variant of embodiment 2 of the present invention.

FIG. 22 is a block diagram showing a wavelength monitoring device in accordance with a fifth variant of embodiment 2 of the present invention, FIG. 23 is a block diagram showing a wavelength monitoring device in accordance with a sixth variant of embodiment 2 of the present invention, and FIG. 24 is a block diagram showing a wavelength monitoring device in accordance with a seventh variant of embodiment 2 of the present invention.

In the fifth variant as shown in FIG. 22, because a glass plate 12, the polarizer 4 and a second photodiode 6 are arranged in the same way that those of the fifth variant of embodiment 1 are arranged, the same advantage as offered by the fifth variant of embodiment 1 can be provided. Similarly, in the sixth variant as shown in FIG. 23, because the glass plate 12, the polarizer 4 and the second photodiode 6 are arranged in the same way that those of the sixth variant of embodiment 1 are arranged, the same advantage as offered by the sixth variant of embodiment 1 can be provided. Also, in the seventh variant as shown in FIG. 24, because the glass plate 12, the polarizer 4 and the second photodiode 6 are arranged in the same way that those of the seventh variant of embodiment 1 are arranged, the same advantage as offered by the seventh variant of embodiment 1 can be provided.

Embodiment 3

In accordance with this embodiment, there is provided a wavelength monitoring device that can adjust the wavelength discriminating characteristics of a uniaxial birefringent crystal and a polarizer according to a desired reference wavelength.

Figure 25:
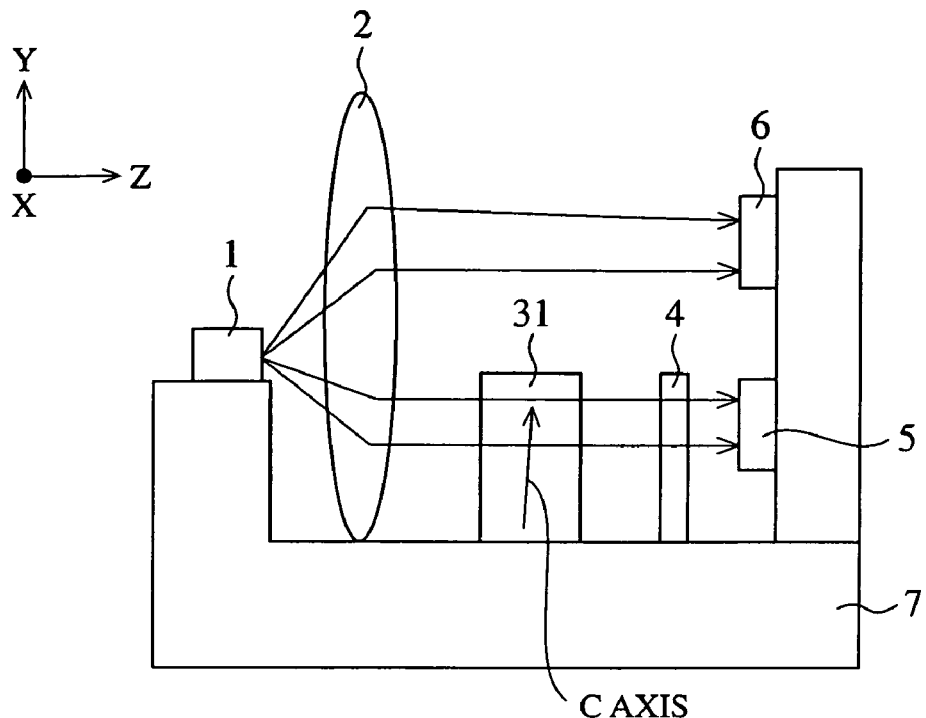
FIG. 25 is a block diagram showing a wavelength monitoring device according to embodiment 3 of the present invention.

FIG. 25 is a block diagram showing the wavelength monitoring device in accordance with embodiment 3 of the present invention. The wavelength monitoring device in accordance with embodiment 3 of the present invention has the same components as those of the wavelength monitoring devices of embodiments 1 and/or 2 which are designated by the same reference numerals, and the explanation of those components will be omitted hereafter.

Reference numeral 31 denotes a uniaxial birefringent crystal. This uniaxial birefringent crystal has a crystal cut-out surface for receiving an optical signal, the cut-out surface being parallel to an xy plane, and has a C axis oriented in a direction determined by inclining a vector on a y axis in the xy plane toward a direction of an x axis by 45 degrees and further inclining the vector in a plane including both the vector and a z axis toward a direction of the z axis by a crystal cut-out angle (e.g., 3 to 4 degrees). The uniaxial birefringent crystal is disposed by being rotated about the y axis by only a specific adjustment angle so that a normal to the cut-out surface of this crystal is in a zx plane and is inclined at the specific adjustment angle that can vary within an angle range against the optical axis of an incident optical signal (e.g., a range from 0 to 10 degrees). The uniaxial birefringent crystal 31 receives a part of the optical signal converged by the lens 2, and emits an optical signal that consists of an ordinary ray and an extraordinary ray having a phase difference that depends on the wavelength of the incident light.

First of all, a description will be made as to the uniaxial birefringent crystal 31 that can adjust the wavelength discriminating characteristic thereof and the wavelength discriminating characteristic of the polarizer according to a desired reference wavelength.

Figure 26:
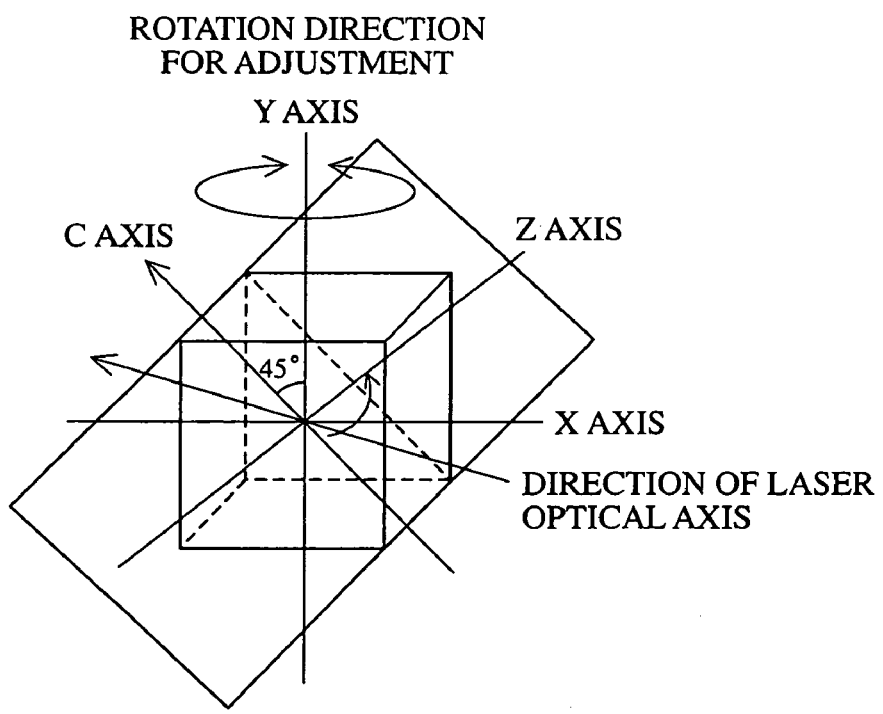
FIG. 26 is a diagram for explaining the C axis of a uniaxial birefringent crystal and the direction of the optical axis of an incident optical signal in a spatial coordinate system in the wavelength monitoring device according to the embodiment 3.
Figure 27:
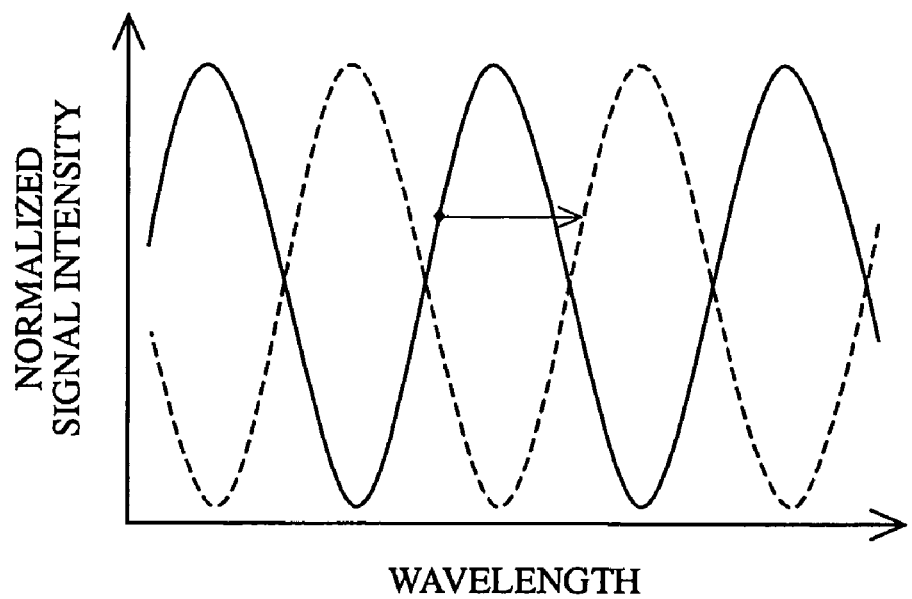
FIG. 27 is a diagram for explaining a change (i.e., a shift of half cycle) in the wavelength characteristic of the uniaxial birefringent crystal.

FIG. 26 is a diagram for explaining the C axis of the uniaxial birefringent crystal and the direction of the optical axis of the incident optical signal in a spatial coordinate system when the uniaxial birefringent crystal has a crystal cut-out surface parallel to the xy plane, and the C axis that is oriented in a direction determined by inclining a vector on the y axis in the xy plane toward the direction of the x axis by 45 degrees and further inclining the vector toward the direction of the z axis by the crystal cut-out angle, and the uniaxial birefringent crystal is disposed by being rotated about the y axis by only the specific adjustment angle, and FIG. 27 is a diagram for explaining a change (i.e., a shift of half cycle) in the wavelength characteristic of the uniaxial birefringent crystal 31.

As shown in FIG. 26, when the uniaxial birefringent crystal has a C axis that is oriented in a direction determined by inclining a vector on the y axis in the xy plane toward the direction of the x axis by 45 degrees and further inclining the vector in a plane including both the vector and the z axis toward the direction of the z axis by the crystal cut-out angle, a refractive index ne(φc) to which the extraordinary ray of the laser light (i.e., the incident optical signal) is subject is given by the following equation (22):

$$n_e(\phi_c) = n_e \cdot \sqrt{\frac{1 + \tan^2\phi_c}{1 + (n_0/n_e)^2 \tan^2\phi_c}} \quad (22)$$

where the angle between the optical axis of the laser light and the C axis is φc.

When the refractive index ne (φc) for the extraordinary ray is determined, the length of the uniaxial birefringent crystal is determined uniquely for an arbitrary periodicity FSR and is given by the following equation (23):

$$Lopt = \frac{c_0}{\Delta n \cdot FSR} \quad (23)$$

where Lopt is the length (or thickness) of the uniaxial birefringent crystal in the direction of the optical axis of the incident light.

In the uniaxial birefringent crystal, a polarization status changes according to the wavelength λ of the laser light passing through the uniaxial birefringent crystal. This change originates from a phase difference between a polarized component in a direction of ne (i.e., a direction in which the extraordinary ray is traveling) and a polarized component in a direction of no (i.e., a direction in which the ordinary ray is traveling), which is caused when the laser light passes through the uniaxial birefringent crystal. Therefore, in order to evaluate the change in the wavelength discriminating characteristic of the uniaxial birefringent crystal 31 according to the change in the wavelength of the incident laser light, the phase difference, i.e., the number of times (referred to as order in this specification) which the electric field of the laser light propagating in the crystal vibrates only has to be determined. By using the above-mentioned variables, the order δ' is given by the equation (24):

$$\delta' = \Delta n \cdot Lopt/\lambda \quad (24)$$

The wavelength discriminating characteristic of the uniaxial birefringent crystal 31 changes, as shown in FIG. 27, with increase or decrease in the order. For example, when the order increases by only 1, the discriminating periodicity shifts by only one. Furthermore, in accordance with this embodiment, when the FSR is fixed, the order is kept constant even if the uniaxial birefringent crystal is cut out such that it has a C axis inclined at any angle against the optical axis of the incident light, unless an inclination angle of the cut-out surface of the crystal is made to change with respect to the optical axis of the incident light.

While the order changes, as shown in equation (24), dependently upon the refractive index difference Δn and the length Lopt of the crystal, the refractive index difference Δn and the length Lopt of the crystal change and therefore the order also changes when the crystal is rotated about the y axis so that it is inclined against the incident light. In accordance with this embodiment, the wavelength discriminating characteristic of the uniaxial birefringent crystal 31 is made to change by using the fact that the order changes when the cut-out surface of the uniaxial birefringent crystal is inclined against the optical axis of the incident light.

To this end, in accordance with this embodiment, the C axis of the uniaxial birefringent crystal 31 is not inclined toward the direction of the z axis in a plane including both the C axis and the z axis, but is rotated about the y axis by a certain adjustment angle with an adjustment axis of the crystal being the y axis. When the cut-out surface of the crystal is vertically arranged with respect to the optical axis of the incident laser light, the adjustment angle is zero.

Assuming an x'y'z' coordinate system having an x'z' plane including both the C axis of the uniaxial birefringent crystal and the z axis, a vector c indicating the C axis with the adjustment angle being zero in this coordinate system is given by the following equation (25):

$$c = \begin{pmatrix} \sin\phi_c \\ 0 \\ \cos\phi_c \end{pmatrix} \quad (25)$$

Because in the xyz coordinate system the x' axis is inclined at 45 degrees against the x axis in the xy plane, the vector c indicating the C axis (i.e., a directional vector of the C axis) is transformed into a vector in the xyz coordinate system which is given by the following equation (26):

$$c = \begin{pmatrix} \cos\frac{\pi}{4} \cdot \sin\phi_c \\ \sin\frac{\pi}{4} \cdot \sin\phi_c \\ \cos\phi_c \end{pmatrix} \quad (26)$$

Instead of rotating the crystal about the y axis, when a vector r indicating the optical axis of the incident laser light (i.e., a directional vector of the optical axis) is rotated by ($\phi,\theta$), the vector r indicating the optical axis of the incident laser light in the xyz coordinate system is given by the following equation (27):

$$r = \begin{pmatrix} \sin\phi \cdot \cos\theta \\ \sin\theta \\ \cos\phi \cdot \sin\theta \end{pmatrix} \quad (27)$$

where $\phi$ is an angle between a component of the rotated directional vector r of the optical axis which is projected onto the zx plane and the z axis, and $\theta$ is an angle between a component of the rotated directional vector r of the optical axis which is projected onto the yz plane and the z axis.

An angle $\phi c'$ between the directional vector r of the laser optical axis and the directional vector c of the C axis when the directional vector r of the laser optical axis is rotated by ($\phi,\theta$) is given by the following equation (28) by using the scalar product of these directional vectors.

$$\phi'_c = \cos^{-1}\left(\frac{r \cdot c}{|r||c|}\right) \quad (28)$$

When the directional vector r of the laser optical axis is rotated by ($\phi,\theta$), the refractive index $ne(\phi c')$ to which the extraordinary ray of the laser light is subject to is given by the equation (22) in which $\phi c$ is replaced by $\phi c'$. Therefore, by substituting the equation (28) into the equation (22) in which $\phi c$ is replaced by $\phi c'$, the refractive index difference $\Delta n$, the length Lopt of the crystal, and the order are obtained for the case where the crystal that is cut out at an arbitrary angle $\phi c$ with respect to the C axis thereof is rotated by ($\theta$, $\phi$).

A Jones matrix is used for representing polarized light components of the incident laser light when passing through the crystal. When the laser light passing through the crystal has polarized components (Ex,Ey) in the xyz coordinate system, the Jones matrix of the birefringent crystal is given by the following equations (29) and (30).

$$J(\zeta) = \begin{pmatrix} \cos\zeta & -\sin\zeta \\ \sin\zeta & \cos\zeta \end{pmatrix} \begin{pmatrix} \exp(-i\delta') & 0 \\ 0 & \exp(i\delta') \end{pmatrix} \begin{pmatrix} \cos\zeta & \sin\zeta \\ -\sin\zeta & \cos\zeta \end{pmatrix} \quad (29)$$

$$2\delta' = 2\pi \frac{Lopt}{\lambda}(n_e(\phi'_c) - n_0) \quad (30)$$

where $\zeta$ is an angle between the direction of the extraordinary ray caused from the incident laser light and the x axis of the laser light.

When the x and y components of a vector e indicating the direction of the extraordinary ray caused from the incident laser light are obtained, $\zeta$ can be determined and is given by the following equation (31):

$$\zeta = \tan^{-1}(e_y/e_x) \quad (31)$$

where $e_x$ is the x component of the extraordinary ray directional vector e, and $e_y$ is the y component of the extraordinary ray directional vector e.

Because the birefringent crystal is a uniaxial one, the extraordinary ray directional vector e is obtained as a normal to both a direction o of the ordinary ray caused from the incident laser light and the direction r of the laser light, and is given by the following equation (32):

$$e = o \times r \quad (32)$$

The direction o of the ordinary ray is parallel to a normal to a plane including both the C axis directional vector c and the vector r indicating the laser optical axis, and is given by the following equation (33):

$$o = \frac{c \times r}{|c||r|\sin\phi'_c} \quad (33)$$

$\zeta$ is obtained from the equations (31), (32) and (33). Therefore, when a normalized electric field vector of the laser light incident upon the uniaxial birefringent crystal is given by {1,0}, the electric field component Ex in the direction of the x axis (i.e., the electric field of the p-polarized component) and electric field component Ey in the direction of the y axis (i.e., the electric field of the s-polarized component) of the laser light that has passed through the uniaxial birefringent crystal are given by the equation (5), as shown in Embodiment 5, in which the order $\delta/2$ is replaced by an order $\delta'$. When the polarizer 4 is so constructed as to allow only the p-polarized component to pass therethrough, the normalized electric field vector received by the first photodiode 5 is {cos $\delta'$,0} and the intensity Sp is given by Sp=$\cos^2\delta'$, as in the case of the equation (6). In contrast, when the polarizer 4 is so constructed as to allow only the s-polarized component to pass therethrough, the normalized electric field vector received by the first photodiode 5 is {0, $-i$ sin $\delta'$} and the intensity Ss is given by Sp=$\sin^2\delta'$, as in the case of the equation (7).

The inventors of this application selected either one of uniaxial birefringent crystals $YVO_4$, $LiNbO_3$, $CaCO_3$, $TiO_2$, and $SiO_2$ as a material of which the uniaxial birefringent crystal 31 is formed. Each of FIGS. 28 to 32 shows changes in the order that are calculated when each crystal is rotated about the y axis from a position at which the cut-out surface is perpendicular to the laser optical axis (in this case, the adjustment angle is 0) by only the adjustment angle ($\phi r$).

Figure 28:
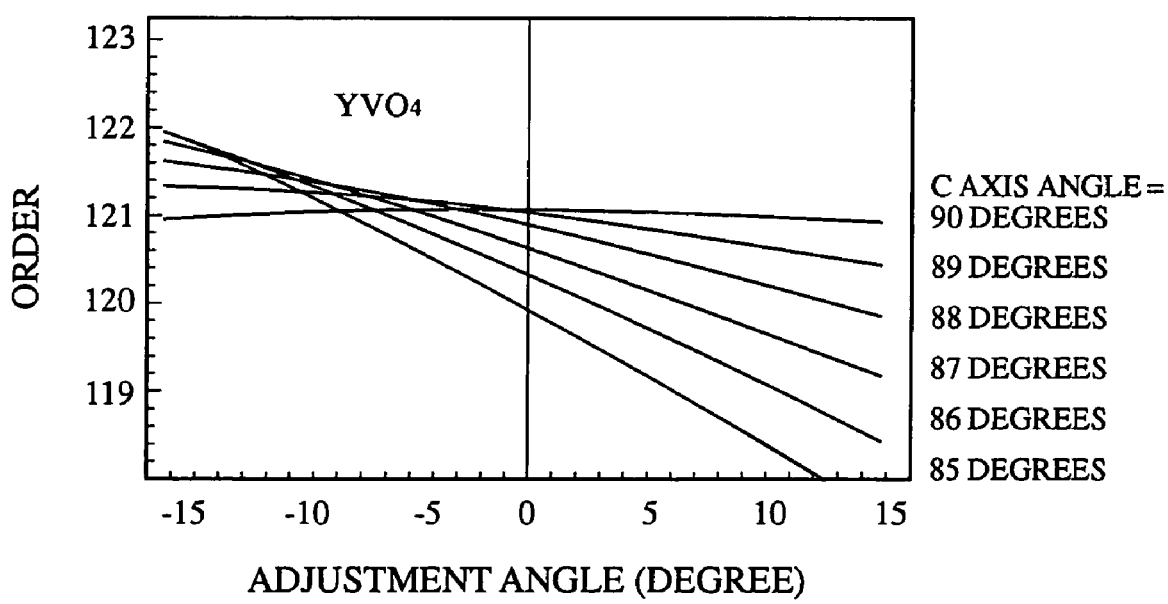
FIG. 28 is a diagram showing changes of an order that are calculated when a uniaxial birefringent crystal formed of $YVO_4$ is rotated around a y axis by only an adjustment angle ($\phi r$)
Figure 29:
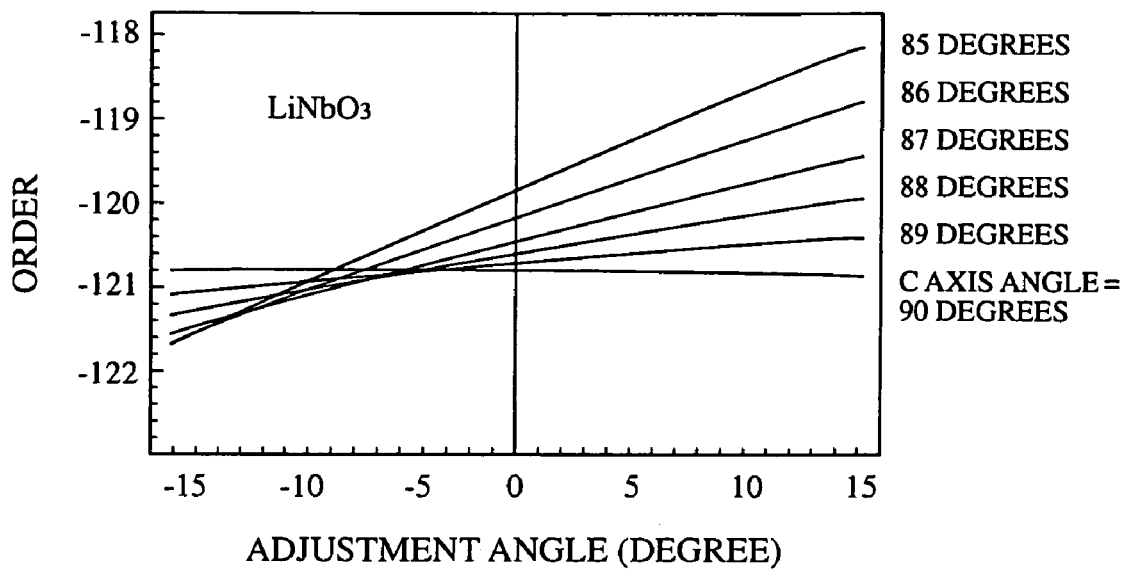
FIG. 29 is a diagram showing changes of the order that are calculated when the uniaxial birefringent crystal formed of $LiNbO_3$ is rotated around the y axis by only the adjustment angle ($\phi r$)
Figure 30:
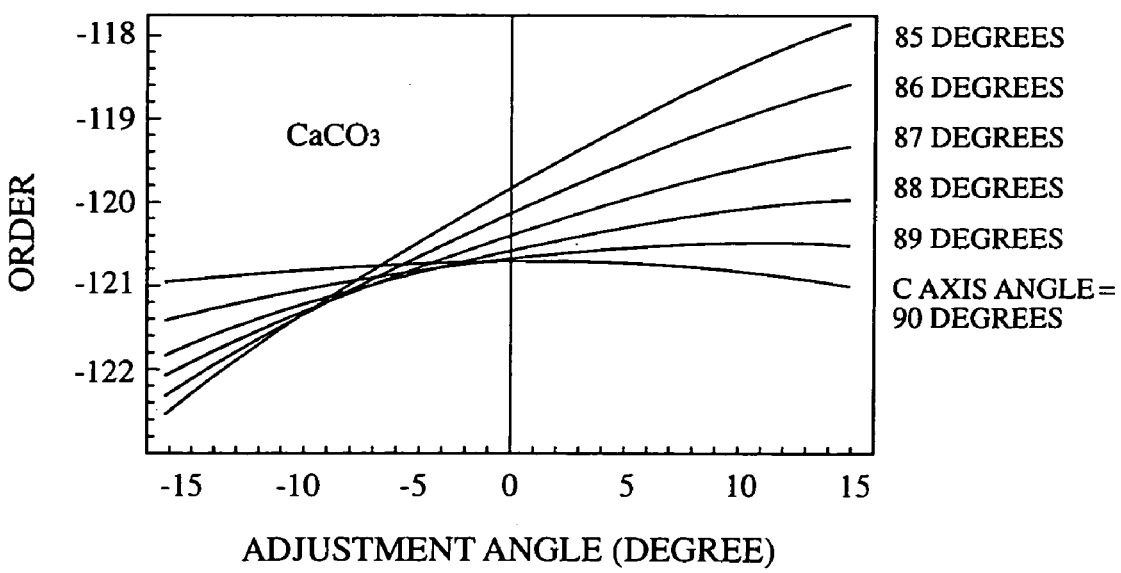
FIG. 30 is a diagram showing changes of the order that are calculated when the uniaxial birefringent crystal formed of $CaCO_3$ is rotated around the y axis by only the adjustment angle ($\phi r$)
Figure 31:
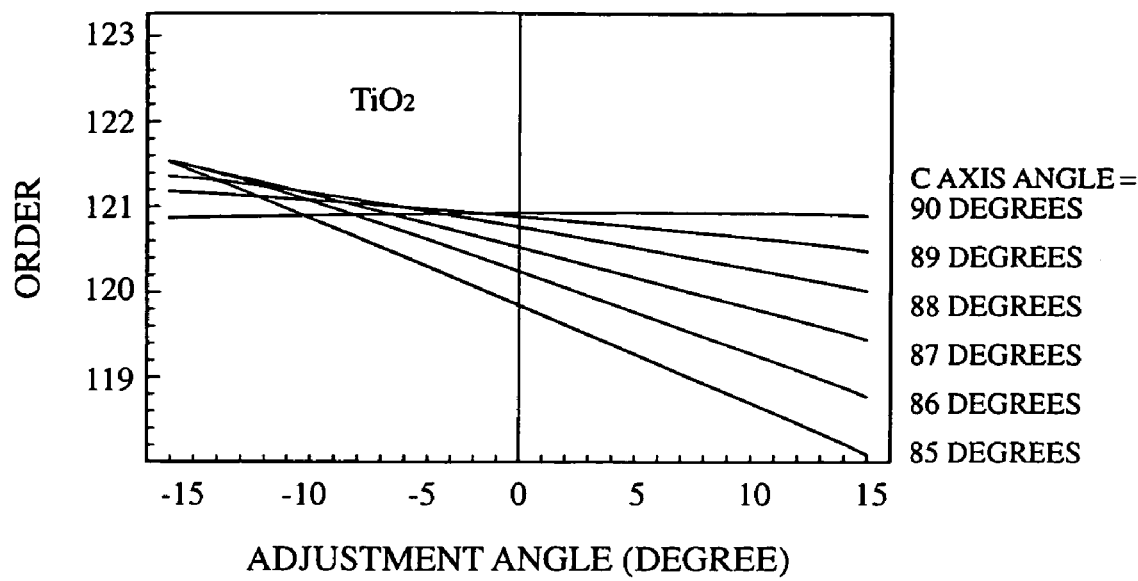
FIG. 31 is a diagram showing changes of the order that are calculated when the uniaxial birefringent crystal formed of $TiO_2$ is rotated around the y axis by only the adjustment angle ($\phi r$)
Figure 32:
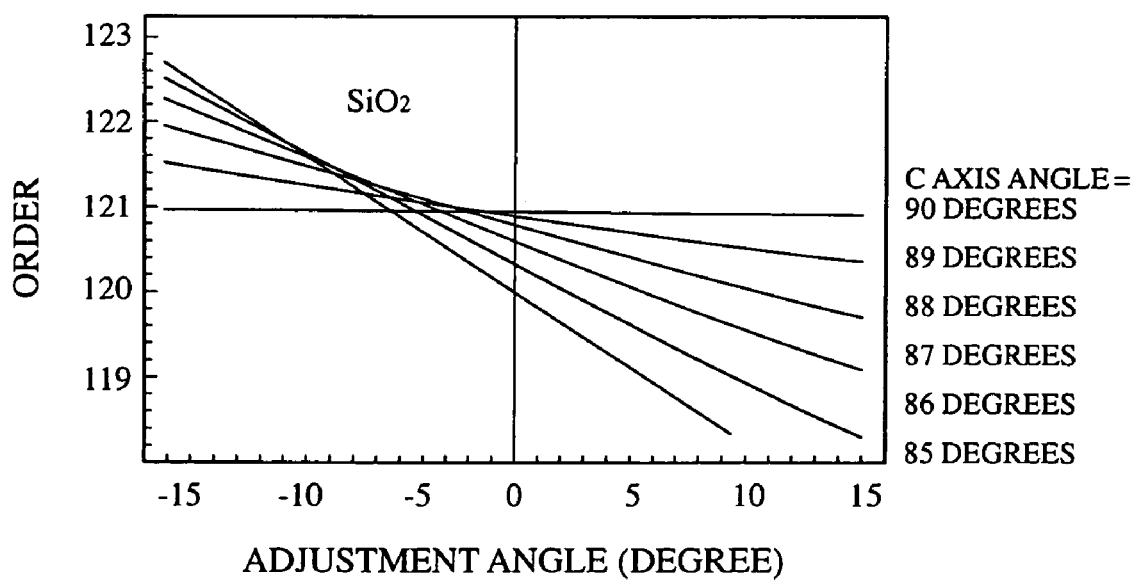
FIG. 32 is a diagram showing changes of the order that are calculated when the uniaxial birefringent crystal formed of $SiO_2$ is rotated around the y axis by only the adjustment angle ($\phi r$)

FIG. 28 is a diagram showing changes of the order that are calculated when the uniaxial birefringent crystal formed of $YVO_4$ is rotated around the y axis by only the adjustment angle ($\phi r$), FIG. 29 is a diagram showing changes of the order that are calculated when the uniaxial birefringent crystal formed of $LiNbO_3$ is rotated around the y axis by only the adjustment angle ($\phi r$), FIG. 30 is a diagram showing changes of the order that are calculated when the uniaxial birefringent crystal formed of $CaCO_3$ is rotated around the y axis by only the adjustment angle ($\phi r$), FIG. 31 is a diagram showing changes of the order that are calculated when the uniaxial birefringent crystal formed of $TiO_2$ is rotated around the y axis by only the adjustment angle ($\phi r$), and FIG. 32 is a diagram showing changes of the order that are calculated when the uniaxial birefringent crystal formed of SiO$_2$ is rotated around the y axis by only the adjustment angle (φr). Each of FIGS. 28 to 32 also shows adjustment-angle-dependent changes of the order that also vary according to a C axis angle (i.e., an angle between the C axis and a normal to the cut-out surface of each crystal) ranging from 85 degrees to 90 degrees (i.e., a crystal cut-out angle φc ranges from 0 degrees to 5 degrees). Furthermore, the length of each crystal is so set that the FSR has a typical value of 1.6 THz.

It is found from these results that on a condition that the order changes by 1 when the crystal is rotated about the y axis by only the certain adjustment angle (φr) of 10 degrees so that the C axis is inclined toward the direction of the x axis, the C axis angle ranges from 86 degrees to 87 degrees for all the crystals. Therefore, in the wavelength monitoring device of this embodiment, either one of the above-mentioned five crystals having a C axis angle ranging from 86 degrees to 87 degrees is used as a material of which the uniaxial birefringent crystal 31 is formed, and the uniaxial birefringent crystal 31 is so disposed that it is rotated about the y axis from a position at which the cut-out surface thereof is perpendicular to the laser optical axis (in this case, the adjustment angle is 0) by only the adjustment angle φr (ranging from 0 degrees to 10 degrees).

Next, a description will be made as to an operation of the wavelength monitoring device of this embodiment.

As previously mentioned, the order is determined dependently upon the adjustment angle φr that is set for the arrangement of the uniaxial birefringent crystal 31. Therefore, the adjustment angle φr is determined so that the range of changes in the intensity of a polarized wave component of the optical signal passing through the uniaxial birefringent crystal is sufficiently large for a given range of changes in the wavelength of the optical signal emitted from the semiconductor laser 1. For example, the adjustment angle φr is determined so that the range of changes in the intensity of the polarized wave component of the optical signal is maximized. The uniaxial birefringent crystal 31 is rotated about the y axis so that the crystal cut-out surface thereof is inclined at the determined adjustment angle φr other than 90 degrees against the direction of the z axis. After that, the optical signal emitted from the semiconductor laser 1 passes through the uniaxial birefringent crystal 31 whose wavelength discriminating characteristic for the optical signal is adjusted, then passes through the polarizer 4, and the optical signal intensity S1 of the optical signal is then detected and monitored by the first photodiode 5.

As can be seen from the above description, in accordance with this embodiment 3, because an adjustment angle φr is determined so that the range of changes in the intensity of a polarized wave component of an optical signal passing through the uniaxial birefringent crystal, which is so cut out that the C axis angle thereof ranges from 86 degrees to 87 degrees, is sufficiently large, and the uniaxial birefringent crystal is rotated about the y axis by only the determined adjustment angle φr, the wavelength monitoring device can exhibit an excellent wavelength discriminating characteristic at any time for an optical signal emitted from the semiconductor laser 1 even if the range of wavelengths of the optical signal changes. In addition, in this embodiment 3, the C axis of the uniaxial birefringent crystal is oriented in a direction of a vector obtained by inclining a vector on the y axis toward the x axis in the xy plane by a first certain angle of 45 degrees and further inclining the vector toward the z axis in a plane including both the vector and the z axis by a second certain angle. The first certain angle is not limited to 45 degrees. In other words, the uniaxial birefringent crystal only has to have a C axis that is oriented in a direction of a vector obtained by inclining a vector in a direction different from the direction in which the laser light emitted from the semiconductor laser 1 vibrates toward the z axis in a plane including both the vector and the z axis by a certain angle.

In this embodiment 3, the wavelength monitoring device can be modified in accordance with any one of the first through seventh variants of embodiment 1.

Furthermore, in this embodiment 3, the wavelength monitoring device uses the uniaxial birefringent crystal 31, as previously mentioned. However, the birefringent crystal of this embodiment is not limited to a uniaxial one. For example, the birefringent crystal can be a biaxial one.

Embodiment 4

Though the wavelength monitoring device in accordance with embodiment 3 can optimize its wavelength discriminating characteristic, it doesn't implement temperature compensation. In accordance with this embodiment, there is provided a wavelength monitoring device that has not only a function of adjusting its wavelength discriminating characteristic but also a temperature compensation function.

Figure 33:
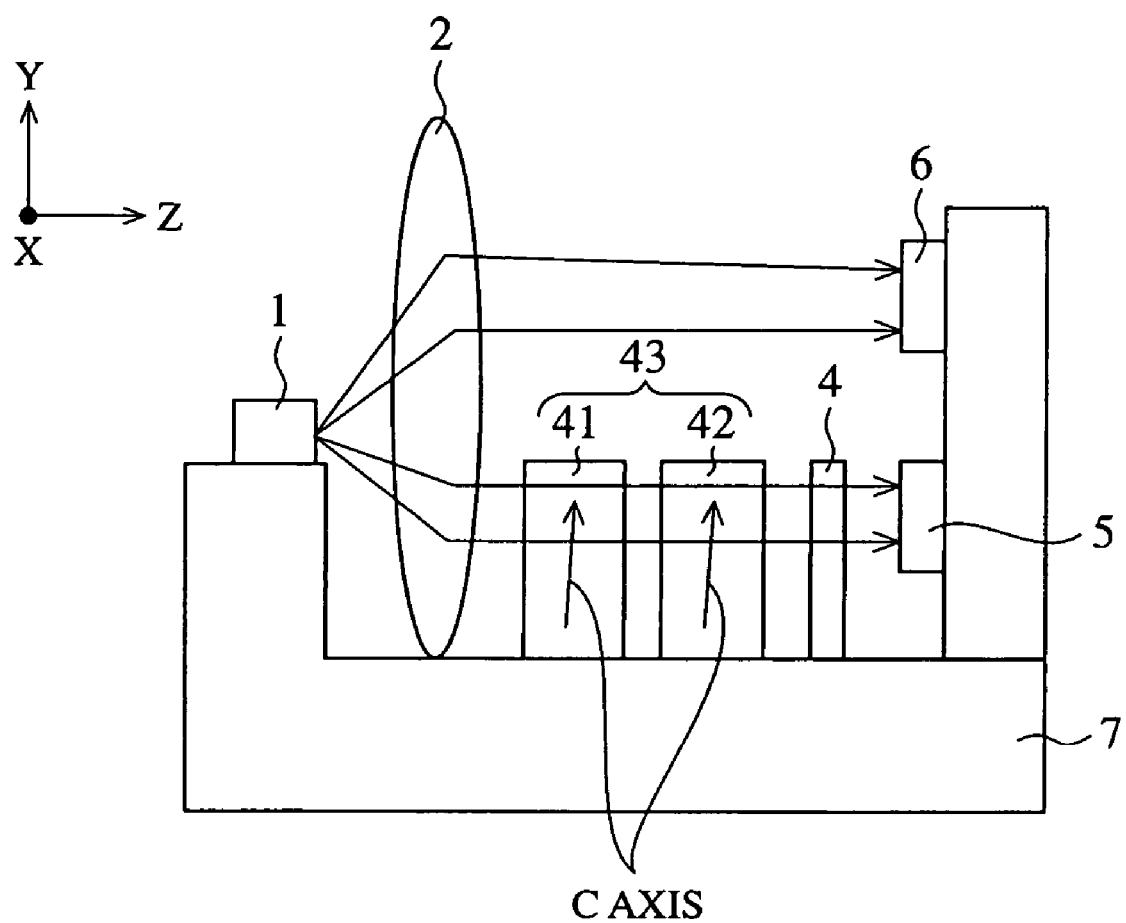
FIG. 33 is a block diagram showing a wavelength monitoring device according to embodiment 4 of the present invention.

FIG. 33 is a block diagram showing the wavelength monitoring device in accordance with embodiment 4 of the present invention. The wavelength monitoring device in accordance with embodiment 4 of the present invention has the same components as those of the wavelength monitoring devices of embodiments 1 to 3 which are designated by the same reference numerals, and the explanation of those components will be omitted hereafter.

Reference numeral 41 denotes a first uniaxial birefringent crystal. This first uniaxial birefringent crystal has a crystal cut-out surface for receiving an optical signal, the cut-out surface being parallel to an xy plane, and has a C axis oriented in a direction determined by inclining a vector on a y axis in the xy plane toward a direction of an x axis by 45 degrees and further inclining the vector in a plane including both the vector and a z axis toward a direction of the z axis by a crystal cut-out angle. The first uniaxial birefringent crystal is rotated about the y axis by only a specific adjustment angle so that a normal to the cut-out surface of this crystal is in a zx surface and is inclined at the specific adjustment angle against the optical axis of an incident optical signal. Reference numeral 42 denotes a second uniaxial birefringent crystal arranged in series with the first uniaxial birefringent crystal 21 along the optical axis of the optical signal, and having a temperature characteristic opposite to that of the first uniaxial birefringent crystal 21. This second uniaxial birefringent crystal has a crystal cut-out surface for receiving an optical signal, the cut-out surface being parallel to the xy plane, and has a C axis oriented in a direction determined by inclining a vector on the y axis in the xy plane toward the direction of the x axis by 45 degrees and further inclining the vector in a plane including both the vector and the z axis toward the direction of the z axis by a crystal cut-out angle. The second uniaxial birefringent crystal is rotated about the y axis by only a specific adjustment angle so that a normal to the cut-out surface of this crystal is in the zx surface and is inclined against the optical axis of an incident optical signal at the specific adjustment angle. The first uniaxial birefringent crystal 41 and the second uniaxial birefringent crystal 42 arranged in series form a uniaxial birefringent crystalline unit 43 having a temperature compensation function. The uniaxial birefringent crystalline unit 43 receives a part of an optical signal converged by a lens 2 and then emits an optical signal that consists of an ordinary ray and an extraordinary ray that have a phase difference dependent upon the wavelength of the incident light.

As explained in Embodiment 2, because the first uniaxial birefringent crystal 41 and the second uniaxial birefringent crystal 42 are arranged in series with respect to the optical axis of the incident light, the uniaxial birefringent crystalline unit 43 has a temperature compensation function. As in the case of embodiment 2, a temperature compensation condition is given by the following equations (34) and (35):

$$\left(\frac{d\Delta n_A(\phi_{cA})}{dT} + \alpha_A \cdot \Delta n_A(\phi_{cA})\right) \cdot L_A + \qquad (34)$$
$$\left(\frac{d\Delta n_B(\phi_{cB})}{dT} + \alpha_B \cdot \Delta n_B(\phi_{cB})\right) \cdot L_B = 0$$

$$FSR = \frac{c_0}{(\Delta n_A(\phi_{cA}) \cdot L_A + \Delta n_B(\phi_{cB}) \cdot L_B)} \qquad (35)$$

Next, a description will be made as to a procedure for determining a C axis angle (i.e., an angle between the C axis of each crystal and a normal to the cut-out surface of each crystal), the adjustment angle of each crystal, and the length of each crystal, which have to be determined in order to provide the uniaxial birefringent crystalline unit 43 having a function of adjusting the wavelength discriminating characteristic of each crystal and a temperature compensation function, with reference to FIG. 34.

Figure 34:
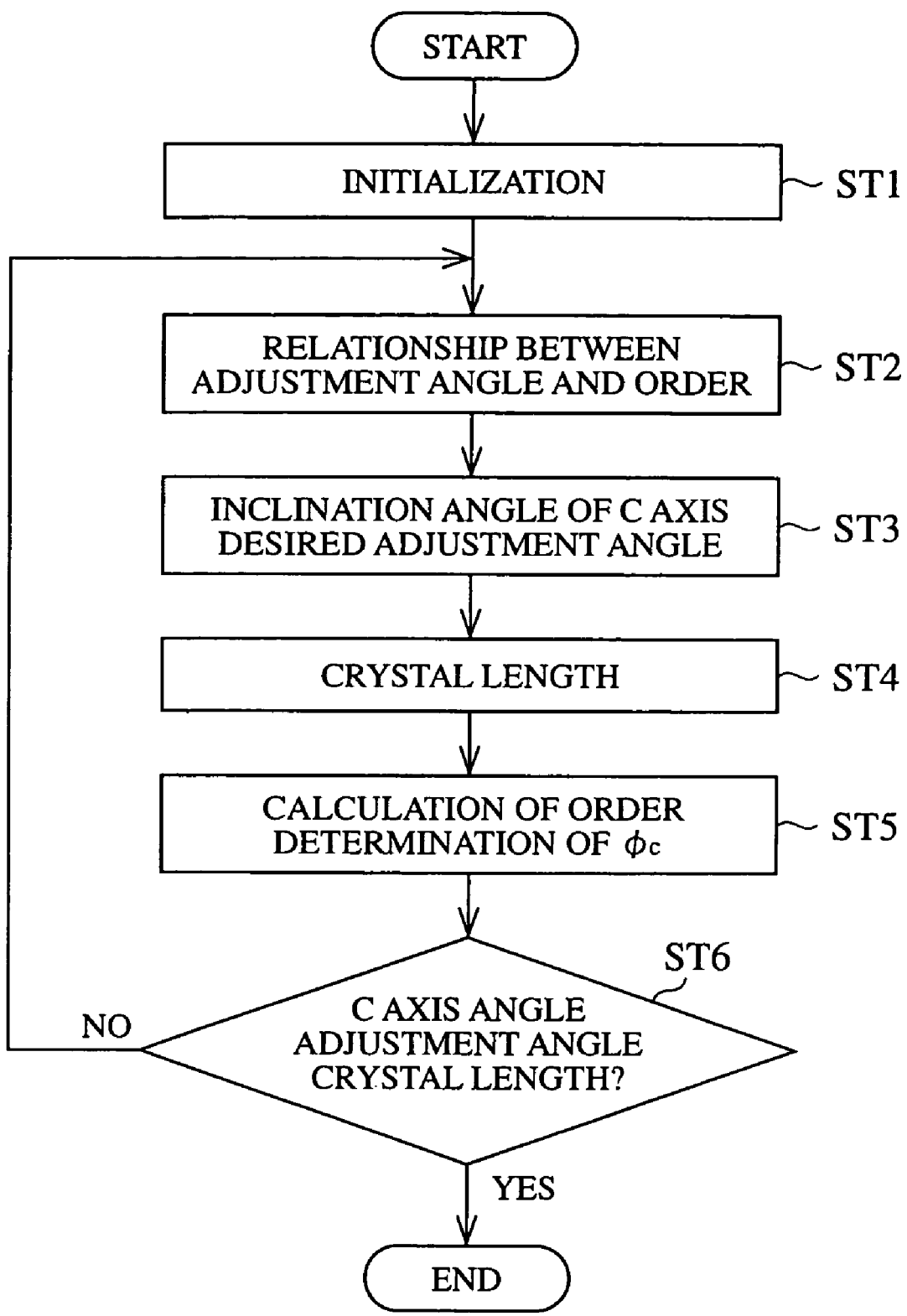
FIG. 34 is a flow chart showing a procedure for determining a C axis angle, an adjustment angle, and a length of each of two uniaxial birefringent crystals arranged in series.

FIG. 34 is a flow chart showing the procedure for determining the C axis angle, adjustment angle, and length of each of the two uniaxial birefringent crystals arranged in series.

First of all, in step ST1, the C axis angle of each crystal is initially set to 90 degrees (i.e., an angle between a laser light vector indicating the incident light and the C axis of the crystal 41 is set to $\phi_{cA}$=90 degrees and an angle between the laser light vector and the C axis of the crystal 41 is set to $\phi_{cB}$=90 degrees). In step ST2, a relationship between the adjustment angle and the order is determined based on the C axis angle and a desired FSR. In step ST3, a desired adjustment angle is chosen based on the acquired relationship, and the C axis angle is determined. In step ST4, the length of each of the two crystals 41 and 42 is determined from the determined C axis angle according to the equations (34) and (35). In step ST5, the order is calculated again according to the equation (24) based on the determined length of each crystal, and a desired C axis angle is obtained. If either of the desired C axis angle, the desired adjustment angle, and the length of each crystal differs from a corresponding value previously determined (i.e., if NO in step ST6), steps ST2 to ST5 are repeatedly carried out based on the calculated order and the C axis angle. When the C axis angle, adjustment angle, and length of each crystal are converged to constant values, respectively (i.e., if YES in step ST6), the determining procedure is finished.

Figure 35:
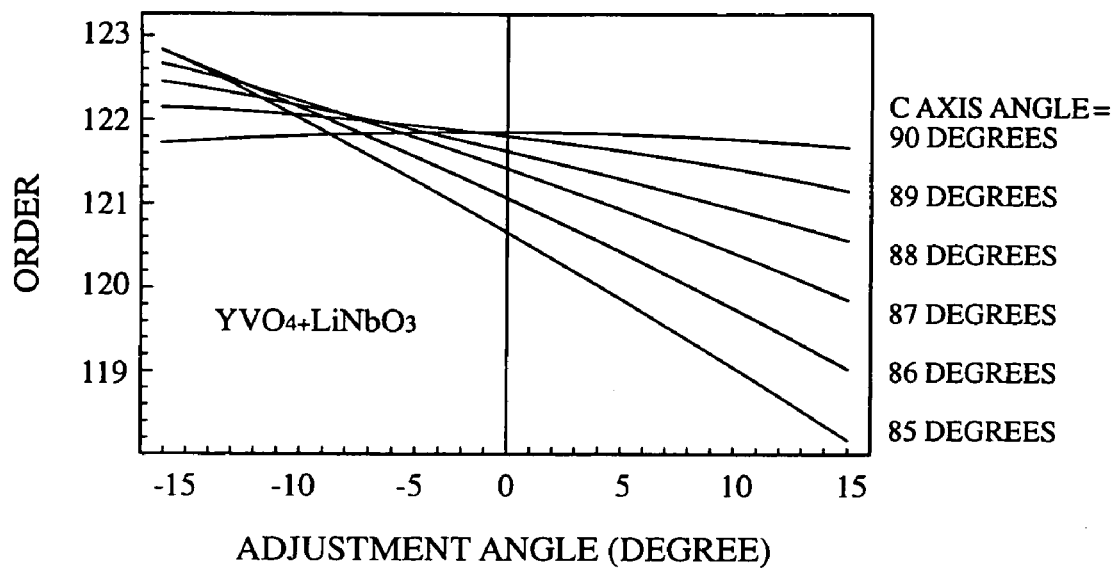
FIG. 35 is a diagram showing a relationship between the adjustment angle and the order in a uniaxial birefringent crystalline unit for different C axis angles of a crystal formed of YVO$_4$, the C axis of the crystal formed of YVO$_4$ being inclined at a C axis angle against the optical axis of incident light.

Next, a description will be made as to an exemplary case where YVO$_4$ is selected as the first uniaxial birefringent crystal 41 and LiNbO$_3$ is selected as the second uniaxial birefringent crystal 42. FIG. 35 shows a relationship between the adjustment angle and the order in the uniaxial birefringent crystalline unit 43 for different C axis angles of the crystal formed of YVO$_4$, the C axis of the crystal formed of YVO$_4$ being inclined at a C axis angle against the optical axis of the incident light. In this case, the C axis angle of the crystal formed of LiNbO$_3$ is fixed to 90 degrees. For example, the length and C axis angle of each of the two crystals 41 and 42 are determined so that a condition on which the range of adjustment angles in which the order can increase or decrease by one from the one at the center of the range is a range from −5 degrees to +5 degrees is satisfied. It can be seen from FIG. 35 that the order increases or decreases by one from the one at the center of the range of adjustment angles only when the C axis angle of the crystal formed of YVO$_4$ is set to 86 degrees. Therefore, the length of the crystal formed of YVO$_4$ is set to 977.9 micrometers, the length of the other crystal formed of LiNbO$_3$ is set to 149 micrometers, and the C axis angle of the crystal formed of YVO$_4$ is set to 86 degrees.

Next, a description will be made as to an operation of the wavelength monitoring device of this embodiment 4.

The adjustment angle $\phi$r is determined so that a range of changes in the intensity of a polarized wave component of the optical signal passing through the two uniaxial birefringent crystals 41 and 42 is sufficiently large for a given range of changes in the wavelength of the optical signal emitted from a semiconductor laser 1. Each of the two uniaxial birefringent crystals 41 and 42 is rotated about the y axis by only the determined adjustment angle $\phi$r. For example, the adjustment angle $\phi$r is determined so that the range of changes in the intensity of the polarized wave component of the optical signal is maximized. After that, a lower side half of the optical signal converged by the lens 2 passes through the first uniaxial birefringent crystal 41 and the second uniaxial birefringent crystal 42. In this case, even if a temperature change occurs in the first and second uniaxial birefringent crystals 41 and 42, a temperature-dependent change in the phase of the optical signal which is caused by the first uniaxial birefringent crystal 41 and a temperature-dependent change in the phase of the optical signal which is caused by the second uniaxial birefringent crystal 42 cancel each other out. Therefore, the optical signal that consists of a p-polarized component and an s-polarized component that have intensities that depends upon only the wavelength of the optical signal is sent from the uniaxial birefringent crystalline unit 23 to a polarizer 4, and the only p-polarized component of the optical signal is then passed through the polarizer 4 and the optical signal intensity S1 of the p-polarized component is detected and monitored by a first photodiode 5.

As can be seen from the above description, in accordance with this embodiment 4, the uniaxial birefringent crystalline unit 43 that consists of the two types of uniaxial birefringent crystals 41 and 42 that provide temperature-dependent changes of opposite sign for the phase of an optical signal passing through them, respectively, is formed so that their C axes are inclined at a certain C axis angle against the optical axis of the optical signal, an adjustment angle $\phi$r is determined so that a range of changes in the intensity of a polarized wave component of the optical signal passing through the two uniaxial birefringent crystals 41 and 42 is sufficiently large for a given range of changes in the wavelength of the optical signal, and each of the two uniaxial birefringent crystals 41 and 42 is rotated about the y axis by only the determined adjustment angle $\phi$r. Therefore, even if the range of changes in the wavelength of the optical signal emitted from the semiconductor laser 1 changes, the wavelength monitoring device can adjust the wavelength discriminating characteristic so as to excellently discriminate the wavelength of the incident optical signal at all times, and can detect and monitor an optical signal intensity S2 that depends only upon the wavelength of the optical signal with a high degree of reliability without being affected by temperature changes of the uniaxial birefringent crystals.

In this embodiment 4, the C axis of each uniaxial birefringent crystal is oriented in a direction of a vector obtained by inclining a vector on the y axis toward the x axis in the xy plane by a first certain angle of 45 degrees and further inclining the vector toward the z axis in a plane including both the vector and the z axis by a second certain angle. The first certain angle is not limited to 45 degrees. In other words, each uniaxial birefringent crystal only has to have a C axis that is oriented in a direction of a vector obtained by inclining a vector oriented in a direction different from the direction in which the laser light emitted from the semiconductor laser 1 vibrates toward the z axis in a plane including both the vector and the z axis by a certain angle.

The pair of uniaxial birefringent crystals 41 and 42 is used in this embodiment 4. However, each birefringent crystal is not limited to a uniaxial one, and can be a biaxial birefringent crystal.

In this embodiment 4, the wavelength monitoring device can be modified in accordance with any one of the first through seventh variants of embodiment 2.

Embodiment 5

In accordance with embodiment 3, the wavelength discriminating characteristic of the wavelength monitoring device is adjusted by rotating the uniaxial birefringent crystal about the y axis by only the adjustment angle. In contrast, in accordance with this embodiment 5, the wavelength discriminating characteristic of a wavelength monitoring device is adjusted by moving a uniaxial birefringent crystal having a thickness that varies along a direction of an x axis in the direction of the x axis.

Figure 36:
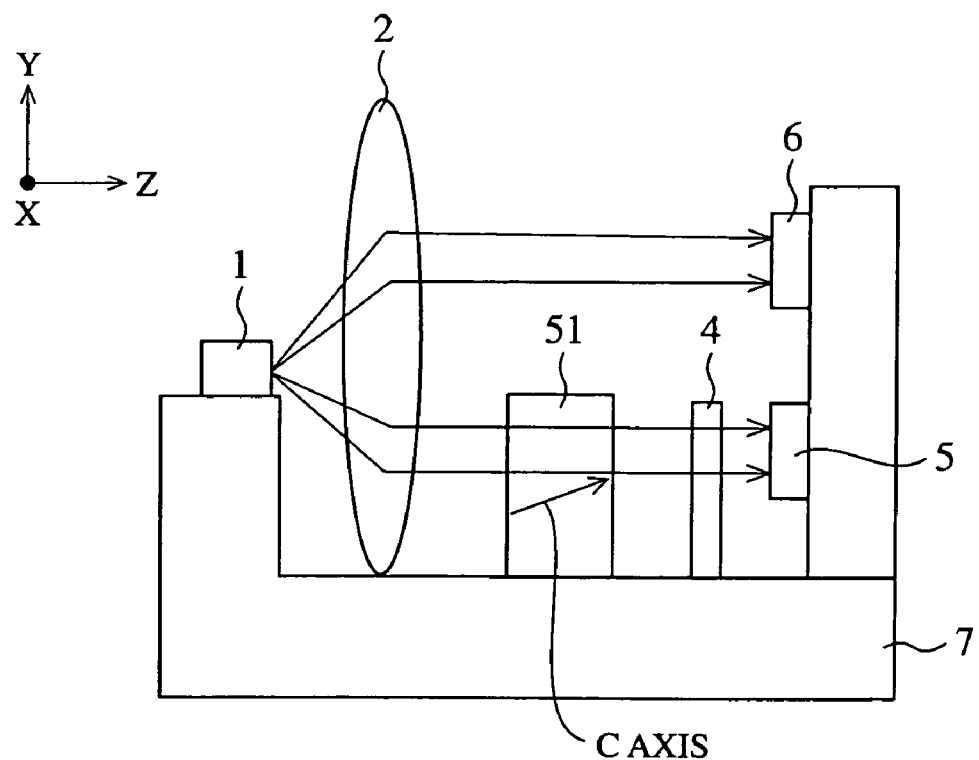
FIG. 36 is a block diagram showing a wavelength monitoring device in accordance with embodiment 5 of the present invention.
Figure 37:
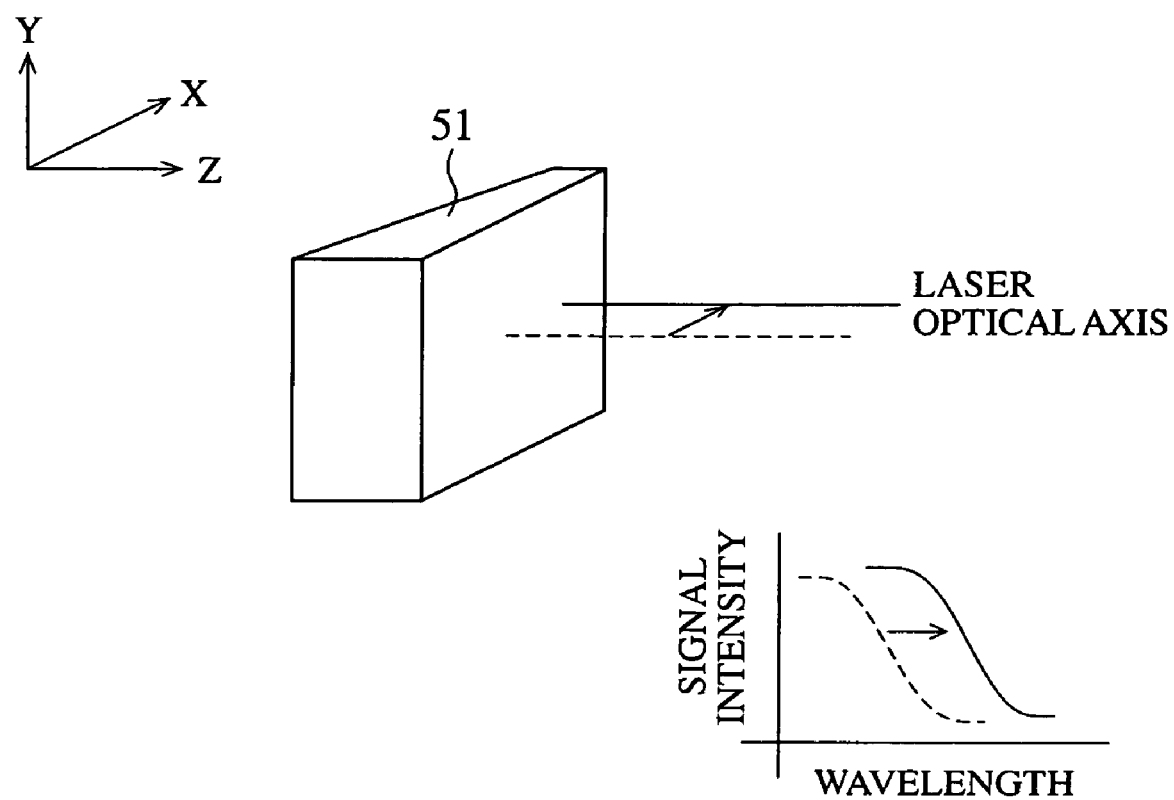
FIG. 37 is a diagram for explaining an arrangement of a uniaxial birefringent crystalline unit of the wavelength monitoring device shown in FIG. 36.

FIG. 36 is a block diagram showing the wavelength monitoring device in accordance with embodiment 5 of the present invention, and FIG. 37 is a diagram for explaining an arrangement of a uniaxial birefringent crystalline unit of the wavelength monitoring device shown in FIG. 36. The wavelength monitoring device in accordance with embodiment 5 of the present invention has the same components as those of the wavelength monitoring devices of embodiments 1 to 4 which are designated by the same reference numerals, and the explanation of those components will be omitted hereafter.

In FIGS. 36 and 37, reference numeral 51 denotes the uniaxial birefringent crystal that tapers down along the direction of the x axis so that its thickness in the direction of the optical axis of incident light (i.e., a direction of a z axis) changes along the direction of the x axis. The C axis of the uniaxial birefringent crystal 51 is in an xy plane that is perpendicular to the optical axis of the incident optical signal, which is the direction in which the incident optical signal is traveling. The uniaxial birefringent crystal 51 is appropriately placed with respect to the direction of the x axis so that the incident optical signal passes through a part of the uniaxial birefringent crystal 51 having a thickness that can provide an excellent wavelength discriminating characteristic. The uniaxial birefringent crystalline unit 51 receives a part of the optical signal converged by a lens 2 and then emits an optical signal that consists of an ordinary ray and an extraordinary ray that have a phase difference dependent upon the wavelength of the incident light.

Next, a description will be made as to an operation of the wavelength monitoring device of this embodiment 5.

A desired thickness of the crystal is determined so that a range of changes in the intensity of a polarized wave component of the optical signal passing through the uniaxial birefringent crystal is sufficiently large for a given range of changes in the wavelength of the optical signal emitted from a semiconductor laser 1. The uniaxial birefringent crystal is appropriately placed with respect to the direction of the x axis so that the incident optical signal passes through a part of the uniaxial birefringent crystal 51 having the desired thickness. For example, the desired thickness is determined so that the range of changes in the intensity of the polarized wave component of the optical signal is maximized. After that, the optical signal emitted from the semiconductor laser 1 passes through the uniaxial birefringent crystal 51 whose wavelength discriminating characteristic for the optical signal is adjusted, then passes through a polarizer 4, and the optical signal intensity S1 of the optical signal is then detected and monitored by a first photodiode 5.

This embodiment is not limited to the exemplary case in which the C axis of the uniaxial birefringent crystal 51 is in the xy plane that is perpendicular to the optical axis of the incident optical signal, which is the direction in which the incident optical signal is traveling. For example, the C axis of the uniaxial birefringent crystal, 51 is inclined at an angle other than 90 degrees against the optical axis of the incident optical signal, which is the direction in which the incident optical signal is traveling, as in the case of embodiment 1 or embodiment 3.

As can be seen from the above description, in accordance with this embodiment 5, because a desired thickness of the uniaxial birefringent crystal is determined so that a range of changes in the intensity of a polarized wave component of an optical signal passing through the uniaxial birefringent crystal is sufficiently large for a given range of changes in the wavelength of the optical signal, and the uniaxial birefringent crystal 51 is appropriately placed with respect to the direction of the x axis so that the optical signal passes through a part of the uniaxial birefringent crystal 51 having the desired thickness, the wavelength monitoring device can exhibit an adjusted wavelength discriminating characteristic for the optical signal emitted from the semiconductor laser 1.

In accordance with a variant of this embodiment 5, a pair of uniaxial birefringent crystals having opposite temperature characteristics are arranged along the optical axis of an incident optical signal, and each of the two crystals tapers down along the direction of the x axis so that its thickness in the direction of the optical axis of the incident light changes along the direction of the x axis. In this variant, the pair of uniaxial birefringent crystals is so shaped that the ratio of their thicknesses for the optical signal passing through the crystals is kept constant even if the pair of uniaxial birefringent crystals is shifted in the direction of the x axis. For example, this pair of uniaxial birefringent crystals is combined and arranged so that the cross-sectional shape of each crystal in the xz plane, is a trapezoid and the shorter base (or the longer base) of each trapezoid is located at the same side with respect to the direction of the x axis. On a condition that the phase difference between an ordinary ray and an extraordinary ray emitted from the pair of uniaxial birefringent crystals having opposite temperature characteristics is kept constant regardless of temperature changes of the pair of uniaxial birefringent crystals, the ratio of the thicknesses of the two uniaxial birefringent crystals is determined. Then the pair of uniaxial birefringent crystals is appropriately arranged at specific positions so that the incident optical signal passes through parts of the uniaxial birefringent crystals having desired thicknesses that can provide an excellent wavelength discriminating characteristic.

As can be seen from the above description, in accordance with the variant of this embodiment 5, because a desired thickness of each of the two uniaxial birefringent crystals is determined so that a range of changes in the intensity of a polarized wave component of the optical signal passing through the pair of uniaxial birefringent crystals is sufficiently large for a given range of changes in the wavelength of the optical signal. The pair of uniaxial birefringent crystals 51 having thicknesses that change along the direction of the x axis with the ratio of them being kept constant is appropriately arranged with respect to the direction of the x axis so that the incident optical signal passes through a part of each uniaxial birefringent crystal 51 having the desired thickness, the wavelength monitoring device can exhibit an adjusted wavelength discriminating characteristic for the optical signal emitted from the semiconductor laser 1.

Furthermore, because the ratio of the thicknesses of the two uniaxial birefringent crystals having opposite temperature characteristics is determined on the condition that the phase difference between the ordinary ray and the extraordinary ray emitted from the pair of uniaxial birefringent crystals is kept constant regardless of temperature changes of the pair of uniaxial birefringent crystals, the wavelength monitoring device can have a temperature compensation function.

In this embodiment 5, each of the two uniaxial birefringent crystals has a thickness in the direction of the optical axis that changes along the direction of the x axis and is placed at a specific position in the direction of the x axis. However, the specific position at which each of the two uniaxial birefringent crystals is placed is not limited to the one in the direction of the x axis. In other words, each of the two uniaxial birefringent crystals is a uniaxial birefringent crystal having a thickness that changes along a specific direction other than the direction of the optical axis of the incident light, and can be placed at a specific position in the specific direction.

The uniaxial birefringent crystal is used in this embodiment 5. However, the birefringent crystal is not limited to a uniaxial one, and can be a biaxial birefringent crystal.

INDUSTRIAL APPLICABILITY

As mentioned above, a wavelength monitoring device in accordance with the present invention is suitable for a system that emits light by means of a semiconductor laser and accurately monitors the wavelength of the light without being affected by temperature changes, and that needs to be assembled easily. Furthermore, the wavelength monitoring device in accordance with the present invention is suitable for a system that accurately monitors the wavelength of light in a wide temperature range. Furthermore, the wavelength monitoring device in accordance with the present invention is suitable for a system that always exhibits an excellent wavelength discriminating characteristic when monitoring the wavelength of light even if a range of changes in the light wavelength shifts.

The invention claimed is:

1. A wavelength monitoring device comprising:
a semiconductor laser for emitting an optical signal that travels along a laser optical axis;
a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and
detecting means for detecting and monitoring the intensity of the polarized wave component of said optical signal output from said birefringent crystalline unit;
wherein said birefringent crystalline unit is a single birefringent crystal; and
wherein said birefringence crystal is formed of tellurium dioxide, and an angle between the crystal optical axis and the laser optical axis is 21.1 degrees.

2. A wavelength monitoring device comprising:
a semiconductor laser for emitting an optical signal that travels along a laser optical axis;
a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and
detecting means for detecting and monitoring the intensity of the polarized wave component of said optical signal output from said birefringent crystalline unit;
wherein said birefringent crystalline unit is a single birefringent crystal;
wherein said detecting means includes a polarizer for receiving the optical signal output from said birefringent crystal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and for allowing the polarized wave component having the intensity corresponding to the wavelength of the optical signal to pass therethrough, and a main photo detector for detecting the intensity of the polarized wave component that has passed through said polarizer; and
wherein said polarizer and said birefringence crystal are arranged so that they show an inverted letter V.

3. A wavelength monitoring device comprising:
a semiconductor laser for emitting an optical signal that travels along a laser optical axis;
a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and
detecting means for detecting and monitoring the intensity of the polarized wave component of said optical signal output from said birefringent crystalline unit;
wherein said birefringent crystalline unit is a single birefringent crystal;
wherein said birefringence crystal has a cut-out surface parallel to a plane perpendicular to the laser optical axis;
wherein the incline angle of the optical axis is determined by inclining a directional vector inclined against a first axis in the plane toward the laser optical axis by a crystal cut-out angle and by rotating the crystal about the first axis by an adjustment angle so that a normal to the crystal cut-out surface is inclined against the direction of the laser optical axis and toward a direction of a second axis perpendicular to both the first axis and the laser optical axis by the adjustment angle; and wherein the crystal cut-out angle of said birefringence crystal and an adjustment angle range in which the certain adjustment angle can be set for arrangement of said birefringence crystal are determined so that an order indicating a number of vibrations of an electric field of the optical signal in said birefringence crystal is made to change by one.

4. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said birefringence crystalline unit is provided with a first birefringence crystal having an optical axis inclined by an angle other than 90 degrees against a plane perpendicular to the laser optical axis and toward the laser optical axis, and a second birefringence crystal arranged in series with said first birefringence crystal with respect to the laser optical axis, said second birefringence crystal having an optical axis inclined against a plane perpendicular to the laser optical axis and toward the laser optical axis, and said second birefringence crystal providing a phase shift due to a temperature change thereof to the optical signal passing therethrough so that a phase shift provided to the optical signal passing through said first birefringence crystal due to a temperature change of said first birefringence crystal can be cancelled;

wherein said detecting means includes a polarizer for receiving the optical signal output from said birefringent crystalline unit, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and for allowing the polarized wave component having the intensity corresponding to the wavelength of the optical signal to pass therethrough, and a main photo detector for detecting the intensity of the polarized wave component that has passed through said polarizer; and wherein said first and second birefringence crystals of said birefringence crystalline unit are arranged so that they show an inverted letter V.

5. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said birefringence crystalline unit is provided with a first birefringence crystal having an optical axis inclined by an angle other than 90 degrees against a plane perpendicular to the laser optical axis and toward the laser optical axis, and a second birefringence crystal arranged in series with said first birefringence crystal with respect to the laser optical axis, said second birefringence crystal having an optical axis inclined against a plane perpendicular to the laser optical axis and toward the laser optical axis, and said second birefringence crystal providing a phase shift due to a temperature chance thereof to the optical signal passing therethrough so that a phase shift provided to the optical signal passing through said first birefringence crystal due to a temperature change of said first birefringence crystal can be cancelled;

wherein said detecting means includes a polarizer for receiving the optical signal output from said birefringent crystalline unit, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and for allowing the polarized wave component having the intensity corresponding to the wavelength of the optical signal to pass therethrough, and a main photo detector for detecting the intensity of the polarized wave component that has passed through said polarizer; and wherein said polarizer and said birefringence crystalline unit are arranged so that they show an inverted letter V.

6. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said birefringence crystalline unit is provided with a first birefringence crystal having an optical axis inclined by an angle other than 90 degrees against a plane perpendicular to the laser optical axis and toward the laser optical axis, and a second birefringence crystal arranged in series with said first birefringence crystal with respect to the laser optical axis, said second birefringence crystal having an optical axis inclined against a plane perpendicular to the laser optical axis and toward the laser optical axis, and said second birefringence crystal providing a phase shift due to a temperature chance thereof to the optical signal passing therethrough so that a phase shift provided to the optical signal passing through said first birefringence crystal due to a temperature chance of said first birefringence crystal can be cancelled;

wherein said first birefringence crystal has a cut-out surface parallel to the plane perpendicular to the laser optical axis;

wherein the incline angle of the crystal optical axis is determined by inclining a directional vector inclined against a first axis in the plane toward the laser optical axis by a first crystal cut-out angle, and rotating the crystal about the first axis by a first adjustment angle so that a normal to the crystal cut-out surface is inclined against the laser optical axis and toward a second axis perpendicular to both the first axis and the laser optical axis by the first adjustment angle;

wherein said second birefringence crystal has a cut-out surface parallel to a plane perpendicular to the laser optical axis, and the incline of the second crystal optical axis is determined by inclining a directional vector inclined against the first axis in the plane toward the laser optical axis by a second crystal cut-out angle, and rotating the second crystal about the first axis by a second adjustment angle so that a normal to the crystal cut-out surface is inclined against the laser optical axis and toward the second axis by the second adjustment angle; and wherein the first crystal cut-out angle of said first birefringence crystal of said birefringence crystalline unit and an adjustment angle range in which the first adjustment angle can be set for arrangement of said first birefringence crystal, and the second crystal cut-out angle of said second birefringence crystal of said birefringence crystalline unit and an adjustment angle range in which the second adjustment angle can be set for arrangement of said second birefringence crystal are determined so that an order indicating a number of vibrations of an electric field of the optical signal propagating in said first and second birefringence crystals is made to change by one.

7. A wavelength monitoring device comprising:

a semiconductor laser for emitting an optical signal that travels along a laser optical axis, a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal, and detecting means for detecting and monitoring the intensity of the polarized wave component of said optical signal output from said birefringent crystalline unit; and wherein said detecting means includes a Brewster plate for receiving the optical signal output from said birefringence crystalline unit at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis, and a main photo detector for detecting and monitoring the intensity of the p-polarized component of the optical signal that has passed through the Brewster plate.

8. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said detecting means includes a main photo detector for receiving the optical signal output from said birefringence crystalline unit at an incident angle equal to a Brewster's angle, and for allowing a p-polarized component of the optical signal to pass therethrough and reflecting an s-polarized component of the optical signal, the optical signal including an ordinary ray vibrating in a direction perpendicular to a plane including both the crystal optical axis and the laser optical axis and an extraordinary ray vibrating in a direction perpendicular to both the vibrating direction of the ordinary ray and the laser optical axis.

9. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said detecting means includes a polarizer for allowing the polarized wave component of the optical signal to pass therethrough, the polarized wave component having the intensity corresponding to the wavelength of the optical signal, a main photo detector for detecting and monitoring the intensity of the polarized wave component that has passed through said polarizer, a glass plate for allowing the optical signal output from said birefringence crystalline unit to pass therethrough to provide a phase shift identical to that provided to the optical signal by said polarizer to the optical signal, and a secondary photo detector for receiving the optical signal that has passed through said glass plate and for detecting an intensity of the optical signal.

10. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said detecting means includes a main photo detector for detecting and monitoring the intensity of the polarized light component of the optical signal output from said birefringence crystalline unit, a secondary photo detector arranged above said main photo detector, for directly receiving the optical signal emitted from said semiconductor laser and for detecting an intensity of the optical signal, a base carrier on which said birefringence crystalline unit, said main photo detector and said secondary photo detector are arranged, and a polarizer placed on said base carrier, for allowing the polarized light component of the optical signal output from said birefringence crystalline unit to pass therethrough so that said main photo detector detects the intensity of the polarized light component of the optical signal output from said birefringence crystalline unit, said polarizer having a height that is adjusted so that said secondary photo detector does not receive a component of the optical signal, which is reflected from said base carrier after passing through said polarizer.

11. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said detecting means includes a main photo detector for detecting and monitoring the intensity of the polarized light component of the optical signal output from said birefringence crystalline unit, a secondary photo detector arranged above said main photo detector, for directly receiving the optical signal emitted from said semiconductor laser and for detecting an intensity of the optical signal, a base carrier on which said birefringence crystalline unit, said main photo detector and said secondary photo detector are arranged, and a polarizer placed on said base carrier, for allowing the polarized light component of the optical signal output from said birefringence crystalline unit to pass therethrough so that said main photo detector detects the intensity of the polarized light component of the optical signal output from said birefringence crystalline unit, said polarizer being arranged adjacent to said main photo detector so that said secondary photo detector does not receive a component of the optical signal, which is reflected from said base carrier after passing through said polarizer.

12. A wavelength monitoring device comprising:

a semiconductor laser for emitting an optical signal that travels along a laser optical axis;

a birefringent crystalline unit having a crystal optical axis inclined at an angle other than 90 degrees against a plane perpendicular to said laser optical axis and toward said laser optical axis, for receiving the optical signal emitted from said semiconductor laser and for outputting an optical signal having a polarized wave component of intensity corresponding to a wavelength of said received optical signal; and detecting means for detecting and monitoring the intensity of the polarized wave component of said optical signal output from said birefringent crystalline unit;

wherein said detecting means includes a polarizer for allowing the polarized wave component of the optical signal output from said birefringence crystalline unit to pass therethrough, a main photo detector for detecting the intensity of the polarized wave component of the optical signal that has passed through said polarizer, a base carrier on which said polarizer and said main photo detector are arranged, and a secondary photo detector for directly receiving the optical signal emitted from said semiconductor laser and for detecting an intensity of the optical signal, said secondary photo detector being arranged above said polarizer so as not to receive a component of the optical signal emitted from said semiconductor laser, which is reflected from said base carrier after passing through said polarizer.

* * * * *